(12) United States Patent
Suzuki et al.

(10) Patent No.: US 6,307,618 B1
(45) Date of Patent: *Oct. 23, 2001

(54) PROJECTION EXPOSURE APPARATUS AND DEVICE MANUFACTURING METHOD INCLUDING A PROJECTION OPTICAL SYSTEM HAVING A PAIR OF DIFFRACTIVE MEMBERS

(75) Inventors: Akiyoshi Suzuki, Tokyo; Yoshiyuki Sekine, Utsunomiya, both of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/337,258

(22) Filed: Jun. 22, 1999

(30) Foreign Application Priority Data

Jun. 24, 1998 (JP) .................................................. 10-177147

(51) Int. Cl.[7] ........................... G03B 27/42; G03B 27/54; G03B 27/52

(52) U.S. Cl. ................................ 355/53; 355/55; 355/67

(58) Field of Search .................................. 355/50, 53, 55, 355/67–71, 77; 356/399–401; 250/548, 492.22

(56) References Cited

U.S. PATENT DOCUMENTS

| 5,610,684 | * | 3/1997 | Shiraishi | 355/55 |
| 5,631,721 | * | 5/1997 | Stanton et al. | 355/71 |
| 5,789,734 | * | 8/1998 | Torigoe et al. | 250/201.2 |
| 5,926,257 | * | 7/1999 | Mizouchi | 355/67 |
| 5,991,088 | * | 11/1999 | Mizouchi | 359/649 |
| 6,104,472 | * | 8/2000 | Suzuki | 355/53 |

FOREIGN PATENT DOCUMENTS

| 43-10034 | 4/1943 | (JP) . |
| 7-183190 | 7/1995 | (JP) . |

OTHER PUBLICATIONS

G.J. Swanson, "Binary Optics Technology: The Theory and Design of Multi–Level Diffractive Optical Elements", *Technical Report 854*, MIT Lincoln Laboratory, Aug. 1989.

G.J. Swanson, "Binary Optics Technology: Theoretical Limits on the Diffraction Efficiency of Multilevel Diffractive Optical Elements", *Technical Report 914*, MIT Lincoln Laboratory, Mar. 1991.

\* cited by examiner

*Primary Examiner*—Russell Adams
*Assistant Examiner*—Hung Henry Nguyen
(74) *Attorney, Agent, or Firm*—Fitzpatrick, Cella, Harper & Scinto

(57) ABSTRACT

A projection exposure apparatus includes a projection optical system for projecting a pattern of a mask onto a substrate. The projection optical system includes a pair of diffractive members at least one of which is displaced in a direction perpendicular to an optical axis of the projection optical system. Each of the pair of diffractive members has a diffractive surface whose shape is determined so that an optical characteristic of the pair of diffractive members varies when a positional relationship between the diffractive surfaces of the pair of diffractive members in the perpendicular direction varies. An optical characteristic of the projection optical system is adjusted by displacing the at least one of the pair of diffractive members in the direction perpendicular to the optical axis.

27 Claims, 21 Drawing Sheets

PROJECTION EXPOSURE APPARATUS AND DEVICE MANUFACTURING METHOD INCLUDING A PROJECTION OPTICAL SYSTEM HAVING A PAIR OF DIFFRACTIVE MEMBERS

BACKGROUND OF THE INVENTION

1. Field of the Invention

The present invention relates to a projection exposure apparatus and a device manufacturing method both of which are suitable for use in the lithography process of exposing a wafer surface to an electronic circuit pattern formed on the surface of a mask or reticle (hereinafter referred to as a "reticle") by projection exposure or scanning exposure via a projection optical system, thereby providing a device of a high integration level, during the manufacture of semiconductor devices such as ICs or LSIs, image pickup devices such as CCDs, display devices such as liquid crystal panels, or devices such as magnetic heads.

More particularly, the present invention relates to a projection exposure apparatus and a device manufacturing method both of which are suitable for use in a case in which a reticle and a wafer are aligned with high accuracy and the electronic circuit pattern on the surface of the reticle is exposure-projected on the surface of the silicon wafer at a high integration level.

2. Description of the Related Art

Conventionally, when semiconductor devices, liquid crystal panels or the like are to be manufactured with photolithography techniques, a projection exposure apparatus (stepper) is used which transfers patterns from a reticle surface to a photosensitive substrate such as a wafer or a glass plate coated with a photoresist or the like, by exposure via a projection optical system.

The recent semiconductor technology, in particular, has been proceeding into a far larger scaling stage, and the resolution of, for example, from a linewidth of 0.25 $\mu$m to a far finer pattern, has been becoming a matter of argument. Techniques which play the central role in this situation are optical exposure techniques represented by steppers. The performance of a projection lens (projection optical system) which is a performance index of the optical exposure techniques is being improved in three major directions, i.e., shorter wavelength, larger field size and higher NA (numerical aperture). In view of the shorter wavelength, lithography using light from an ArF excimer laser is vigorously being developed as the next-generation techniques.

One important item of the optical exposure techniques is to maintain the same optical performance at all times. In lithography using an ArF excimer laser, it is known that a usable glass material has the characteristic of absorption of light and the optical performance of a projection optical system varies due to the absorption of light. The absorption of light has also already been known in the field of lithography using light such as i-line. In a stepper using an ArF excimer laser, since its depth of focus becomes smaller, it is necessary to control its optical performance with higher accuracy than with conventional accuracy. The optical performance to be controlled includes various aberrations of the projection optical system. Among these aberrations, longitudinal astigmatism, curvature of field and the third-order distortion as well as higher-order distortion are most difficult to correct. Furthermore, how to correct the rotationally asymmetrical magnification of a target itself becomes a new problem.

Longitudinal astigmatism will be described below with reference to an example. A scan type of a projection optical system called a scanner has recently vigorously been developed to enlarge the exposure area of a wafer surface. In the scan type of a projection optical system, its illumination area has a slit-like shape and a reticle and a wafer are synchronously scanned with respect to the slit-like shape. If this slit-like shape of exposure light is used, since the shape of the slit is not rotationally symmetrical, heat distribution asymmetrical about the optical axis of the projection optical system occurs due to the absorption of light into glass material, and longitudinal astigmatism (longitudinal astigmatism) occurs in the projection optical system.

However, projection optical systems of the type used in conventional projection exposure apparatus are not provided with means for correcting various asymmetrical aberrations due to the absorption of exposure light by varying the optical performance of the projection optical system, so that it has been impossible to effectively correct asymmetrical longitudinal astigmatism due to the influence of the absorption of exposure light. For this reason, passive measures have conventionally merely been taken, such as a method of limiting the amount of exposure light to be made incident on a projection system and restraining the occurrence of various aberrations.

Curvature of field will be described below. Since curvature of field relates to the Petzval sum, a method of varying the power (refractive power) of an optical element such as a lens or a mirror is known as a method of correcting a variation in curvature of field due to the absorption of exposure light into a projection optical system. However, conventionally, no optical elements having variable refractive power have been applied to the projection optical systems of projection exposure apparatus, and it has been impossible to effectively correct the influence of absorption of exposure light. For this reason, passive measures have conventionally merely been taken, such as a method of limiting the amount of exposure light to be made incident on a projection system and restraining the occurrence of various aberrations.

Rotationally asymmetrical magnification will be described below. In addition to an improvement in resolution, the alignment accuracy of patterns which are stacked in layers is a factor required for optical exposure techniques for manufacturing semiconductor devices.

A technique called global alignment is generally widely used as an alignment method. The error of global alignment is mainly divided into an intershot component which is the error between individual printed shots and an intrashot component which is the error inside each individual shot. Recently as the field size has become larger, how to reduce the error of the intrashot component has become a greater problem. In an actual wafer, asymmetrical distortion occurs during the process of the wafer.

For example, if an error of 2 ppm in magnification is present as an asymmetrical uncorrectable component for a field size of 22 mm, the following error occurs:

$$22 \text{ mm} \times 2 \text{ ppm} = 44 \text{ nm},$$

and the error has a value close to ⅕ times the resolution performance of a linewidth of 0.25 $\mu$m. As viewed from an overlay budget, it is apparent that this value is not within allowable limits, and how to reduce the intrashot component has become a great problem to the projection exposure apparatus.

With regard to distortion, known means is available as a method of controlling magnification and the third-order distortion. For example, there are a method of moving a plurality of optical elements with respect to each other in a projection optical system along the optical axis thereof, and a method of controlling the pressure in the gas sealed between optical elements. Magnification is a basic quantity of an optical system and can be varied without causing variations in other aberrations, but as to the third-order distortion, an optical system needs to be designed from the beginning in view of the correction of the third-order distortion because the correction of the third-order distortion offers problems such as variations in other aberrations and a narrow range of adjustment. In particular, if various image-forming methods which are generically called image enhancement such as off-axis illumination techniques or phase-shifting masks are adopted, the matching of distortion between image-forming methods becomes a problem. In this case, it is a great problem to establish the techniques of arbitrarily controlling the third-order distortion without imposing a load on design.

Higher-order distortion will be described below. In a scan type of projection exposure apparatus, it is possible to correct through scanning an asymmetrical magnification difference, for example, the difference in magnification between the x- and y-axes taken in a direction perpendicular to the optical axis of the apparatus. Regarding the direction of scanning, the averaging of distortion is effected by an averaging effect which accompanies scanning. For example, if a slit is longer in the x-axis direction and scanning is performed in the y-axis direction, the scanning results in the fact that magnification in the y direction is adjusted by controlling the synchronism of the scanning, and optical distortion such as so-called third-order and fifth-order distortion is reduced to a small value by averaging within the slit.

However, since no averaging is effected in the x direction, it is necessary to optically control distortion with high accuracy. A greatest problem encountered when magnification and the third-order distortion are corrected by known techniques is higher-order distortion of the fifth order or higher. It is said that to correct this higher-order distortion is a great problem to be solved.

Japanese Laid-Open Patent Application No. Hei 7-183190 has proposed a projection exposure apparatus which is capable of adjusting optical characteristics rotationally asymmetrical about the optical axis of its projection optical system which remain in the projection optical system for projecting a pattern from a mask surface onto a wafer surface.

According to Japanese Laid-Open Patent Application No. Hei 7-183190, in the projection exposure apparatus having an illumination optical system for illuminating a first object and a projection optical system for projecting an image of the first object illuminated by the illumination optical system onto a second object at a predetermined reduction magnification, optical means having power rotationally asymmetrical about the optical axis of the projection optical system is disposed between the first object and the second object, and the optical means is disposed for rotation about the optical axis of the projection optical system or for movement along the optical axis of the projection optical system in order to correct optical characteristics rotationally asymmetrical about the optical axis of the projection optical system which remain in the projection optical system.

Various proposals, such as the simplest method of effecting focus correction during exposure, have heretofore been made with respect to a method of correcting a variation in optical performance due to the absorption of exposure light into a projection optical system. However, in the age of the scan type of projection exposure apparatus (scanner), it has newly been found out that aberration rotationally asymmetrical about the optical axis occurs, and this finding has been becoming a great problem. This is a phenomenon which occurs because illumination light is formed in a slit-like shape asymmetrical about the optical axis, i.e., the intensity distribution of light differs between the longitudinal direction and the lateral direction of the slit-like shape, and longitudinal astigmatism which causes the difference in focus between longitudinal lines and lateral lines to vary on the optical axis may occur in an extreme case. The fact that no longitudinal astigmatism occurs so long as no large exposure load is applied to the projection optical system, but if a large exposure load is applied to the projection optical system, longitudinal astigmatism occurs signifies the unstableness of the entire system and is a great problem to the scanner.

Curvature of field is one kind of optical performance which varies when a projection optical system absorbs light in a normal stepper or a scan type of projection exposure apparatus. As described above, there is a method of correcting curvature of field by varying the power of an optical element. However, there is the problem that it is, in general, very difficult to vary the power of an optical element with high accuracy and satisfactorily correct curvature of field.

In addition, to achieve higher resolution, it is necessary to align a reticle and a wafer with higher accuracy. However, if a rotationally asymmetrical magnification difference occurs in the wafer which is a target object, alignment accuracy lowers.

To improve alignment accuracy, the control of magnification becomes a problem, but it is customary that projection optical systems of the types used in steppers have only the function of correcting magnification rotationally symmetrical about their optical axes. However, in an actual semiconductor process, if x, y coordinates are set over a wafer surface according to the directionality of a pattern to be printed, there is a case in which the magnification of extension for each process differs between the x direction and the y direction, i.e., between the longitudinal direction and the lateral direction of the wafer surface, thereby imposing limitations on an improvement in the overall alignment accuracy. Accordingly, for example, if there is a difference of 2 ppm in extension between the x direction and y direction, there is the problem that an uncorrected difference remains as described above.

In the scan type of projection exposure apparatus, although the value of distortion is improved in the form of averaging with respect to the scanning direction, there is the disadvantage that the merit of averaging is not obtained with respect to a direction perpendicular to the scanning direction. As to distortion in particular, there are known methods of controlling magnification and the third-order distortion.

For example, there are a method of relatively moving a plurality of optical elements in a projection optical system along the optical axis thereof and a method of varying the pressure of the gas sealed between optical elements of a projection optical system. However, higher-order distortion of the fifth order or higher has been difficult to correct with any of these known methods. Conversely, there is even a case in which the third-order distortion is difficult to correct.

In particular, if various image-forming methods which are generically called image enhancement such as off-axis illumination techniques or phase-shifting masks are adopted, the matching of distortion between image-forming methods becomes a problem. According to our analysis, it has been found out that most problematic elements in this case are the difference in magnification between the x direction and the y direction and higher-order distortion if magnification and the third-order distortion are corrected by known means. Since the difference in magnification between the x direction and the y direction can easily be corrected in the scan type of projection exposure apparatus, how to correct and control higher-order distortion becomes a problem.

The projection exposure apparatus proposed in Japanese Laid-Open Patent Application No. Hei 7-183190 has the problem that if the optical means having the rotationally asymmetrical power are driven, a plurality of aberrations vary, so that only a desired aberration is difficult to correct.

BRIEF SUMMARY OF THE INVENTION

The present invention has been made in view of the above-described problems.

(1) A projection exposure apparatus comprises a projection optical system for projecting a pattern of a mask onto a substrate, and the projection optical system including a pair of diffractive members at least one of which can be displaced in a direction perpendicular to an optical axis of the projection optical system. Each of the pair of diffractive members has a diffractive surface whose shape is determined so that an optical characteristic of the pair of diffractive members varies when a positional relationship between the diffractive surfaces of the pair of diffractive members in the perpendicular direction varies, and an optical characteristic of the projection optical system is adjusted by displacing the at least one of the pair of diffractive members in the direction perpendicular to the optical axis.

(2) In the projection exposure apparatus described in Paragraph (1), the optical characteristic of the projection optical system includes longitudinal astigmatism.

(3) In the projection exposure apparatus described in Paragraph (2), assuming that the direction in which the at least one of the pair of diffractive members is displaced is an x direction, a shape of an equivalent aspheric surface of the diffractive surface of each of the pair of diffractive members is expressed by a formula which includes a term of the third order of x.

(4) In the projection exposure apparatus described in Paragraph (2), a surface shape represented by a difference between the equivalent aspheric surfaces of the respective diffractive surfaces varies when the pair of diffractive members moves in directions which are opposite to each other and which traverse an optical path of the projection optical system.

(5) In the projection exposure apparatus described in Paragraph (3), the projection exposure apparatus performs projection exposure while scanning the mask and the substrate, the x direction being perpendicular to a direction in which the projection exposure apparatus scans the mask and the substrate.

(6) In the projection exposure apparatus described in Paragraph (1), the optical characteristic of the projection optical system includes curvature of field.

(7) In the projection exposure apparatus described in Paragraph (6), assuming that the direction in which the at least one of the pair of diffractive members is displaced is an x direction, a shape of the diffractive surface of each of the pair of diffractive members is expressed by a formula which includes a term of the third order of x, the optical characteristic of the projection optical system including the curvature of field relative to the x direction.

(8) In the projection exposure apparatus described in Paragraph (6), a surface shape represented by a difference between equivalent aspheric surfaces of the respective diffractive surfaces varies when the pair of diffractive members moves in directions which are opposite to each other and which traverse an optical path of the projection optical system.

(9) In the projection exposure apparatus described in Paragraph (7), the projection exposure apparatus performs projection exposure while scanning the mask and the substrate, the x direction being perpendicular to a direction in which the projection exposure apparatus scans the mask and the substrate.

(10) In the projection exposure apparatus described in Paragraph (1), the optical characteristic of the projection optical system includes projection magnification.

(11) In the projection exposure apparatus described in Paragraph (10), assuming that the direction in which the at least one of the pair of diffractive members is displaced is an x direction, a shape of the diffractive surface of each of the pair of diffractive members is expressed by a formula which includes a term of the third order of x, the optical characteristic of the projection optical system including the projection magnification relative to the x direction.

(12) In the projection exposure apparatus described in Paragraph (10), a surface shape represented by a difference between equivalent aspheric surfaces of the respective diffractive surfaces varies when the pair of diffractive members moves in directions which are opposite to each other and which traverse an optical path of the projection optical system.

(13) In the projection exposure apparatus described in Paragraph (11), the projection exposure apparatus performs projection exposure while scanning the mask and the substrate, the x direction being perpendicular to a direction in which the projection exposure apparatus scans the mask and the substrate.

(14) In the projection exposure apparatus described in Paragraph (1), the optical characteristic of the projection optical system includes distortion.

(15) In the projection exposure apparatus described in Paragraph (14), assuming that the direction in which the at least one of the pair of diffractive members is displaced is an x direction, a shape of the diffractive surface of each of the pair of diffractive members is expressed by a formula which includes a term of the fifth order of x.

(16) In the projection exposure apparatus described in Paragraph (14), assuming that the direction in which the at least one of the pair of diffractive members is displaced is an x direction, a shape of the diffractive surface of each of the pair of diffractive members is expressed by a formula which includes a term of the seventh order of x.

(17) In the projection exposure apparatus described in Paragraph (14), a surface shape represented by a difference between equivalent aspheric surfaces of the respective diffractive surfaces varies when the pair of diffractive members moves in directions which are opposite to each other and which traverse an optical path of the projection optical system.

(18) In the projection exposure apparatus described in Paragraph (15), the projection exposure apparatus performs projection exposure while scanning the mask and the substrate, the x direction being perpendicular to a direction in which the projection exposure apparatus scans the mask and the substrate.

(19) In the projection exposure apparatus described in Paragraph (16), the projection exposure apparatus performs projection exposure while scanning the mask and the substrate, the x direction being perpendicular to a direction in which the projection exposure apparatus scans the mask and the substrate.

(20) The projection exposure apparatus described in Paragraph (7) further comprises a second pair of transparent diffractive members whose diffractive surfaces face each other, in the optical path of the projection optical system, and one of the second pair of diffractive members is movable in a y direction which traverses the optical path and which is perpendicular to the x direction, and curvature of field relative to the y direction of the projection exposure apparatus varies when a surface shape represented by a difference between equivalent aspheric surfaces of the respective diffractive surfaces varies due to a movement of the one of the second pair of diffractive members. A shape of the diffractive surface of each of the second pair of diffractive members is expressed by a formula which includes a term of the third order of y.

(21) In the projection exposure apparatus described in Paragraph (20), the two pairs of diffractive members are used to adjust curvature of field and longitudinal astigmatism of the projection exposure apparatus.

(22) In the projection exposure apparatus described in Paragraph (20), a surface shape represented by a difference between equivalent aspheric surfaces of the respective diffractive surfaces varies when the second pair of diffractive members move in directions which are opposite to each other and which traverse the optical path of the projection optical system.

(23) In the projection exposure apparatus described in Paragraph (20), a surface shape represented by a difference between equivalent aspheric surfaces of the respective diffractive surfaces varies when the diffractive members which constitute each of the two pairs move in directions which are opposite to each other and which traverse the optical path of the projection optical system.

(24) In the projection exposure apparatus described in Paragraph (20), one of the diffractive members which constitute each of the two pairs is one member shared by the two pairs and having diffractive surfaces on opposite surfaces thereof.

(25) A projection exposure apparatus comprises a projection optical system for projecting a pattern of a mask onto a substrate, and the projection optical system includes a pair of diffractive members at least one of which can be displaced in a direction perpendicular to an optical axis of the projection optical system. Each of the pair of diffractive members has a diffractive surface whose shape is determined so that a refractive power of the pair of diffractive members varies when a positional relationship between the diffractive surfaces of the pair of diffractive members in the perpendicular direction varies, and a refractive power of the projection optical system is adjusted by displacing the at least one of the pair of diffractive members in the direction perpendicular to the optical axis.

(26) A projection exposure apparatus comprises a projection optical system for projecting a pattern of a mask onto a substrate, and the projection optical system includes a pair of diffractive members at least one of which can be displaced in a direction perpendicular to an optical axis of the projection optical system. Each of the pair of diffractive members has a diffractive surface whose shape is determined so that an aberration of the pair of diffractive members varies in amount when a positional relationship between the diffractive surfaces of the pair of diffractive members in the perpendicular direction varies, and an aberration of the projection optical system is adjusted by displacing the at least one of the pair of diffractive members in the direction perpendicular to the optical axis.

(27) A device manufacturing method comprises the steps of supplying a mask on which a device pattern is formed as well as a wafer to a projection exposure apparatus according to one of Paragraphs (1) to (23), (25) and (26), and projecting and transferring an image of the device pattern of the mask to the wafer by using a projection optical system, after adjusting an optical characteristic of the projection optical system.

DETAILED DESCRIPTION OF THE INVENTION

Preferred embodiments of the present invention will be described below in detail with reference to the of accompanying drawings.

Figure 1:
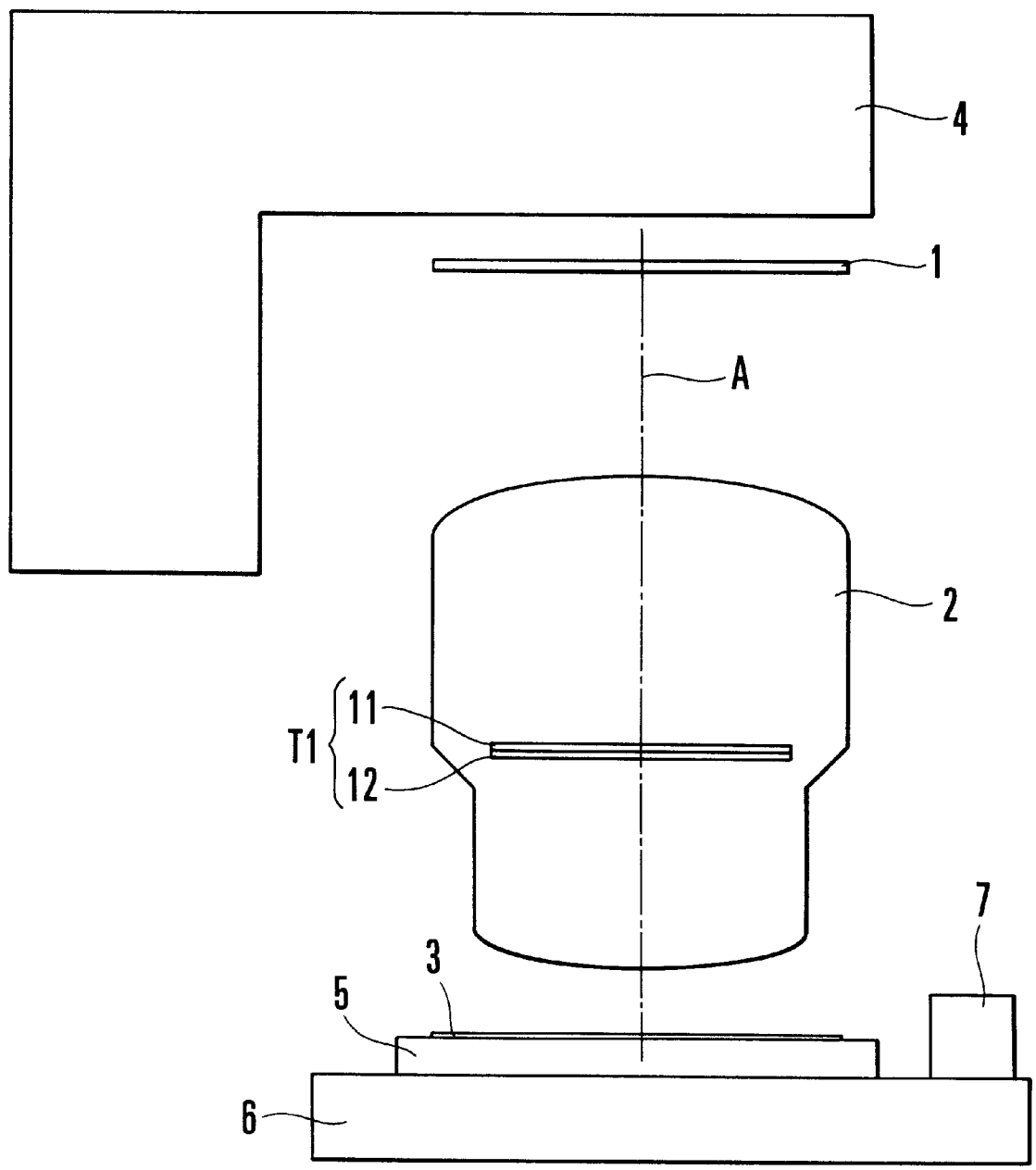
FIG. 1 is a schematic view of the essential portion of a first embodiment of the present invention.

FIG. 1 is a schematic view of the essential portion of a first embodiment of the projection exposure apparatus according to the present invention. FIG. 1 shows a case in which the first embodiment is applied to a normal stepper or a scan type of stepper (projection exposure apparatus).

Referring to FIG. 1, an exposure illumination system 4 is arranged to illuminate a reticle (mask) 1 which is a first object. The exposure illumination system 4 includes a light source selected from among an ArF excimer laser (with wavelength 193 nm), a KrF excimer laser (with wavelength 248 nm) and a lamp which emits g-line (with wavelength 436 nm) or i-line (with wavelength 365 nm), as well as a known optical system and the like.

A projection optical system 2 such as a refraction or catadioptric projection optical system is arranged to project the circuit pattern of the reticle 1 illuminated by the exposure illumination system 4 onto a wafer (target substrate) 3 which is a second object.

Optical means T1 having the function of controlling longitudinal astigmatism has two quartz- or fluorite-made optical elements 11 and 12 each having a diffraction grating surface which serves an aspheric function, as will be described later with reference to FIGS. 3 and 4. The optical means T1 is disposed near a pupil of the projection optical system 2. The wafer 3 is held on a wafer holder 5. The wafer holder 5 is mounted on a wafer stage 6 which makes known x-y-z movements and θ movements as well as tilt movements and the like.

An interfering mirror 7 is provided for monitoring the position of the wafer stage 6 by means of an interferometer (not shown). A wafer state movement control system (not shown) positions the wafer 3 at a predetermined location by using a signal obtained from the interfering mirror 7 and the interferometer, and projection exposure is carried out with the wafer 3 positioned at the predetermined location.

In the first embodiment, the optical means T1 and the projection optical system 2 constitute one element of a projection system which projects the patterns formed on the mask 1 onto the substrate 3. This constitution is similarly incorporated in each embodiment which will be described later.

If the first embodiment is a scan type of stepper (projection exposure apparatus), a reticle stage (not shown) on which the reticle 1 is mounted and the wafer stage 6 are made to move in a direction perpendicular to the optical axis of the projection optical system 2 at a speed ratio corresponding to an image-forming magnification of the projection optical system 2, thereby effecting a scanning exposure.

The stepper according to the first embodiment differs from normal steppers and scan types of steppers in that the optical means T1 is provided in a projection optical path and driving means (not shown) for moving the optical means T1 is provided, but the other constituent elements of the stepper according to the first embodiment are basically identical in construction to those of normal steppers and scan types of steppers.

In general, in a projection optical system using an ArF excimer laser (wavelength: 193 nm) as an exposure light source, because the wavelength of the light beam emitted from the ArF excimer laser lies in a short wavelength range, glass to be used for the projection optical system must be selected from limited kinds of glass materials and, at present, quartz ($SiO_2$) and fluorite ($CaF_2$) are only available.

However, in the short wavelength range, quartz has the transmittance problem of absorbing exposure light and suffering a thermal variation (a variation in optical characteristics) to vary the image-forming performance of the projection optical system. This situation is similar to that caused by a thermal change occurring when the i-line (with wavelength 365 nm) is used as an exposure light beam. In the case of the i-line, various glass materials are used for correcting chromatic aberration, but they include glass materials of low transmittance.

For this reason, the i-line also causes the problem of thermal aberration, and in the projection optical system using the ArF excimer laser, exposure patterns are becoming finer and finer and its depth of focus is becoming smaller and smaller, so that the situation is becoming far severer.

When a glass material of the projection system absorbs exposure light, aberrational variations occur, and an aberration which is difficult to correct among the aberrations which occur due to the aberrational variations is longitudinal astigmatism which is an aberration of a component of rotational asymmetry. The longitudinal astigmatism occurs when the manner of transmission of light through the projection system is rotationally asymmetrical. This kind of rotational asymmetry with respect to the projection system is more emphasized in the case of a scan optical system when illumination light has a rectangular slit-like cross section and a light beam which strikes the projection system 2 assumes a slit-like shape.

Normally, the ratio of the longitudinal length of the slit to the lateral length thereof is approximately 5, and a rotationally asymmetrical distribution (heat distribution) exists in the interior of the projection system in a more emphasized form than in normal steppers. The resultant aberrations include longitudinal astigmatism which occurs on and off the optical axis.

Such longitudinal astigmatism acts to make the position of focus differ between two cross-sectional areas which contain the optical axis and are perpendicular to each other.

Conventionally, optical systems have been constructed on the assumption that their optical characteristics are axially symmetrical (rotationally symmetrical) with respect to the optical axis, and it has not been supposed that the optical characteristics on the optical axis are influenced by the rotational asymmetry of a variation in the optical characteristics due to the absorption of exposure light.

The present inventors have proved that a large amount of longitudinal astigmatism due to exposure occurs during an earlier period of an exposure process, and as the exposure process is continued, the value of the longitudinal astigmatism becomes smaller due to the diffusion of heat absorbed.

In general, in projection systems for manufacturing semiconductor devices, the amount of longitudinal astigmatism which occurs when exposure light is absorbed by a glass material constituting a projection system is small, but such a small amount of longitudinal astigmatism becomes unnegligible as exposure patterns become finer patterns on the order of a half micron or quarter micron and the depth of focus of a projection system becomes smaller.

The present inventors have found out that the amount of longitudinal astigmatism which actually occurs is a small amount on the order of 0.2–0.3 μm and there is a possibility that a transmission type of optical element having a new function needs to be introduced to correct such longitudinal astigmatism.

In a specific construction of the projection system according to the first embodiment, one or a plurality of optical means which include at least a pair of optical elements each having a diffraction grating surface equivalent to an aspheric surface are inserted in an optical path of the projection optical system in such a manner that the diffraction grating surfaces of the respective optical elements face each other, and the paired optical elements are laterally shifted with respect to each other in a direction perpendicular to the optical axis so that the relative position of the paired optical elements with respect to the perpendicular direction is varied, thereby adjusting and correcting longitudinal astigmatism. The optical means which includes the paired two optical elements each having the diffraction grating surface produces its rotationally asymmetrical power according to a shift quantity, thereby varying the longitudinal astigmatism of the projection system to enable correction of the longitudinal astigmatism.

In the first embodiment in particular, by taking notice that the amount of occurrence of longitudinal astigmatism due to absorption of exposure light is small, effective correction of longitudinal astigmatism is accomplished by using diffraction grating surfaces which produce only small aspheric quantities. In addition, because the absolute values of the equivalent aspheric quantities of the diffraction grating surfaces as well as the diffraction optical elements are small, the optical means of the first embodiment can correct only longitudinal astigmatism without influencing the other optical performance. Accordingly, the optical means is also suited to aberration correcting means.

A specific construction of the optical means for correcting longitudinal astigmatism in accordance with the first embodiment will be described below. The first embodiment is characterized in that the optical means uses two optical elements and the two optical elements can integrally produce a small optical power and are arranged to vary the optical power.

The projection optical system according to the first embodiment shown in FIG. 1 is arranged to correct the longitudinal astigmatism of the projection optical system 2 by using the optical means T1 having the above-described construction.

Figure 3:
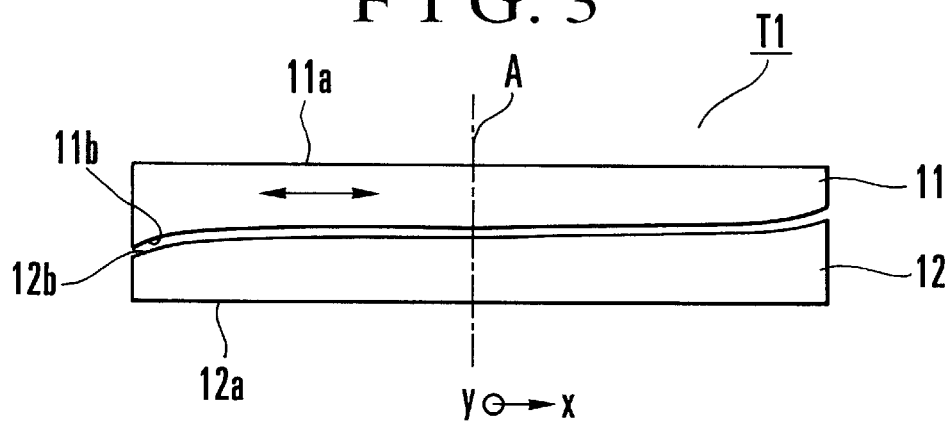
FIG. 3 is an enlarged explanatory view of a portion of the first embodiment shown in FIG. 1.

Referring to FIG. 3, the optical means T1 includes the two optical elements 11 and 12 disposed to face each other, and the respective optical elements 11 and 12 have planar outside surfaces 11a and 12a as well as inside surfaces 11b and 12b which are formed as diffraction grating surfaces of the same shape, respectively. The respective diffraction grating surfaces 11b and 12b are formed as diffraction grating surfaces each having an action equivalent to an aspheric surface whose shape is expressed as z=f(x, y).

Figure 2:
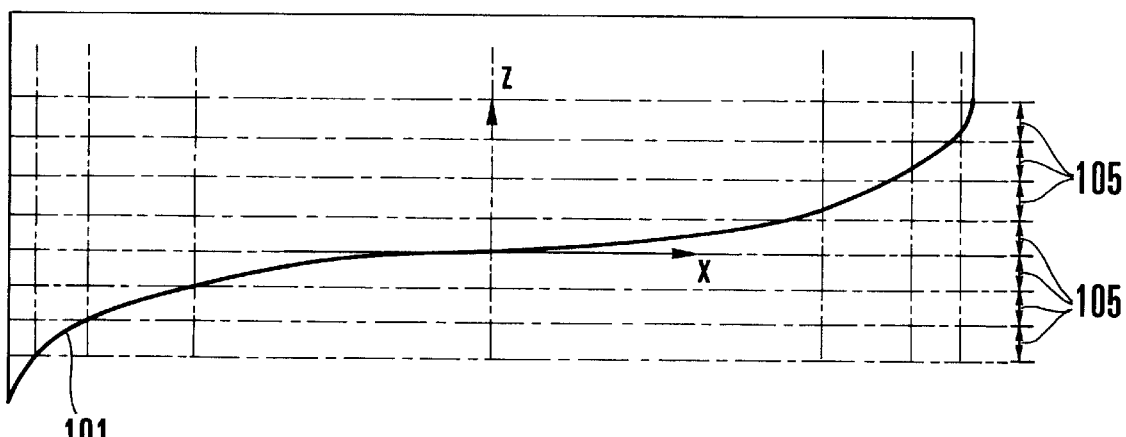
FIGS. 2(A), 2(B) and 2(C) are explanatory views showing the relationship between a diffraction grating surface and its equivalent aspheric surface.
Figure 2:
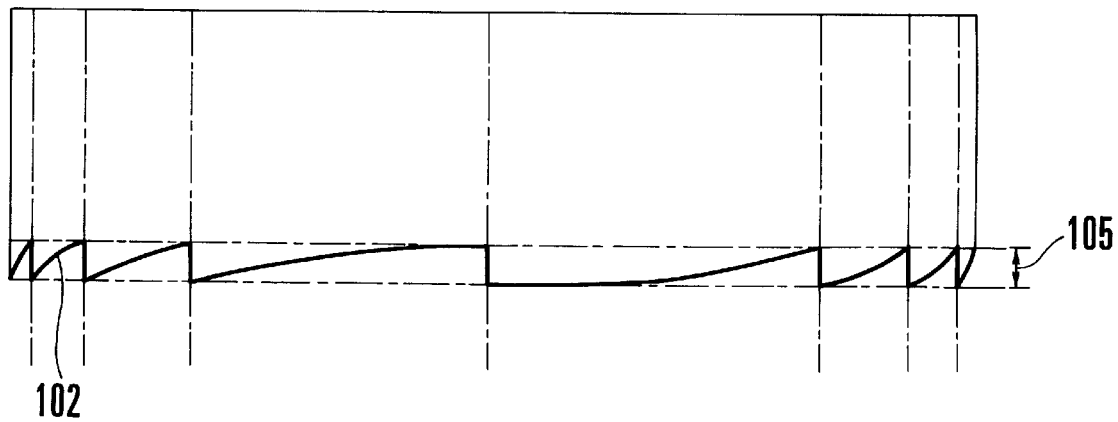
Figure 2:
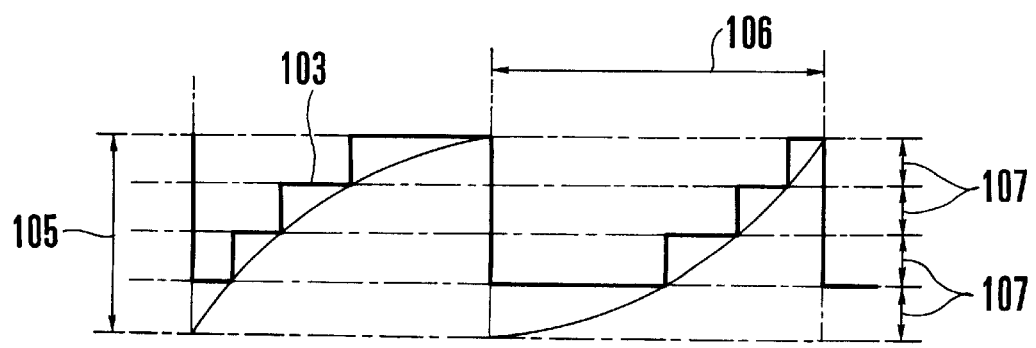

FIGS. 2(A), 2(B) and 2(C) are views aiding in describing a diffraction grating surface 102 which has an action equivalent to an aspheric surface whose shape is expressed as z=f(x, y). In FIG. 2(A), a surface 101 represents the aspheric surface whose shape is expressed as z=f(x, y), and for the sake of simplicity, the shape is shown as a shape which does not depend on the y direction (the direction perpendicular to the sheet surface of FIG. 2(A), as expressed by z=f(x). It is assumed here that n represents the diffractive index of the diffraction grating surface and λ represents a representative wavelength (central wavelength) of the wavelength band of light to be used, for example, exposure light, and that light is made incident in parallel with the z-axis. Because of the surface shape of z=f(x), light incident at a position x=x is longer in optical path length than light incident at a position $x=x_0$ by the difference expressed as:

$$opd(x)=(1-n)\times[f(x)-f(x_0)].$$

The optical path length difference between both lights is equivalent to the phase difference expressed as:

$$\text{phase}(x)=2\pi(1-n)\times[f(x)-f(x_0)]/\lambda.$$

If there is an imaginary surface whose thickness which gives a phase variation to a planar surface by the function "phase (x)" is approximately "0", the imaginary surface and the original aspheric surface serve the same action on a condition that the thickness of the original aspheric surface is fully small. The function "phase (x)" given to such an imaginary surface is called a phase function. In some cases, the function "opd (x)" is called a phase function.

To embody a surface equivalent to the imaginary surface whose thickness is approximately "0", consideration will be given below to a status in which as the general nature of a wave such as light, the phase of the wave assumes a periodic function whose period is 2π. Even if the phase difference varies by an integral multiple of 2π at an arbitrary point on a surface to which the phase function "phase (x)" is given, the influence of this variation on light does not vary because of the periodicity of the phase. Incidentally, the phase difference 2π becomes the wavelength λ in terms of the optical path length difference. Accordingly, if the phase function exceeds a certain range, it should be possible to limit the range of the phase function to a certain range by appropriately adding an integral multiple of 2π. Reducing the range of the phase function to a certain range corresponds to reducing the thickness of the surface, and since the thickness of the surface can be limited to a thickness on the order of λ by setting the range of the phase function to 2π, the surface can be used as the above-described imaginary surface. Such a surface is called a diffractive surface, a diffraction grating surface or the like.

The diffraction grating surface will be specifically described below. In FIG. 2(A), it is assumed that the optical path length difference λ (the phase difference 2π) and an actual distance λ/(n−1) are represented by double-headed arrows 105, and consideration will be given below to a status in which the surface shape z=f(x) is divided by λ in the z-direction. The periodicity of the phase 2π is equivalent to the fact that the action of the surface shape does not vary even if the surface shape is shifted by λ in the z-direction. Accordingly, even if the aspheric surface 101 shown in FIG. 2(A) is deformed into the diffraction grating surface 102 which is formed by dividing the aspheric surface 101 by a width of λ in the z-direction, moving each of the divided parts by an integral multiple of λ in the z-direction, and folding them in one range as shown in FIG. 2(B), it is possible to obtain the same action as the aspheric surface 101. In this case, the diffraction grating surface and the aspheric surface are herein called equivalent, and the diffraction grating surface is hereinafter shown as an equivalent aspheric surface. Incidentally, although the aspheric surface 101 is divided by the optical path length difference λ in the z-direction by way of example, the aspheric surface 101 may be divided by an integral multiple of λ corresponding to an integral multiple of 2π.

If the aspheric surface 101 is divided by the optical path length difference λ when the variation in the surface shape z=f(x) is rapid, the length (grating pitch) of each part shown by a double-headed arrow 106 becomes short and may become on the order of several μm. If the diffraction grating surface 102 and the aspheric surface 101 are to be made equivalent, it is necessary that the surface shape be expressed as z=f(x)+d (d: constant) at the diffraction grating surface in each of the divided parts, but it becomes difficult to manufacture an accurate shape on the order of several μm. In such a case, it is possible to adopt the concept of binary optics which approximate surface shapes in a staircase-like manner. The details of binary optics (BO) are described in reports such as G. J. Swanson, Technical Report 854, MIT Lincoln Laboratory, Aug. 14, 1989 and G. J. Swanson, Technical Report 914, MIT Lincoln Laboratory, Mar. 1, 1991. A staircase-like shape can readily be produced by a lithography process, and its fine structure can accurately be produced by using a process similar to a semiconductor fabrication which uses a stepper or a scanner as an exposure apparatus. The surface 103 shown in FIG. 2(C) is obtained by forming the diffraction grating surface 102 as a BO surface. The surface 103 is approximated by a four-step staircase, and the structure of the staircase is normally formed so that an equal phase difference is given at each step.

Otherwise, in an area of a coarse grating pitch, its surface shape may be produced by cutting or the like without approximation, while in an area of a fine grating pitch, a method of producing a BO surface or a method of varying the number of steps of a staircase according to the grating pitch may be adopted.

Although the above description has referred to a surface shape having a one-dimensional dependence in only the x direction for the sake of simplicity, the above description applies to a surface shape having a two-dimensional dependence in the x and y directions.

The construction of the optical means T1 used in the first embodiment shown in FIG. 1 will be described below. FIG. 3 is a cross-sectional view of the essential portion of the optical means T1 having the function of controlling longitudinal astigmatism in the first embodiment.

Referring to FIG. 3, the optical elements 11 and 12 are disposed to face each other, and the outside surfaces 11a and 12a are planar surfaces, while the facing surfaces 11b and 12b are diffraction grating surfaces of the same shape which face each other to coincide with each other when they are superimposed on each other. Incidentally, the surfaces 11b and 12b may also be aspheric surfaces which differ from each other in shape.

In FIG. 3, a dot-dashed line A represents the optical axis, and the x- and y-axes are taken to cross at right angles to the optical axis A. Letting fa(x, y) represent the shape of the equivalent aspheric surface of the optical element 11 which is one of the diffraction grating surfaces which face each other, and letting fb(x, y) represent the shape of the equivalent aspheric surface of the optical element 12 which is the other diffraction grating surface, and letting the x direction be a shifting direction, both equivalent aspheric shapes are given by the following formulae whose constant terms only differ from each other:

$$fa(x, y)=ax^3+bx^2+cx+d_1,$$

$$fb(x, y)=ax^3+bx^2+cx+d_2. \quad (1a)$$

The reason why the above formulae are related to only x is that the two optical elements 11 and 12 are planar in the y direction and aspheric in the x direction and only the optical power (focal length) of the optical means T1 in the x direction is controlled by shifting the relative position of the two optical elements 11 and 12 with respect to the x direction. Since the optical power is produced by the lateral shifting of the optical elements 11 and 12 in the x direction, up to the third-order terms of x are used.

During an initial state, the unevenness of the equivalent aspheric shape fa(x, y) of the optical element 11 and the unevenness of the equivalent aspheric shape fb(x, y) of the optical element 12 completely coincide with each other, so that the optical means T1 composed of the optical element 11 and the optical element 12 does not have an optical power and only acts as a plane parallel plate. It is more preferable to make smaller the distance (or gap) between the optical element 11 and the optical element 12 in the direction of the optical axis A, and its typical value is, for example, approximately 100 μm. It is assumed here that the optical element 11 is moved in the x direction by a distance Δ. The influence at this time is:

$$fa(x+\Delta,y)-fb(x,y)=3a\Delta x^2+2b\Delta x+c\Delta+(d_1-d_2)+3a\Delta^2+b\Delta^2+a\Delta^3, \quad (2a)$$

where a, b and c are constants, respectively.

If the influence of the higher-order terms of Δ is neglected because of its smallness and it is assumed that:

$$b=c=0 \quad (3a)$$

for ease of understanding of the effects of the first embodiment, the formula (2a) can be simplified as:

$$fa(x+\Delta,y)-fb(x,y)=3a\Delta x^2+(d_1-d_2). \quad (4a)$$

The fact that the formula (4a) has the term of $x^2$ constitutes the basis of the first embodiment. Thus, the optical elements 11 and 12 serve as optical elements having an optical power in only the x direction owing to the lateral shift quantity Δ, and the optical power can freely be varied according to the lateral shift quantity Δ.

Since the processing of obtaining a difference from lateral shifting is exactly differentiation, the terms of the third order are inserted as the respective equivalent aspheric shapes of the diffraction grating surfaces, whereby a component of the second order which gives an optical power is produced by the effect of differentiation. Thus, the operations of the optical elements 11 and 12 are realized.

In the first embodiment, although the formula (3a) is expressed as b=c=0 for the sake of simplicity, the term of $2b\Delta x$ in the formula (2a) corresponds to a shift quantity. Since $\Delta$ is a known quantity so that the optical power can be controlled, the shift quantity can be corrected. If $b \neq 0$, a shift becomes a specific problem in the case of alignment. In the case of global alignment, the problem of shift is avoided by giving the wafer stage 6 an instruction to inversely correct a shift occurring when the relative position of the paired optical elements 11 and 12 is varied.

In addition, giving an appropriate value to the term of the constant c has the effect of reducing the absolute values of deviations of the equivalent aspheric surfaces expressed by fa(x, y) and fb(x, y) from planes. Therefore, according to the value of the constant a, it is also effective to intentionally give arbitrary values to the constants b and c, instead of setting the constants b and c to zero. Actually, the constant b may be made zero and the constant c may be given a value whose sign is opposite to that of the constant a.

However, since the correction using the value of the constant c is achieved by correction of an inclination of an incident light beam during measurement with the interferometer, the constant c can be set to c=0 without any problem.

In general, the absolute value of the equivalent aspheric quantity required to correct longitudinal astigmatism having a small value of approximately 0.2–0.3 $\mu$m is very small. An actually effective equivalent aspheric quantity is on the order of several Newton's rings, depending on a position at which the optical elements 11 and 12 are placed. As a representative example, if an equivalent aspheric quantity to be produced as a power component is 1 $\mu$m which corresponds to several Newton's rings and the diameter of a lens is 200 mm and the shift quantity $\Delta$ at this time is 5 mm, the following formula is obtained from the formula (4a):

$$3a \times 5 \times 100 \times 100 = 0.001,$$

whereby the following value is obtained:

$$a = 6.7 \times 10^{-9}.$$

Since the diameter is 200 mm, 100 represents the value of the radius of the lens. If b=c=0, the equivalent aspheric quantity becomes the following value from the formula (1a):

$$6.7 \times 10^{-9} \times 100 \times 100 \times 100 = 6.7 \times 10^{-3},$$

so that each of the optical elements 11 and 12 has an equivalent aspheric quantity of $\pm 6.7$ $\mu$m.

The term of the constant c may be added to reduce the actual amount of deviation of each of the equivalent aspheric quantities from the plane. Since the value of the constant c which gives a value of 6.7 $\mu$m at 100 mm is $6.7 \times 10^{-5}$, if the sign of the constant a and the sign of the constant c are made opposite to each other to obtain:

$$c = -6.7 \times 10^{-5},$$

the deviation of each of the equivalent aspheric quantities from the plane can be reduced to $\pm 2.6$ $\mu$m.

Figure 4:
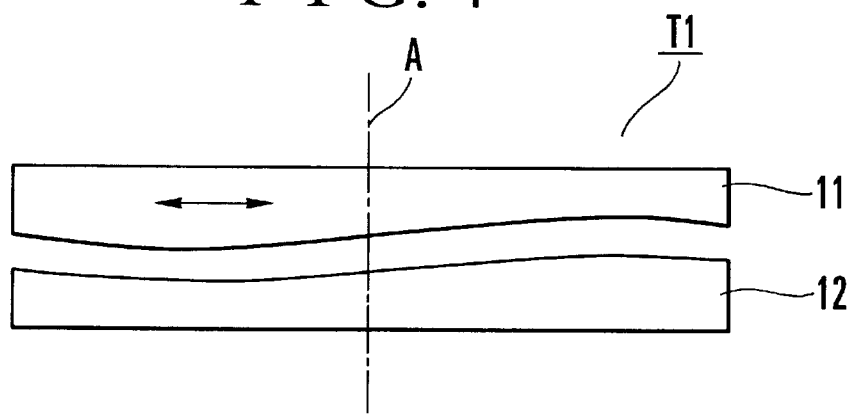
FIG. 4 is an enlarged explanatory view of a portion of the first embodiment shown in FIG. 1.

FIG. 3 shows the shapes of the respective equivalent aspheric surfaces for the constant c whose value is zero, and FIG. 4 shows the shapes of the respective equivalent aspheric surfaces at a cross section of y=0 for the constant c which is given the above value. Each of the equivalent aspheric surfaces has such a mild shape within the diameter of 200 mm and the optical elements 11 and 12 have shapes which are complementary to each other (complementary shapes), whereby the amount of occurrence of other aberrations due to a variation in the relative position of the optical elements 11 and 12 can be reduced to a nearly negligible value and only longitudinal astigmatism can be corrected by a small amount. The other aberrations include chromatic aberration, and in the first embodiment as well as all other embodiments which will be described later, the optical means T1 is designed so that even if the diffraction grating surfaces are relatively displaced and chromatic aberration varies, the variation in chromatic aberration can be suppressed within allowable limits.

There is a case where a variation which is small but needs to be corrected occurs in another optical characteristic such as focus or magnification. In this case, if the other optical characteristic in which such a variation has occurred is corrected, the performance of the projection system can be regarded as being unchanged.

The concept of controlling longitudinal astigmatism by using diffraction grating surfaces while continuously varying the quantities thereof has not yet been proposed. In this sense, the first embodiment greatly contributes to a further improvement in the function of a projection exposure apparatus for manufacturing semiconductor devices which are required to have higher functions.

Another point of the first embodiment is that since the amount of longitudinal astigmatism to be corrected is small, diffraction grating surfaces to be used are made small up to a quantity easily measurable with an interferometer.

In the first embodiment, since a desired longitudinal astigmatism is produced from the difference between the two diffraction grating surfaces which are laterally shifted with respect to each other, the equivalent aspheric quantities of the respective optical elements 11 and 12 have values which are one figure larger than the amount of the difference. In the above-described example, an equivalent aspheric surface of 6.7 $\mu$m are required for each of the optical elements 11 and 12 to obtain an equivalent aspheric quantity having a value of 1 $\mu$m as the effect of lateral shifting. A key point for application of the first embodiment is that the inclinations of the equivalent aspheric surfaces are optimized to reduce each of the equivalent aspheric surfaces to $\pm 2.6$ $\mu$m so that the equivalent aspheric surfaces are accommodated into a highly accurate measurement range of an interferometer. During the production of a diffraction grating surface, it is important to check whether the diffraction grating surface is accurately worked into a desired shape, and if the equivalent aspheric quantity can be reduced to a quantity on the order of that adopted in the first embodiment, existing techniques can fully be applied.

In addition, by reducing a correction quantity (or dynamic range) or increasing a shift quantity, the equivalent aspheric quantity can be made far smaller.

A further great advantage of the first embodiment is that since the correction of rotationally asymmetrical optical power can be realized with optical elements having a refracting action, it is possible to provide means effective for both refraction and catadioptric projection optical systems used in the projection exposure apparatus.

In a scan type of stepper which performs exposure with slit-shaped light (hereinafter referred to as the slit), the direction of occurrence of longitudinal astigmatism has a close relationship to the directionality of the slit. Accordingly, the x direction in which the optical means T1 has an optical power to be controlled is set to coincide with the longitudinal or lateral direction of the slit. In practice, the x direction is set to coincide with a direction of the external shape of the reticle 1, shown in FIG. 1, which has a square shape.

This setting is also effective against aberration (exposure aberration) which occurs during exposure in the stepper. In the first embodiment, a scan type of stepper has been referred to by way of example for the purpose of simplifying the description of longitudinal astigmatism. However, even in a normal stepper, if a pattern on a reticle has a directionality, diffracted light is rotationally asymmetrically distributed and longitudinal astigmatism may occur. Patterns on reticles show the characteristics of having edges parallel to the external shapes of the reticles because of the characteristics of CAD for designing circuit patterns. If the x direction is set parallel to the external shape of a reticle, the x direction and the direction in which exposure aberration occurs can be made coincident with each other and the occurrence of aberrations can be restrained.

A driving mechanism (not shown) which varies and adjusts the positional relationship between the diffraction grating surfaces of the respective optical elements 11 and 12 is instructed and driven in accordance with the settings of the characteristics of longitudinal astigmatism which are stored in advance in a CPU in the body of the projection exposure apparatus. The amount of driving can be controlled by calculating the amount of correction from the characteristics of longitudinal astigmatism stored in advance in the apparatus by experiment or simulation, by using the amount of exposure, the pattern ratio of a reticle, exposure energy and the like. It is also possible to adopt a method of controlling the amount of driving while measuring the characteristics of a projection optical system, instead of calculating the amount of correction from the characteristics of a system which are stored in advance. The amount of occurrence of longitudinal astigmatism shows the characteristics of having a correlation with a variation in focus due to exposure, and it is also possible to adopt a method of calculating the amount of correction by monitoring the amount of variation in focus due to exposure and calculating the amount of driving of the optical element 11 and/or the optical element 12.

Of course, it is also possible to adopt a method of directly measuring the amount of longitudinal astigmatism and feeding back the measured value to the amount of driving of the relative position of the optical elements 11 and 12.

Since the amount of occurrence of longitudinal astigmatism which is an exposure aberration temporarily varies, the amount of driving of the optical element 11 and/or the optical element 12 also temporarily varies.

Figure 5:
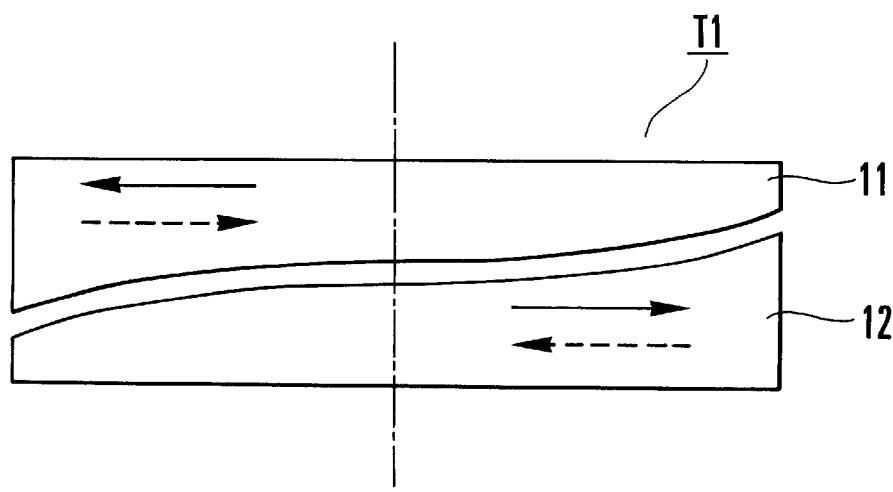
FIG. 5 is an explanatory view of another embodiment of the portion of the first embodiment shown in FIG. 1.

Although the construction of the first embodiment has been described as a system which shifts either one of two optical elements in the x direction, either one of the optical elements may be made to move by $\delta$ in the x direction, while the other may be made to move by $-\delta$ in the x direction. This construction is shown in FIG. 5.

Specifically, $$fa(x+\delta,y)-fb(x-\delta,y)=2a(3\delta x^2+\delta^3)+4b\delta x+2c\delta+d_1-d_2.$$

If it is assumed similarly to the above description that:

$$b=c=0,$$

and if the influence of the higher-order terms of $\delta$ is neglected, $$fa(x+\delta,y)-fb(x-\delta,y)\approx 6ax^2\delta+d_1-d_2.$$

Therefore, if the shift quantity $\Delta$ is equal to $\delta$, the amount of variation in optical power becomes twice as large. Otherwise, if the same amount of variation in optical power is to be obtained, the value of the coefficient (constant) a may be reduced to half. This reduces the equivalent aspheric quantities to half and provides the effect of facilitating evaluation of the shapes of the diffraction grating surfaces. In addition, the shift quantity can be reduced to half to obtain the same amount of variation in optical power. This is advantageous to the design of a space to be provided in a driving system as well as to positioning accuracy.

Figure 6:
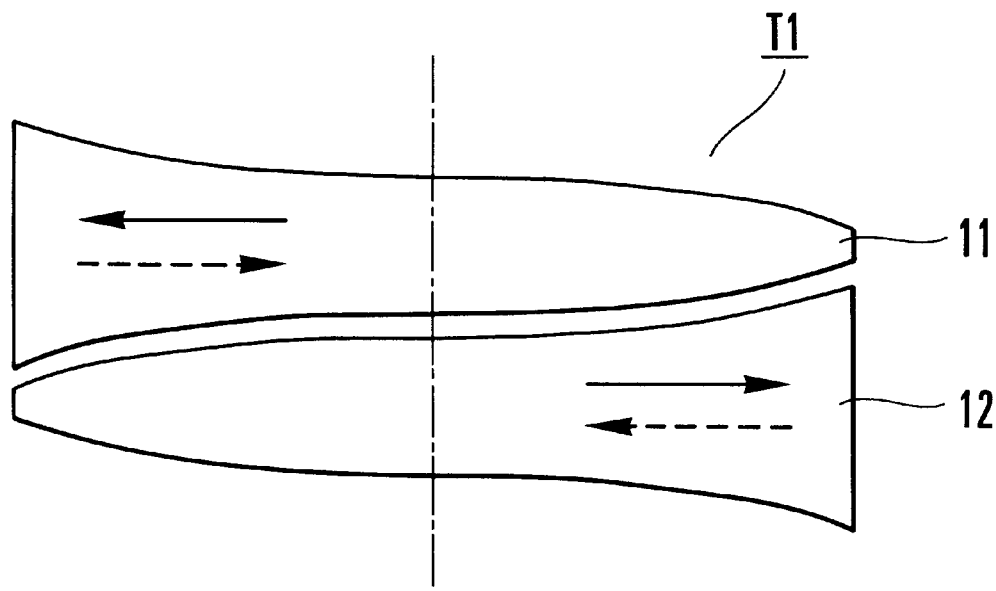
FIG. 6 is an explanatory view of another embodiment of the portion of the first embodiment shown in FIG. 1.

Although the construction of the first embodiment has been described as a system which uses one surface of each of the optical elements as a diffraction grating surface, diffraction grating surfaces may be provided on the opposite surfaces of each of the optical elements. This construction is shown in FIG. 6. If it is presumed that the thicknesses of the optical elements 11 and 12 are small, the above-described effects and advantages are simply added together in the construction shown in FIG. 6. Therefore, if all the diffraction grating surfaces are of the same shape, the value of the coefficient a can be reduced to half to obtain the same amount of variation in optical power as that in the above-described example shown in FIG. 5. As a matter of course, it is also possible to adopt a system which drives either one of the optical elements, or a system which drives both optical elements in directions opposite to each other. In addition, the pair of optical elements may have diffraction grating surfaces which have not the same shape but different shapes.

Figure 7:
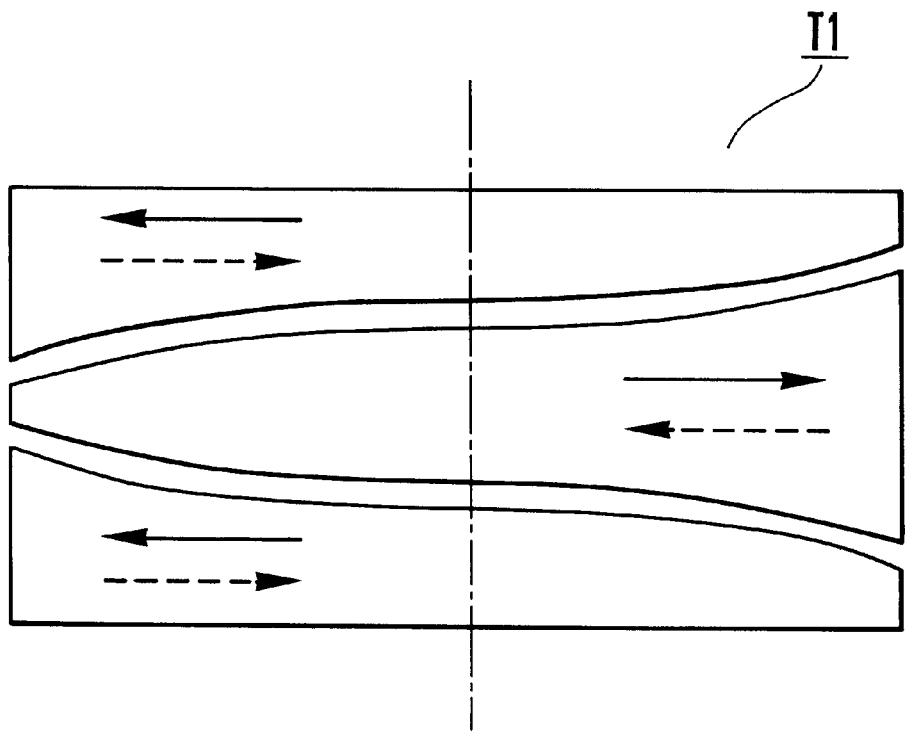
FIG. 7 is an explanatory view of another embodiment of the portion of the first embodiment shown in FIG. 1.

As a matter of course, similar effects can be obtained by using multiple pairs of optical elements. One example is shown in FIG. 7.

Figure 8:
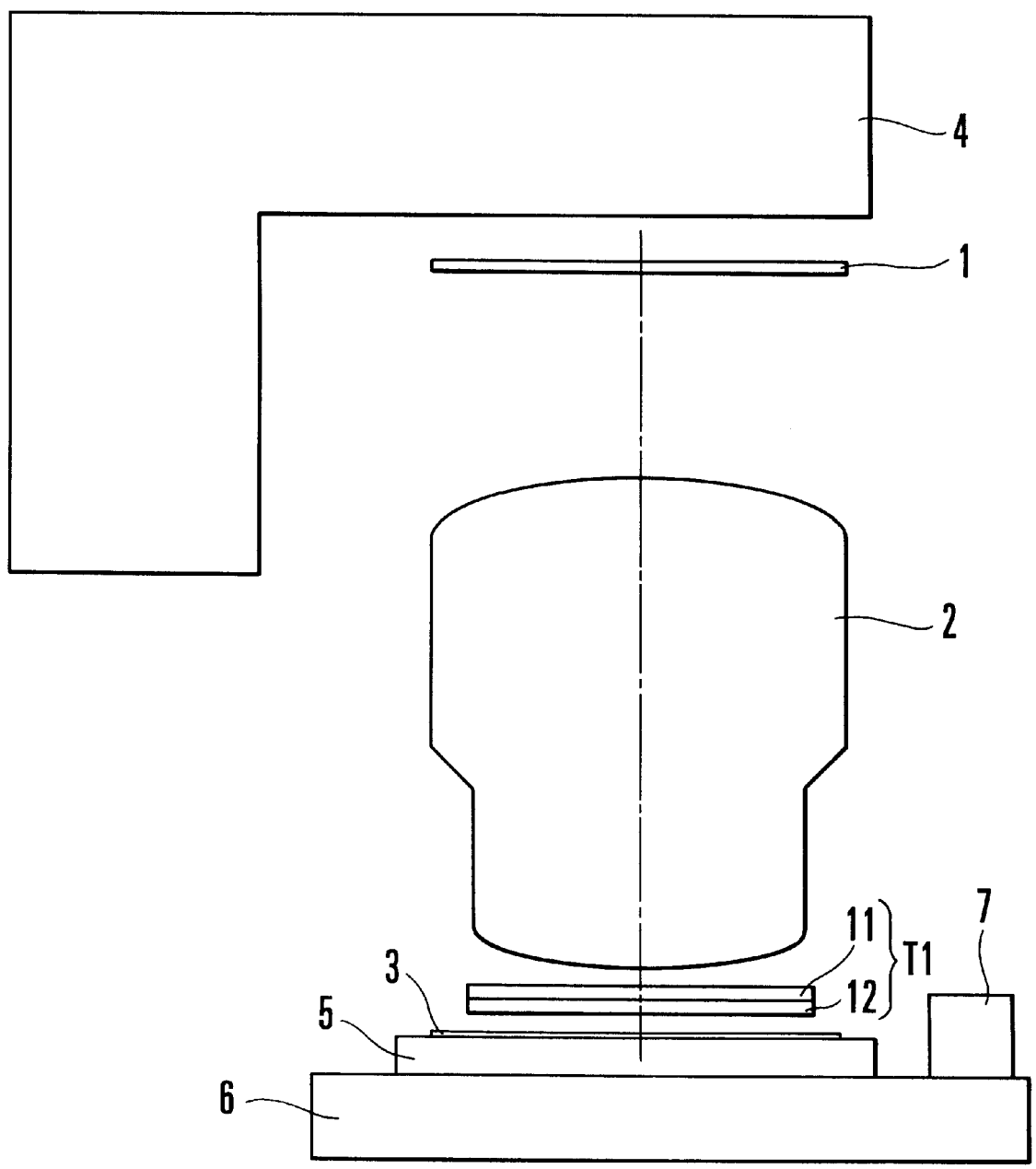
FIG. 8 is a schematic view of the essential portion of a second embodiment of the present invention.

FIG. 8 is a schematic view of the essential portion of a second embodiment of the present invention. In the second embodiment, the optical means T1 is disposed in the optical path between the projection optical system 2 and the wafer 3, and the second embodiment differs from the first embodiment shown in FIG. 1 in the position of insertion of the optical means T1 in the optical path. The other constituent elements of the second embodiment are identical in construction to those of the first embodiment.

In the second embodiment, the above-described optical elements which produce a desired aspheric effect by the combination of two diffraction grating surfaces to be laterally shifted from each other is inserted between the projection optical system 2 and the wafer 3 to correct longitudinal astigmatism. Although the operation of the optical elements is as described above in connection with the first embodiment, the optical means T1 used in the second embodiment is disposed at an appropriate insertion position other than the vicinity of a pupil plane of the projection optical system 2, according to the construction of the projection optical system.

It is preferable that the optical means T1 be disposed in the vicinity of the pupil plane of the projection optical system 2 or between the projection optical system 2 and the wafer 3 or the reticle 1. This is because these three positions are suitable positions where highly independent aberration control is achieved. However, the optical means T1 may also be inserted at a position other than the vicinity of the pupil plane within the projection optical system 2.

Figure 9A:
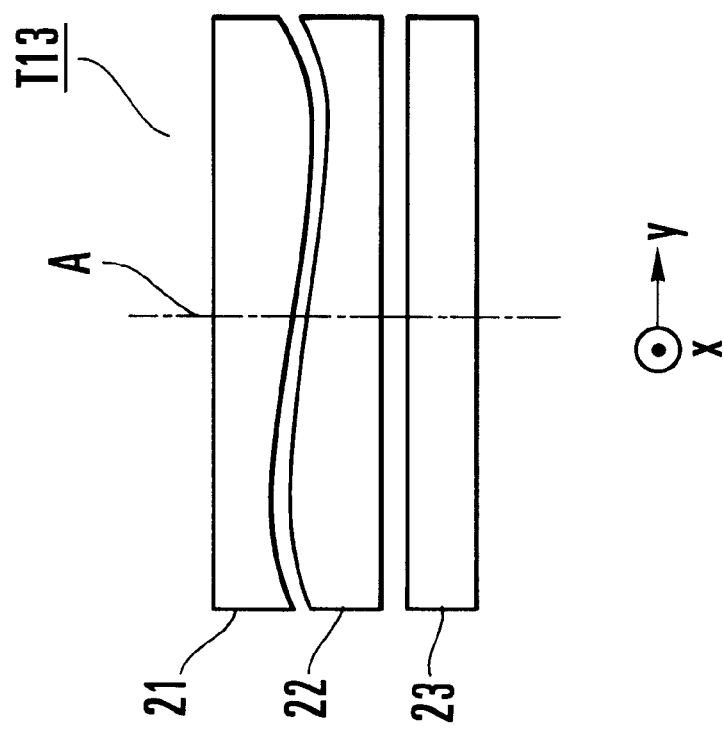
FIGS. 9(A) and 9(B) are explanatory views of optical means used in a third embodiment of the present invention.
Figure 9B:
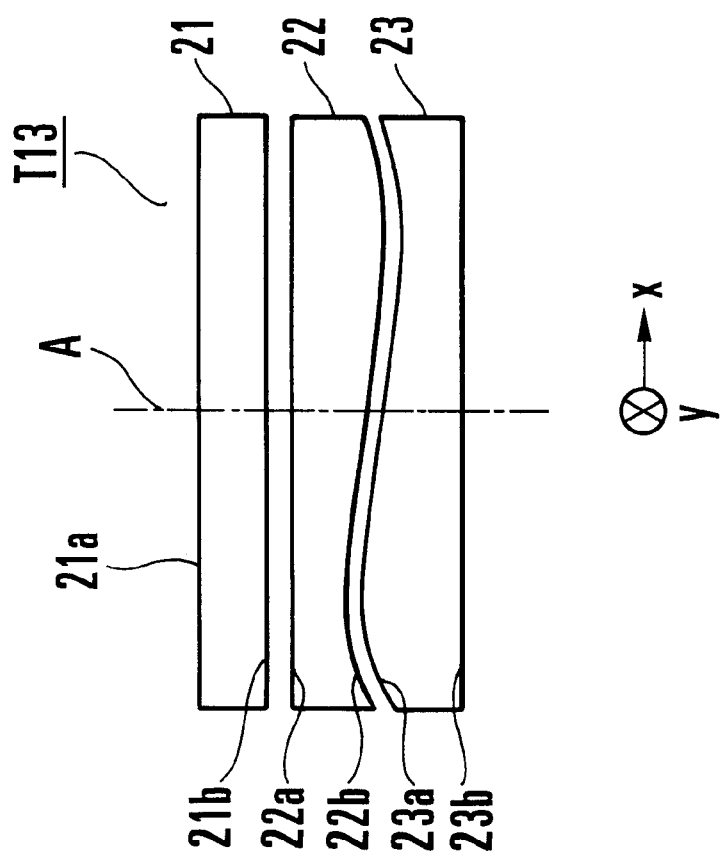

FIGS. 9(A) and 9(B) are schematic views respectively showing the essential portions of an x directional cross section and a y directional cross section of optical means T13 used in a third embodiment of the present invention. The portions other than the optical means T13 of the projection optical system have the constructions shown in FIG. 1 or 8.

The optical means T13 of the third embodiment has three optical elements 21, 22 and 23. In each of the above-described embodiments, since the direction in which longitudinal astigmatism occurs relates to the longitudinal or scanning direction of a slit, only correction of an optical power in one direction has been considered. However, there is a case where not only longitudinal astigmatism but also curvature of field is not negligible, and the third embodiment is intended to cope with the occurrence of curvature of field as well.

The optical means T13 shown in FIGS. 9(A) and 9(B) has an identical optical power varying functions in not only the x direction but also the y direction perpendicular to the x direction so that optical powers in the two x and y directions can independently be controlled to correct both curvature of field and longitudinal astigmatism.

It is assumed that, as viewed in FIGS. 9(A) and 9(B), a reticle and a projection optical system are disposed above the optical means T13 and a wafer is disposed below the optical means T13. A top surface 21a of an optical element 21 is a planar surface, and a bottom surface 21b of the optical element 21 and a top surface 22a of an optical element 22 are diffraction grating surfaces which face each other, respectively. When these bottom surface 21b and top surface 22a shift from each other in the y direction, an optical power in the y direction is produced and can be varied. The principle of controlling the optical power in the y direction is identical to that described above in connection with the formulae (1a) to (4a), except that the parameter x is replaced with y.

A bottom surface 22b of the optical element 22 and a top surface 23a of an optical element 23 are diffraction grating surfaces which face each other, respectively. When these bottom surface 22b and top surface 23a shift from each other in the x direction, an optical power in the x direction is produced. The principle of controlling the optical power in the x direction is identical to that described above in connection with the formulae (1a). A bottom surface 23b of the optical element 23 is a planar surface. The parameters a, b and c for two kinds of equivalent aspheric surfaces which constitute the optical elements 21 and 22 and the optical elements 22 and 23 may be the same or different, and a shift quantity may be controlled in accordance with the formula (2a) for calculating an optical power, according to whether such parameters a, b and c are the same or different.

By adopting the construction shown in FIGS. 9(A) and 9(B), the optical powers in the x and y directions can independently be controlled. If the amounts of optical powers to be produced in the x and y directions are made the same, curvature of field is corrected, whereas if the amounts of optical powers to be produced in the x and y directions are made different, curvature of field and longitudinal astigmatism are corrected. If only an optical power in either one of the x and y directions is produced, longitudinal astigmatism is corrected.

Although in the construction shown in FIGS. 9(A) and 9(B), the top surface 22a and the bottom surface 22b of the optical element 22 are respectively used for control in the y direction and control in the x direction, the optical element 22 may be divided into top and bottom portions so that control in the x direction and control in the y direction are completely separated in the form of individual solids. Instructions to drive the relative positional relationship between the optical elements 21 to 23 are identical to the above-described example, and may be calculated from the characteristics of a system which is recognized in advance, or from actually measured data. A control target changes from one-dimensional to two-dimensional, but since the way of moving the optical elements merely is slightly more complicated, description of a detailed driving method is omitted herein.

In the first to third embodiments, the set value of best focus varies by a small amount during correction of longitudinal astigmatism or curvature of field, but the amount of variation in the set value can be calculated from the amount of driving of the diffraction optical elements and is obtained as a known quantity. Therefore, the problem of the variation in the set value is solved by calculating the amount of variation in the set value by means of a CPU incorporated in the semiconductor projection exposure apparatus and reflecting the calculated amount of variation onto a control value for a wafer surface position relative to the direction of the optical axis of the projection optical system. Other optical performance, for example, the influence of the diffraction optical elements on magnification, is also a quantity which can be calculated from the amount of driving of the diffraction grating surfaces, and therefore can similarly be corrected.

As described previously, the influence of the introduction of the optical means of the present invention on other optical performance can be reduced to a nearly negligible extent. However, although there is a possibility that a rotationally asymmetrical magnification occurs when, for example, longitudinal astigmatism occurs, this problem is solved in a scan type of stepper because its rotationally asymmetrical magnification, i.e., the difference in magnification between its scanning direction and the longitudinal direction of its slit, can be corrected.

In a normal stepper, such a problem is solved by incorporating a rotationally asymmetrical magnification correction function which will be described later.

The projection exposure apparatus according to any of the above-described first to third embodiments can serve predetermined performance which is stable irrespective of input energy, whereby the reliability of the projection exposure apparatus is improved and the throughput of the projection exposure apparatus is improved as the result of the amelioration of limitations imposed by input energy, thereby making it possible to greatly reduce the costs of semiconductor chips. Another great advantage of each of the above-described first to third embodiments is that since the amount of occurrence of a rotationally asymmetrical optical power is variable, the projection exposure apparatus can cope with various variations and is rich in versatility, and because of the small equivalent aspheric quantities, the influence of the optical means on other optical performance can be reduced to a negligible value and, in addition to longitudinal astigmatism, curvature of field can be controlled by altering the construction of the entire system.

Figure 10:
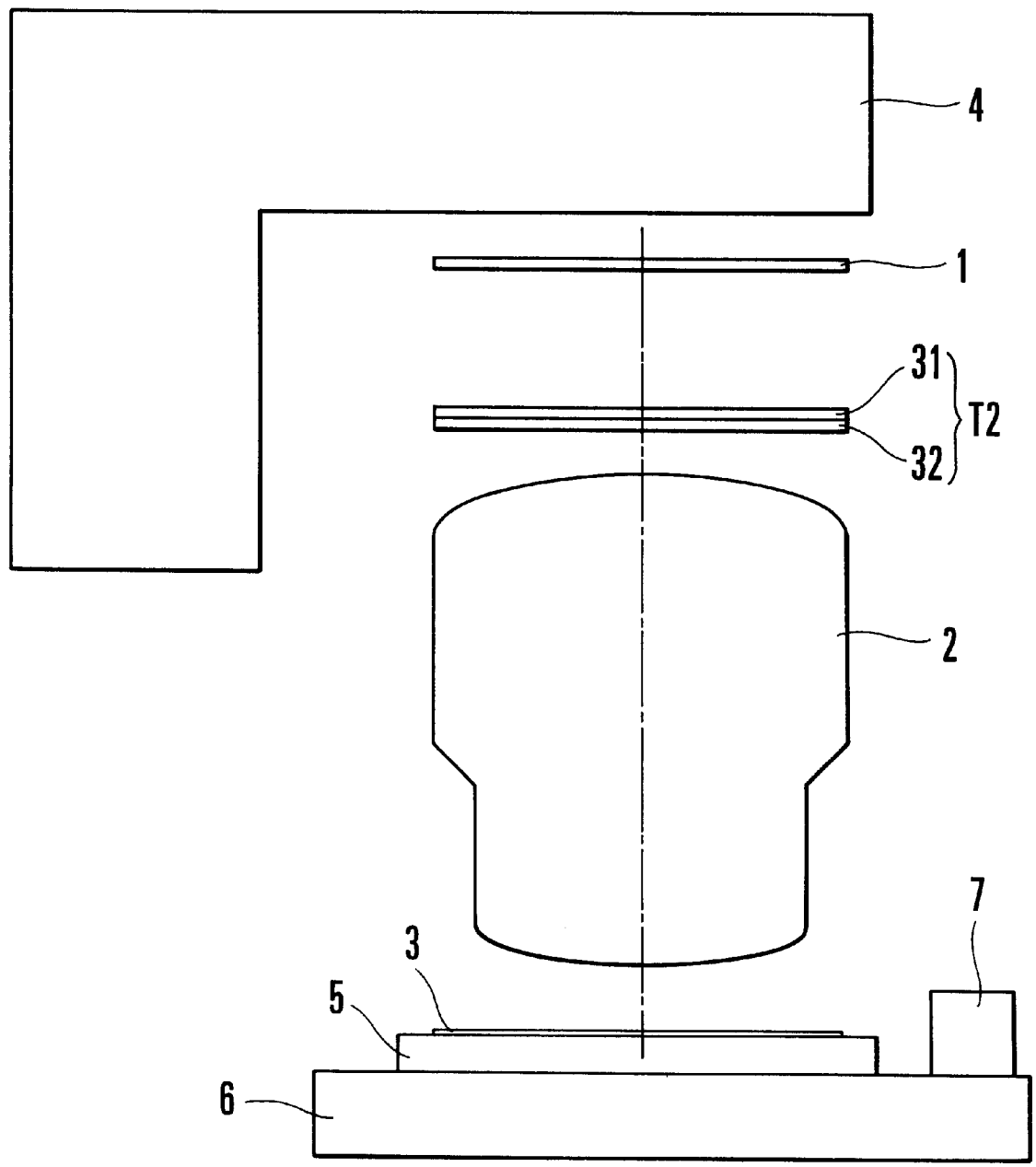
FIG. 10 is a schematic view of the essential portion of a fourth embodiment of the present invention.

FIG. 10 is a schematic view of the essential portion of a fourth embodiment of the projection exposure apparatus according to the present invention. FIG. 10 shows a case in which the fourth embodiment is applied to a normal stepper or a scan type of stepper (projection exposure apparatus).

Referring to FIG. 10, the exposure illumination system 4 is arranged to illuminate the reticle 1 which is a first object. The exposure illumination system 4 includes a light source selected from among an ArF excimer laser (with wavelength 193 nm), a KrF excimer laser (with wavelength 248 nm) and a lamp which emits g-line (with wavelength 436 nm) or i-line (with wavelength 365 nm), as well as a known optical system and the like.

The projection optical system 2 such as a refraction or catadioptric projection optical system is arranged to project the circuit pattern of the reticle 1 illuminated by the exposure illumination system 4 onto the wafer (target substrate) 3 which is a second object.

Optical means T2 has the function of controlling a magnification rotationally symmetrical or asymmetrical about the optical axis of the projection exposure apparatus, and has two optical elements 31 and 32 each having a diffraction grating surface, as will be described later. The optical means T2 is disposed in the optical path between the reticle 1 and the projection optical system 2. The wafer 3 is held on the wafer holder 5. The wafer holder 5 is mounted on the wafer stage 6 which makes x-y-z movements and θ movements as well as tilt movements and the like.

The interfering mirror 7 is provided for monitoring the position of the wafer stage 6 by means of an interferometer (not shown). A wafer state movement control system (not shown) positions the wafer 3 at a predetermined location by using a signal obtained from the interfering mirror 7 and the interferometer, and projection exposure is carried out with the wafer 3 positioned at the predetermined location.

If the fourth embodiment is a scan type of stepper, a reticle stage (not shown) on which the reticle 1 is mounted and the wafer stage 6 are made to move in a direction perpendicular to the optical axis of the projection optical system 2 at a speed ratio corresponding to an image-forming magnification of the projection optical system 2, thereby effecting a scanning exposure.

The fourth embodiment differs from normal steppers and scan types of steppers in that the optical means T2 is provided in the optical path, but the other constituent elements of the fourth embodiment are basically identical in construction to those of normal steppers and scan types of steppers.

Generally known control methods for controlling the image-forming magnification of a projection system are, for example, the technique of moving optical elements with respect to each other in a projection system along the optical axis thereof and a method of controlling the pressure in a sealed space portion of a projection system. Any of these control methods can be applied to the fourth embodiment.

However, these techniques are intended to control a magnification rotationally symmetrical about the optical axis, and are incapable of correcting an anamorphic magnification, i.e., controlling magnifications in the x- and y-axes which are two axes crossing at right angles to the optical axis and to each other, so that the values of the respective magnifications are made to differ from each other.

It has been recognized that during actual manufacture of semiconductor devices, anamorphic magnification is caused on a wafer itself. In a wafer manufacturing process which includes, if complicated, over twenty steps, high-temperature processes such as film formation and diffusion are repeated, and patterning using exposure is performed before each of the high-temperature processes. Patterns formed in semiconductor devices are not necessarily isotropic throughout all processes, and in many processes, patterns are formed in the state of being biased in a particular direction; for example, in a bit-line process, lines are patterned in only the x direction, while in a word-line process, lines are patterned in only the y direction.

Such directionality is primarily due to the fact that CAD for designing a semiconductor device is based on x, y coordinates and the fact that a semiconductor device itself requires a large number of repetitive patterns and the direction of lines to be formed in each process is biased. As a result, even if approximately the same number of lines is used in a finished semiconductor device in both of the x and y directions, the directionality appears to a remarkable extent at individual levels of a manufacturing process, and the extension of a wafer in a high-temperature process performed after patterning has anisotropy according to the directionality of patterns formed. This is the technical background of the fourth embodiment.

An anisotropic extension of a wafer can be determined by using the alignment detecting function of a position detecting sensor of a projection exposure apparatus. Detection of such an extension is performed by reading an alignment-dedicated mark provided in advance on the wafer, by means of the position detecting sensor of the projection exposure apparatus during an alignment process.

All known alignment methods such as global alignment and die-by-die alignment can be applied to the detection of anisotropy of a wafer. In the case of global alignment, it is preferable to use a calculation method which assumes that the extension of the entire wafer coincides with the extension of each shot.

According to an analysis of the present inventors, it has been found out that the anisotropy of a wafer actually caused by heat is extremely small. The average extension of wafers, i.e., the average value of extensions in the x and y directions, reaches approximately 10 ppm. Anisotropy occupies a maximum of approximately 10–20% of the average value, i.e., approximately 2 ppm, according to the kind of process. Therefore, to correct the rotationally asymmetrical magnification of a wafer itself, it is necessary to control a value of up to approximately 5 ppm in view of error factors such as an optical system to be described later.

An anisotropic extension quantity of approximately 2 ppm which invites a rotationally asymmetrical component (magnification) of a wafer has heretofore been a negligible value, but has begun to surface as a new problem owing to an increase in image size and scaling of symmetrical linewidth.

A specific construction of optical means for correcting the anisotropy (extension) of a wafer in accordance with the fourth embodiment will be described below. The fourth embodiment is characterized in that optical means using a pair of optical elements is utilized to produce a rotationally symmetrical or asymmetrical anisotropic image-forming magnification in a projection optical system.

The projection exposure apparatus shown in FIG. 4, which is used in the fourth embodiment, corrects an image-forming magnification rotationally symmetrical or asymmetrical about the optical system of the projection exposure apparatus, by using the optical means T2. In the fourth embodiment in particular, the optical means T2 including a pair of optical elements each having a diffraction grating surface is inserted at a position near the side of the projection optical system 2 which is closest to the reticle 1 or at the equivalent position of such a position, and a rotationally asymmetrical magnification about the optical axis of the optical elements is corrected by varying and adjusting the positional relationship of the optical elements in a direction perpendicular to the optical axis of the optical elements.

In addition, in the fourth embodiment, two directions in which magnifications can independently be controlled are respectively made coincident with the x and y directions to be used for designing a semiconductor device pattern on CAD, thereby making it easy to execute control of the optical system, which control matches a variation in a rotationally asymmetrical magnification which occurs during manufacture of an actual semiconductor device.

Figure 11:
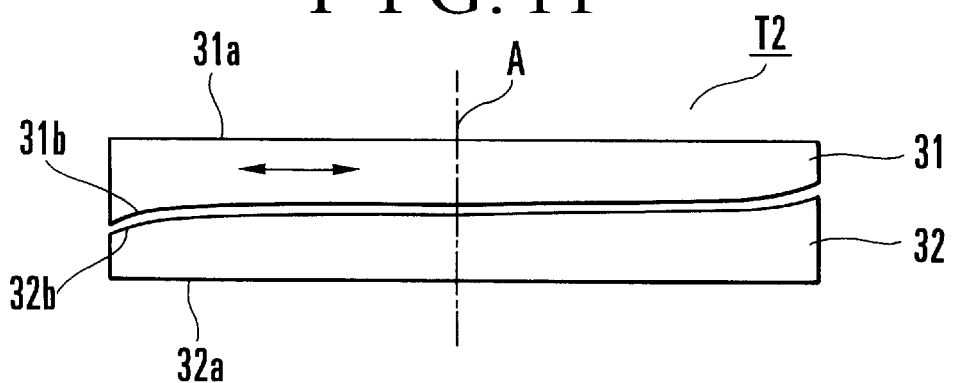
FIG. 11 is an enlarged explanatory view of a portion of the optical means shown in FIG. 9.

The construction of the optical means T2 used in the fourth embodiment shown in FIG. 10 will be described below. FIG. 11 is a cross-sectional view of the essential portion of the optical means T2 which is used in the fourth embodiment and has the function of supplying a magnification which is rotationally asymmetrical about the optical axis. Referring to FIG. 11, the optical elements 31 and 32 are disposed to face each other, and outside surfaces 31a and 32a are planar surfaces, while facing surfaces 31b and 32b are diffraction grating surfaces exhibiting equivalent aspheric surfaces of the same shape which coincide with each other when the surfaces 31b and 32b are superimposed on each other in the shown state.

In FIG. 11, the x- and y-axes are taken to cross at right angles to the optical axis A. Letting fa(x, y) represent the shape of the equivalent aspheric surface of the optical element 31 which is one of the diffraction grating surfaces which face each other, and letting fb(x, y) represent the shape of the equivalent aspheric surface of the optical element 32 which is the other diffraction grating surface, both equivalent aspheric shapes are given by the following formulae whose constant terms only differ from each other:

$$fa(x,y)=ax^3+bx^2+cx+d_1,$$

$$fb(x,y)=ax^3+bx^2+cx+d_2. \quad (1b)$$

The reason why no y terms are present in the formulae (1b) is that it is necessary to give the optical system an optical power (finite focal length) in only the x direction. The optical elements 31 and 32 are used in the way of shifting the relative position of the optical elements 31 and 32 with respect to the x direction. Since the optical power is produced by the lateral shifting of the optical elements 31 and 32 in the x direction, up to the third-order terms of x are used as the equivalent aspheric shapes.

During an initial state, the unevenness of the equivalent aspheric shape fa(x, y) and that of the equivalent aspheric shape fb(x, y) completely coincide with each other, so that the optical means T2 composed of the optical element 31 and the optical element 32 does not have an optical power and only acts as a plane parallel plate. It is more preferable to make smaller the distance (or gap) between the optical element 31 and the optical element 32 in the direction of the optical axis A, and its typical value is, for example, approximately 100 $\mu$m.

It is assumed here that the optical element 31 is moved in the x direction by a distance $\Delta$. The influence at this time is:

$$fa(x+\Delta,y)-fb(x,y)=3a\Delta x^2+2b\Delta x+c\Delta+(d_1-d_2)+3a\Delta^2+b\Delta^2+a\Delta^3, \quad (2b)$$

where a, b and c are constants, respectively.

If the influence of the higher-order terms of $\Delta$ is neglected because of its smallness and it is assumed that:

$$b=c=0, \quad (3b)$$

the formula (2b) is simplified as:

$$fa(x\Delta,y)-fb(x,y)=3a\Delta x^2+(d_1-d_2). \quad (4b)$$

The fact that the formula (4b) has the term of $x^2$ constitutes the basis of the fourth embodiment. Thus, the optical elements 31 and 32 serve as optical elements having an optical power in only the x direction owing to the lateral shift quantity $\Delta$, and the optical power can freely be varied by varying the lateral shift quantity $\Delta$.

Since the processing of obtaining a difference from lateral shifting is exactly differentiation, the terms of the third order are inserted as the respective shapes of the equivalent aspheric surfaces, whereby a component of the second order which gives an optical power is produced by the effect of differentiation. Thus, the operations of the optical elements 31 and 32 are realized.

In the fourth embodiment, although the formula (3b) is expressed as b=c=0 for the sake of simplicity, the term of 2b$\Delta$x in the formula (2b) corresponds to a shift quantity. Since $\Delta$ is a known quantity so that the optical power can be controlled, the shift quantity can be corrected. When alignment is performed, a shift becomes a specific problem. This problem is avoided by giving the wafer stage 6 an instruction to inversely correct a shift occurring when the relative position of the paired optical elements 31 and 32 is varied.

In addition, if an appropriate value is given to the term of the constant c, it is also effective to give the absolute values of deviations of the equivalent aspheric surfaces from plane. Actually, to reduce the values of the equivalent aspheric quantities, it is preferable that the constant b be made zero and the constant c be given a value whose sign is opposite to that of the constant a. For the above-described reason, the constant c may be set to c=0.

In general, the absolute value of the equivalent aspheric quantity required to correct a magnification having a small value of approximately 2 ppm is very small. An actually effective equivalent aspheric quantity is on the order of several Newton's rings, depending on a position at which the optical elements 31 and 32 are placed. As a representative example, if an equivalent aspheric quantity to be produced as a power component is 1 $\mu$m which corresponds to several Newton's rings and the diameter of a lens is 200 mm and the shift quantity $\Delta$ at this time is 5 mm, the following formula is obtained from the formula (4b):

$$3a\times 5\times 100\times 100=0.001,$$

whereby the following value is obtained:

$$a=6.7\times 10^{-9}.$$

Since the diameter is 200 mm, 100 represents the value of the radius of the lens. If b=c=0, the equivalent aspheric quantity becomes the following value from the formula (1b):

$$6.7\times 10^{-9}\times 100\times 100\times 100=6.7\times 10^{-3},$$

so that each of the optical elements 31 and 32 has an equivalent aspheric quantity of ±6.7 $\mu$m.

The term of the constant c may be added to reduce the actual amount of deviation of each of the equivalent aspheric quantities from the plane. Since the value of the constant c which gives a value of 6.7 $\mu$m at 100 mm is 6.7×10$^{-5}$, if the sign of the constant a and the sign of the constant c are made opposite to each other to obtain:

$$c=-6.7\times 10^{-5},$$

the deviation of each of the equivalent aspheric quantities from the plane can be reduced to ±2.6 $\mu$m.

Figure 12:
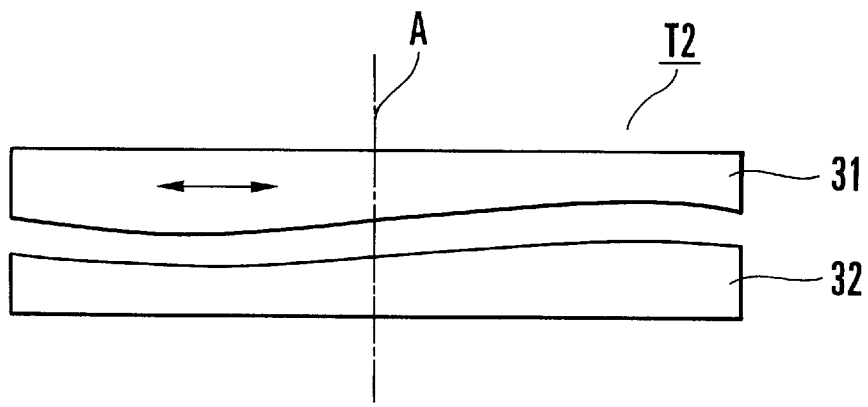
FIG. 12 is an enlarged explanatory view of a portion of the optical means shown in FIG. 9.

FIG. 11 shows the shapes of the respective equivalent aspheric surfaces for the constant c whose value is zero, and FIG. 12 shows the shapes of the respective equivalent aspheric surfaces for the constant c which is given the above value. Each of the equivalent aspheric surfaces has such a mild shape within the diameter of 200 mm and the optical elements 31 and 32 have shapes which are complementary to each other (complementary shapes), whereby the amount of occurrence of aberration due to a variation in the relative position of the optical elements 31 and 32 hardly influences other optical performance, and only a magnification can be corrected by a small amount.

Figure 13:
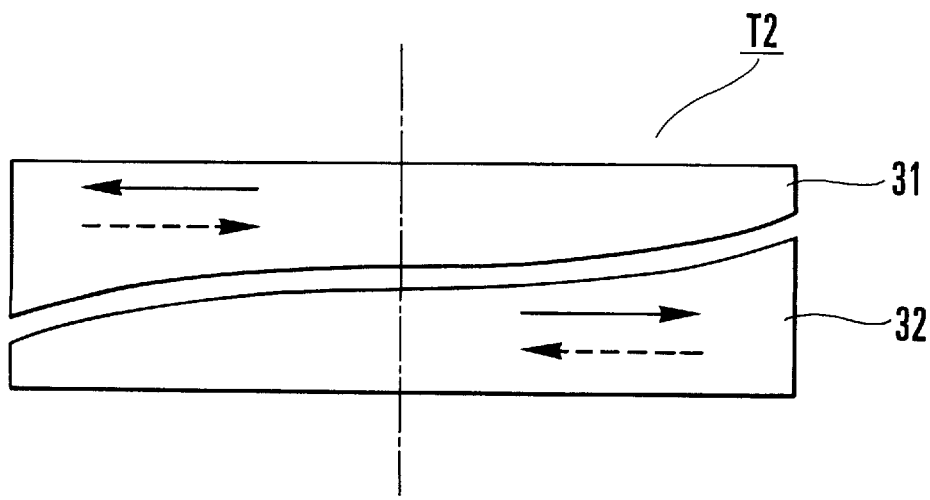
FIG. 13 is an explanatory view of another embodiment of the portion of the optical means shown in FIG. 9.

Although the construction of the fourth embodiment has been described as a system which shifts either one of two optical elements in the x direction, either one of the optical elements may be made to move by δ in the x direction, while the other may be made to move by −δ in the x direction. This construction is shown in FIG. 13. Specifically, $$fa(x+\delta,y)-fb(x=\delta,y)=2a(3\delta x^2+\delta^3)+4b\delta x+2c\delta+d_1-d_2.$$

If it is assumed similarly to the above description that:

$$b=c=0,$$

and if the influence of the higher-order terms of δ is neglected, $$fa(x+\delta,y)-fb(x-\delta,y)\cong 6ax^2\delta+d_1-d_2.$$

Therefore, if the shift quantity Δ is equal to δ, the amount of variation in optical power becomes twice as large. Otherwise, if the same amount of variation in optical power is to be obtained, the value of the coefficient (constant) a may be reduced to half. This reduces the equivalent aspheric quantities to half and provides the effect of facilitating evaluation of the shapes of the diffraction grating surfaces. In addition, the shift quantity can be reduced to half to obtain the same amount of variation in optical power. This is advantageous to the design of a space to be provided in a driving system as well as to positioning accuracy.

Actually, in the fourth embodiment, since the optical elements 31 and 32 shift in the ± directions and the relative shift quantity between the optical elements 31 and 32 becomes twice as large, the equivalent aspheric quantities are reduced to half.

Figure 14:
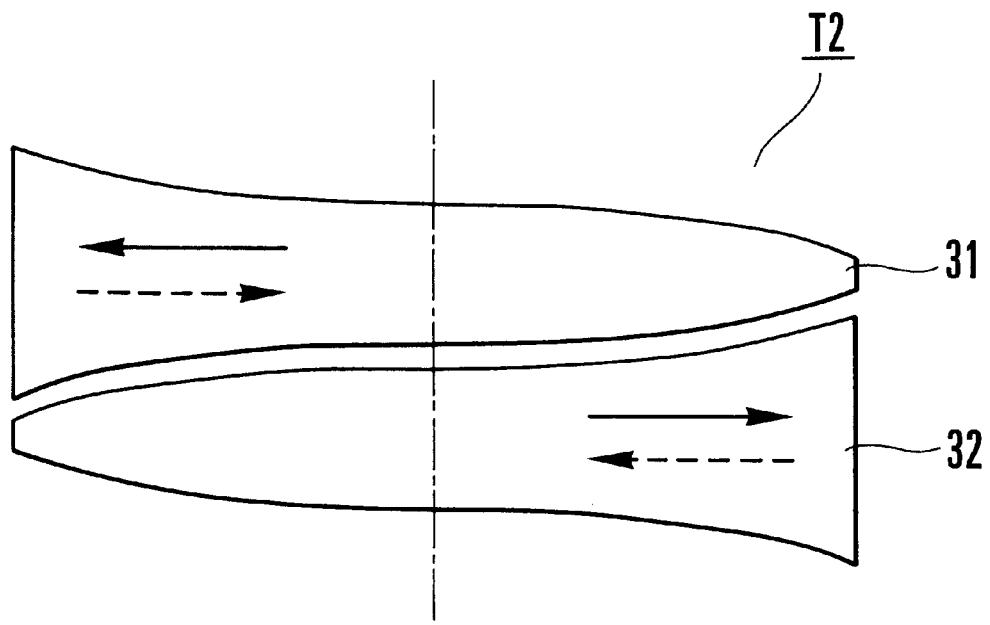
FIG. 14 is an explanatory view of another embodiment of the portion of the optical means shown in FIG. 9.

Although the construction of the fourth embodiment has been described as a system which uses one surface of each of the optical elements as a diffraction grating surface, diffraction grating surfaces may be provided on the opposite surfaces of each of the optical elements. This construction is shown in FIG. 14. If it is presumed that the thicknesses of the optical elements 31 and 32 are small, the above-described effects and advantages are simply added together in the construction shown in FIG. 14. Therefore, if all the diffraction grating surfaces are of the same shape, the value of the coefficient a can be reduced to half to obtain the same amount of variation in optical power as that in the above-described example shown in FIG. 13. As a matter of course, it is also possible to adopt a system which drives either one of the optical elements, or a system which drives both optical elements in directions opposite to each other.

Figure 15:
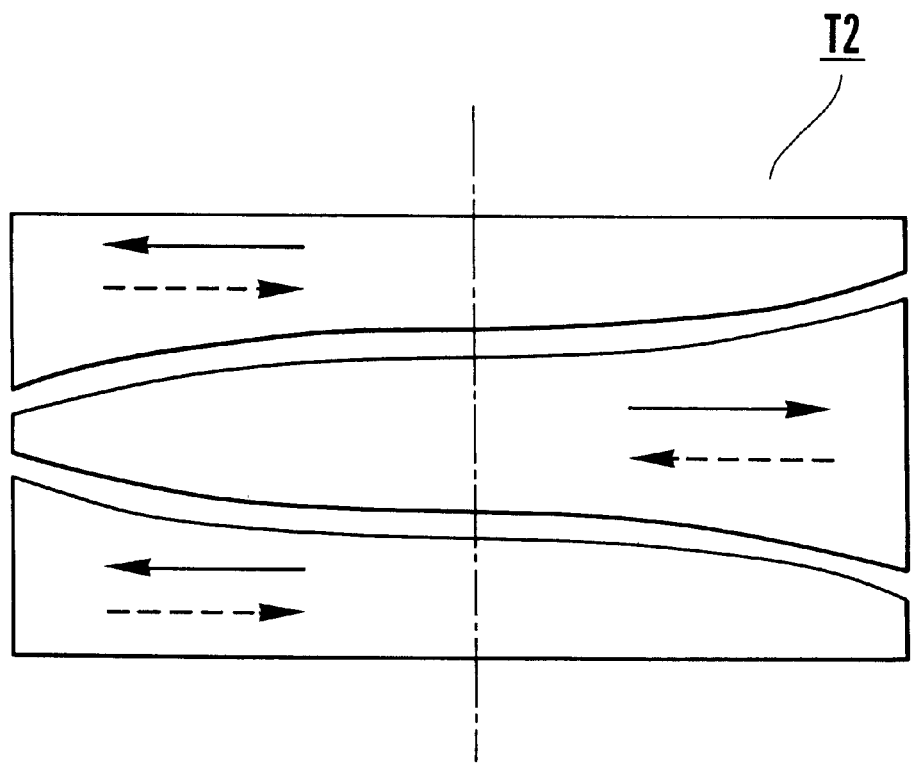
FIG. 15 is an explanatory view of another embodiment of the portion of the optical means shown in FIG. 9.

As a matter of course, similar effects can be obtained by using multiple pairs of optical elements. One example is shown in FIG. 15.

The difference in magnification between the x direction and the y direction can also be used for correction of errors due to a wafer manufacturing process as well as distortion matching between a plurality of projection exposure apparatus, distortion matching between a plurality of modes, or correction of errors in reticle fabrication. The amount of correction of the rotational asymmetry of magnification (anisotropy) in these cases is several ppm, and data parameters for such an amount of correction are set, as by manual input to the projection exposure apparatus, and the relative position of the optical elements 31 and 32 is adjusted by a driving mechanism (not shown) on the basis of the set parameters, whereby the setting of the projection exposure apparatus is effected. Of course, for the setting of the parameters, values based on automatic measurement may also be inputted directly to the projection exposure apparatus.

Since semiconductor device circuits are designed by CAD using x, y coordinates, it is desirable that the above-described x and y directions crossing at right angles to the optical axis be coincident with the x and y directions of CAD.

In general, since the x and y directions coincide with the directions of the edges of a reticle, the x and y directions of each of the optical elements 31 and 32 coincide with the longitudinal and lateral directions of the edges of a reticle. These x and y directions coincide with the x and y directions in which the wafer stage 6 moves, and can be made to correspond to x- and y-magnifications to be calculated when global alignment is to be performed.

An intrashot component for global alignment is corrected with a calculation method which assumes that the extension of a wafer coincides with the extension of a shot, as described above. This assumption is based on the fact that the extension of the entire wafer is constant within the wafer, i.e., good linearity is maintained, and it has been proved that the correction using such a calculation method provides a good correction result.

In practice, if extensions of s ppm and t ppm are observed in the respective x and y directions in global alignment, the extension of t ppm is corrected by a rotationally symmetrical magnification correction means which is known means originally incorporated in the projection optical system, and an extension of (s−t) ppm is corrected by driving the optical element 31 in the x direction in which rotationally asymmetrical magnification correction is enabled. Otherwise, the extension of s ppm is corrected by the rotationally symmetrical magnification correction means which is known means originally incorporated in the projection optical system, and an extension of (t−s) ppm is corrected by driving the optical element 31 in the x direction in which rotationally asymmetrical magnification correction is enabled.

In the fourth embodiment, the correction of a rotationally asymmetrical magnification (component) is controlled while varying the positions of the optical elements having diffraction grating surfaces. Accordingly, the fourth embodiment greatly contributes to a further improvement in the function of a projection exposure apparatus for manufacturing semiconductor devices which are required to have high functions.

In the fourth embodiment, since the desired optical performance is produced from the difference between the two optical elements having diffraction grating surfaces, which difference is obtained when the optical elements are shifted relative to each other, the original aspheric quantities, i.e., the equivalent aspheric quantities of the respective optical elements 31 and 32, become values which are nearly one figure larger than a desired final quantity (the amount of the difference). In the above-described example, an equivalent aspheric surface of 6.7 μm is required for each of the optical elements 31 and 32 to obtain an equivalent aspheric quantity having a value of 1 μm. A key point for application of the fourth embodiment is that the inclinations of the equivalent aspheric surfaces are optimized to reduce each of the equivalent aspheric surfaces to 2.6 μm so that the equivalent aspheric surfaces are accommodated into a highly accurate measurement range of an interferometer. During the production of a diffraction grating surface, it is important to check whether the diffraction grating surface is accurately worked into a desired shape, and if the equivalent aspheric quantity can be reduced to a quantity on the order of that adopted in the fourth embodiment, existing techniques will suffice.

An instruction to drive the optical elements having diffraction grating surfaces, which are used in the fourth embodiment, may be given manually or on the basis of an actually measured value of a wafer, as described above. In the case of manual input, correction is immediately performed; whereas in the case of global alignment, immediately before an exposure operation is started when measurement is completed and the amount of correction is calculated, a CPU which controls the entire projection exposure apparatus outputs an instruction to the driving mechanism and correction is performed.

Figure 16:
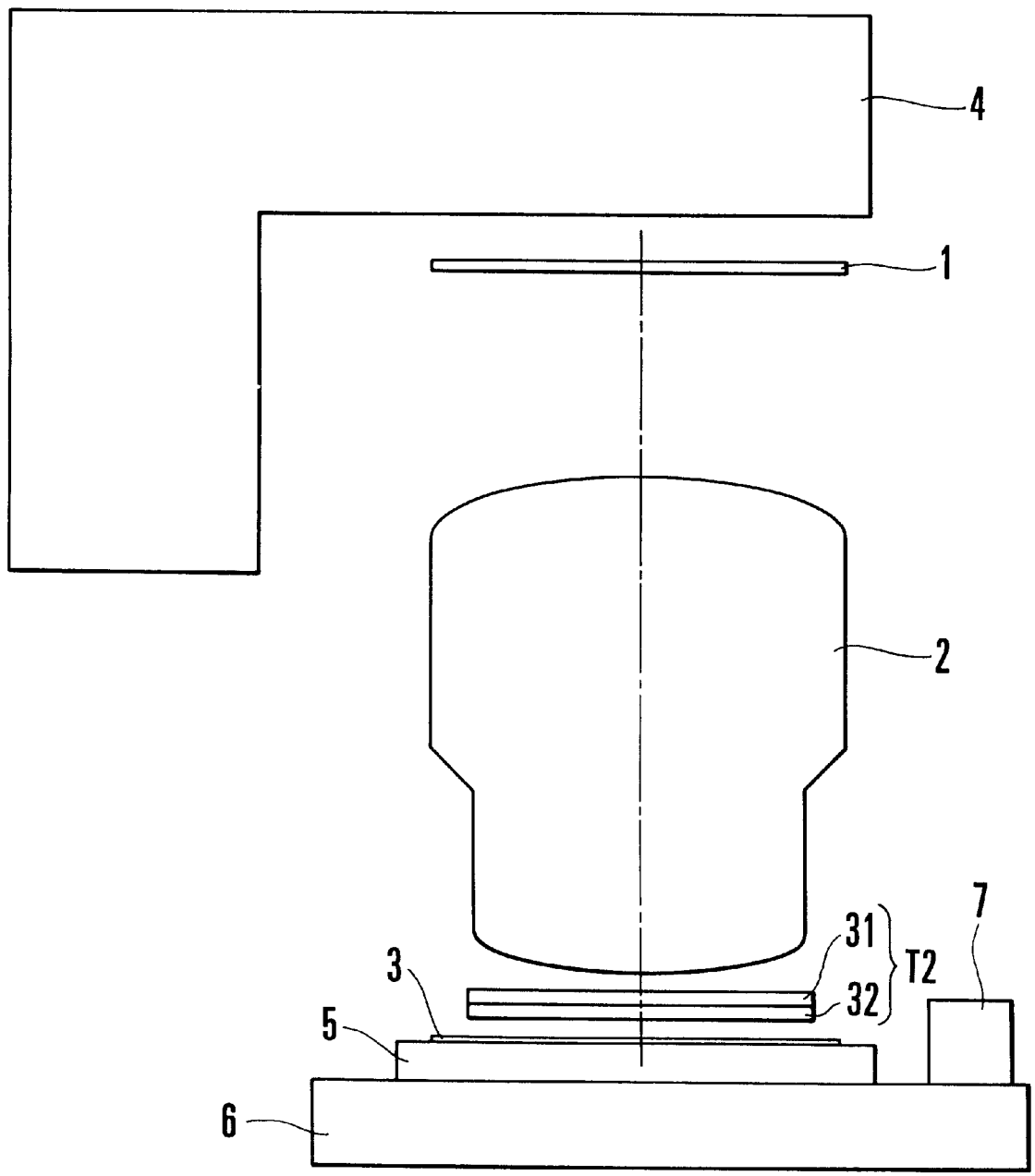
FIG. 16 is a schematic view of the essential portion of a fifth embodiment of the present invention.

FIG. 16 is a schematic view of the essential portion of a fifth embodiment of the present invention. In the fifth embodiment, the optical means T2 is disposed in the optical path between the projection optical system 2 and the wafer 3, and the fifth embodiment differs from the fourth embodiment shown in FIG. 10 in the position of insertion of the optical means T12 in the optical path. The other constituent elements of the fifth embodiment are identical in construction to those of the fourth embodiment.

In the fifth embodiment, the optical means including a pair of optical elements each having a diffraction grating surface is inserted at various positions in the manner shown in FIG. 16 by way of example, but since there is a case where the range of correction of magnification is limited by the position of insertion of the optical means, the position of insertion needs to be determined in view of the required range of correction of magnification.

In each of the above-described fourth and fifth embodiments, it is possible to adjust magnifications (components) rotationally asymmetrical about the optical axis of a projection system such as extensions due to semiconductor processes, distortion matching between projection exposure apparatus and reticle fabrication errors, whereby overlay accuracy in fabrication of semiconductor devices is improved to a remarkable extent. Since there is a prediction that positioning accuracy rather than resolution will become a limiting factor in fine patterning of 256Mb DRAMs or later, the effect of the fifth embodiment is very large because it is possible to correct a rotationally asymmetrical component which would have remained as an uncorrectable component in conventional arts.

The fifth embodiment has another great advantage that since the amount of occurrence of rotationally asymmetrical magnification is variable, the projection exposure apparatus can cope with various variations and is rich in versatility, and because of the small equivalent aspheric quantities, only magnification can be controlled with the influence of the optical means on the other performance being reduced to a negligible value.

Figure 17:
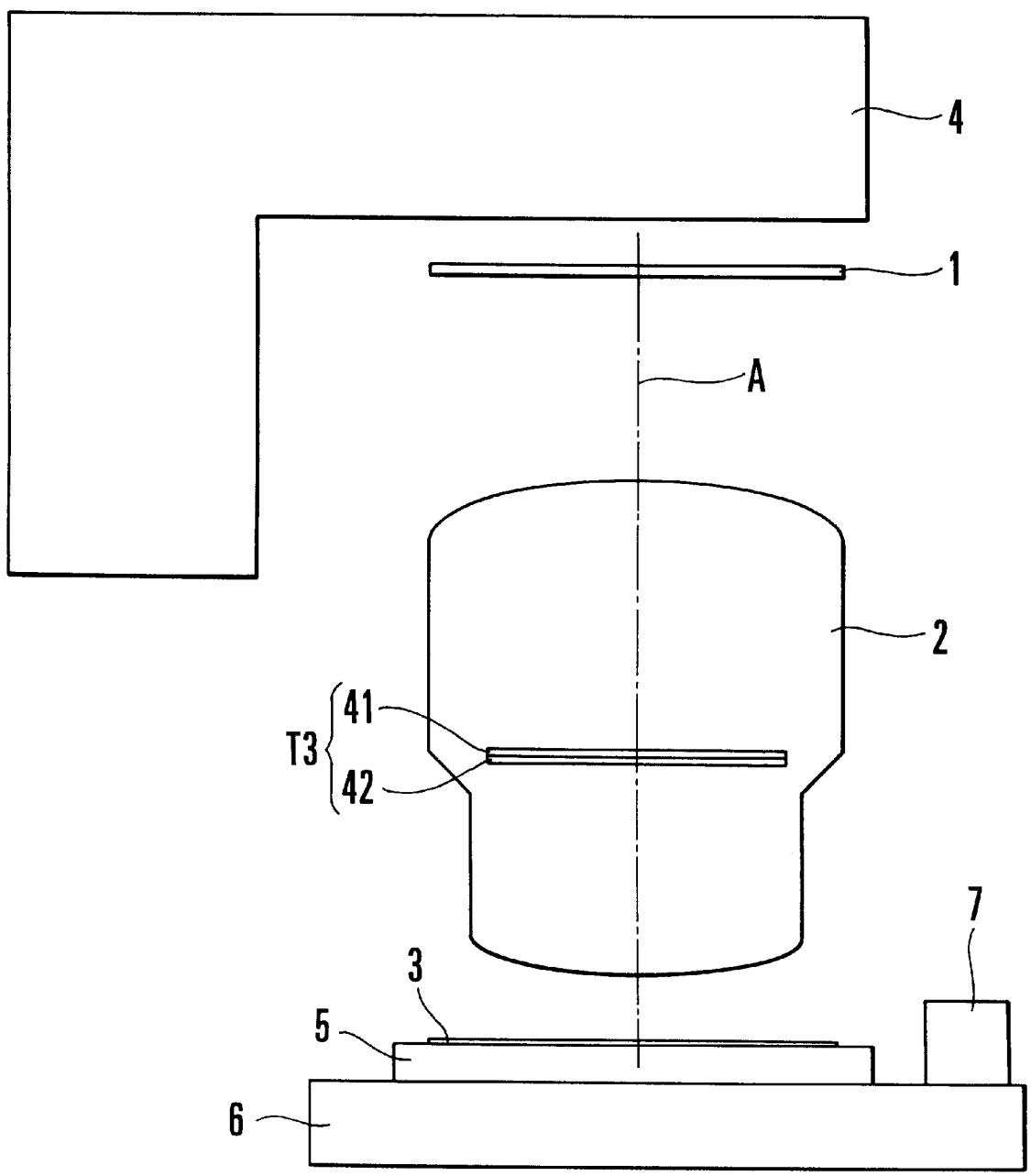
FIG. 17 is a schematic view of the essential portion of a sixth embodiment of the present invention.

FIG. 17 is a schematic view of the essential portion of a sixth embodiment of the projection exposure apparatus according to the present invention. FIG. 17 shows a case in which the sixth embodiment is applied to a projection exposure apparatus which is a normal stepper or a scan type of stepper.

Referring to FIG. 17, the exposure illumination system 4 is arranged to illuminate the reticle 1 which is a first object. The exposure illumination system 4 includes a light source selected from among an ArF excimer laser (with wavelength 193 nm), a KrF excimer laser (with wavelength 248 nm) and a lamp which emits g-line (with wavelength 436 nm) or i-line (with wavelength 365 nm), as well as a known optical system and the like.

The projection optical system 2 such as a refraction or catadioptric projection optical system is arranged to project the circuit pattern of the reticle 1 illuminated by the exposure illumination system 4 onto the wafer (target substrate) 3 which is a second object.

Optical means T3 having the function of controlling curvature of field, and has two optical elements 41 and 42 each having a diffraction grating surface, as will be described later. The optical means T3 is disposed near a pupil of the projection optical system 2. The wafer 3 is held on the wafer holder 5. The wafer holder 5 is mounted on the wafer stage 6 which makes x-y-z movements and θ movements as well as tilt movements and the like.

The interfering mirror 7 is provided for monitoring the position of the wafer stage 6 by means of an interferometer (not shown). A wafer state movement control system (not shown) positions the wafer 3 at a predetermined location by using a signal obtained from the interfering mirror 7 and the interferometer, and projection exposure is carried out with the wafer 3 positioned at the predetermined location.

If the sixth embodiment is a scan type of stepper (projection exposure apparatus), a reticle stage (not shown) on which the reticle 1 is mounted and the wafer stage 6 are made to move in a direction perpendicular to the optical axis of the projection optical system 2 at a speed ratio corresponding to an image-forming magnification of the projection optical system 2, thereby effecting a scanning exposure.

The sixth embodiment differs from normal steppers and scan types of steppers in that the optical means T3 is provided in the optical path, but the other constituent elements of the sixth embodiment are basically identical in construction to those of normal steppers and scan types of steppers.

In general, in a projection optical system using an ArF excimer laser (wavelength: 193 nm) as an exposure light source, because the wavelength of the light beam emitted from the ArF excimer laser lies in a short wavelength range, glass to be used for the projection optical system must be selected from limited kinds of glass materials and, at present, quartz ($SiO_2$) and fluorite ($CaF_2$) are only available.

However, in the short wavelength range, quartz has the transmittance problem of absorbing exposure light and suffering a thermal variation (a variation in optical characteristics) to vary the image-forming performance of the projection optical system. This situation is similar to that caused by a thermal change occurring when the i-line (with wavelength 365 nm) is used as an exposure light beam. In the case of the i-line, various glass materials are used for correcting chromatic aberration, but they include glass materials of low transmittance.

For this reason, the i-line also causes the problem of thermal aberration, and in the projection optical system using the ArF excimer laser, exposure patterns are becoming finer and finer and its depth of focus is becoming smaller and smaller, so that the situation is becoming far severer.

When a glass material of the projection system absorbs exposure light, aberrational variations occur, and all aberrations such as coma, astigmatism and curvature of field occur at this time. An aberration which is difficult to correct among these aberrations is curvature of field.

The amount of such curvature of field is actually slight, but as exposure patterns are becoming finer and the depth of focus is becoming smaller, the curvature of field is becoming a more noticeable problem.

The present inventors have found out that since the amount of curvature of field is on the order of 0.2–0.3 μm and the required amount of correction is small, a transmission type of diffraction optical element having a new function can be introduced to correct such curvature of field.

In a specific construction of the sixth embodiment, optical means which includes a pair of optical elements each having a diffraction grating surface is inserted in an optical path of the projection optical system and the positional relationship between the optical elements is varied with respect to a direction perpendicular to the optical axis, thereby correcting the curvature of field of the projection optical system.

The two inserted optical elements each having a diffraction grating surface are laterally shifted relative to each other, whereby the optical power of the optical means is varied so that the Petzval sum of the entire optical system is varied to control the curvature of field. In the sixth embodiment in particular, by taking notice that a variation in curvature of field due to absorption of exposure light is small, effective correction of curvature of field is accomplished by using optical elements having small equivalent aspheric quantities.

Because the absolute values of the equivalent aspheric quantities of the optical elements are small, the optical means of the sixth embodiment can correct only curvature of field without influencing other optical performance. Accordingly, the optical means can serve as means suited to an aberration correction function.

A specific construction of optical means for correcting curvature of field in accordance with the sixth embodiment will be described below. The sixth embodiment is characterized in that optical means including two optical elements is used so that the two optical elements integrally have a small optical power and are arranged to vary the optical power. The optical means having such variable optical power utilizes an optical power control element based on lateral shifting as disclosed in, for example, Japanese Patent Publication No. Sho 43-10034.

The projection exposure apparatus according to the sixth embodiment shown in FIG. 17 is arranged to correct the curvature of field of the projection optical system by using such optical means.

Figure 18:
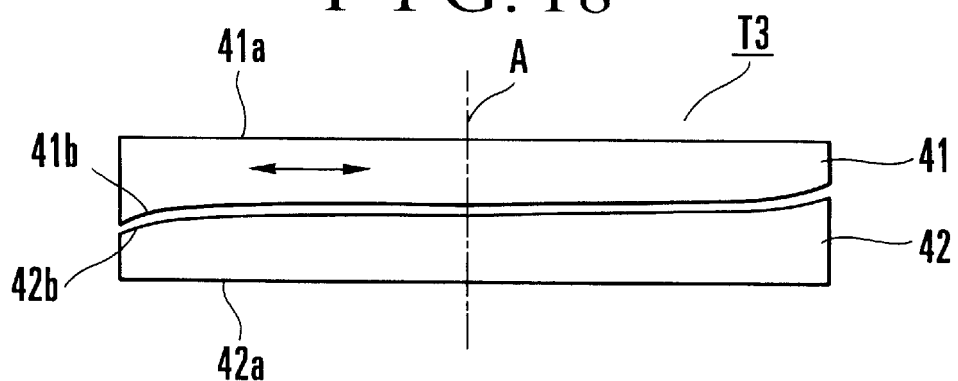
FIG. 18 is an enlarged explanatory view of a portion of the sixth embodiment shown in FIG. 17.

The construction of the optical means T3 shown in FIG. 17 will be described below. FIG. 18 is a cross-sectional view of the essential portion of the optical means T3 having the function of controlling curvature of field in the sixth embodiment.

Referring to FIG. 18, the optical elements 41 and 42 are disposed in such a manner that their diffraction grating surfaces face each other, and outside surfaces 41a and 42a are planar surfaces, while facing surfaces 41b and 42b are diffraction grating surfaces of the same shape. In FIG. 18, the x- and y-axes are taken to cross at right angles to the optical axis A. Letting fa(x, y) represent the shape of the equivalent aspheric surface of the optical element 41 which is one of the diffraction grating surfaces which face each other, and letting fb(x, y) represent the shape of the equivalent aspheric surface of the optical element 42, and letting the x direction be a direction in which to shift the optical elements 41 and 42, both equivalent aspheric shapes are given by the following formulae whose constant terms only differ from each other:

$$fa(x,y)=a(3xy^2+x^3)+b(2xy+x^2)+cx+d_1,$$

$$fa(x,y)=a(3xy^2+x^3)+b(2xy+x^2)+cx+d_2. \qquad (1c)$$

The reason why each of the equivalent aspheric surfaces is not symmetrical with respect to x and y in the formulae (1c) is that the two optical elements 41 and 42 are elements the relative position of which is to be shifted in the x direction. Since the optical power is produced by the lateral shifting of the optical elements 41 and 42 in the x direction, up to the third-order terms of x are used.

During an initial state, the unevenness of the equivalent aspheric shape fa(x, y) and the unevenness of the equivalent aspheric shape fb(x, y) coincide with each other, so that the optical element 41 and the optical element 42 do not have an optical power in total and only act as a plane parallel plate. It is more preferable to make smaller the distance between the optical element 41 and the optical element 42, and its typical value is, for example, approximately 100 μm. It is assumed here that the optical element 41 is moved in the x direction by a distance Δ. The influence at this time is:

$$fa(x+\Delta,y)-fb(x,y)=3a\Delta(x^2+y^2)+2b\Delta(x+y)+c\Delta+(d_1-d_2)+3a\Delta^2+b\Delta^2+a\Delta^3, \qquad (2c)$$

where a, b and c are constants, respectively.

If the influence of the higher-order terms of Δ is neglected because of their smallness and it is assumed that:

$$b=c=0 \qquad (3c)$$

for ease of understanding of the effects of the sixth embodiment, the formula (2c) can be simplified as:

$$fa(x+\Delta,y)-fb(x,y)=3a\Delta(x^2+y^2)+(d_1-d_2) \qquad (4c)$$

The fact that the formula (4c) has the term of $(x^2+y^2)$ constitutes the basis of the sixth embodiment. Thus, the optical elements 41 and 42 serve as optical elements having an optical power in only the x direction owing to the lateral shift quantity Δ, and the optical power can freely be varied according to the lateral shift quantity Δ.

Since the processing of obtaining a difference from lateral shifting is exactly differentiation, terms of the third order are inserted as the equivalent aspheric shapes, whereby a component of the second order which gives an optical power is produced by the effect of differentiation. Thus, the operations of the optical elements 41 and 42 are realized.

In the sixth embodiment, although the formula (3c) is expressed as b=c=0 for the sake of simplicity, the term of 2bΔ(x+y) in the formula (2c) corresponds to a shift quantity. Since Δ is a known quantity so that the optical power can be controlled, the shift quantity can be corrected. When alignment is performed, a shift becomes a specific problem. In the case of global alignment, this problem is avoided by giving the wafer stage 6 an instruction to inversely correct a shift occurring when the relative position of the paired optical elements 41 and 42 is adjusted.

In addition, giving an appropriate value to the term of the constant c has the effect of reducing the absolute values of deviations of the equivalent aspheric surfaces expressed by fa(x, y) and fb(x, y) from planes. Therefore, according to the value of the constant a, it is also effective to intentionally give arbitrary values to the constants b and c, instead of setting the constants b and c to zero. Actually, to reduce the values of equivalent aspheric quantities to a small value, the constant b is made zero and the constant c is given a value whose sign is opposite to that of the constant a.

However, since the absolute values of the equivalent aspheric quantities are a problem during measurement rather than processing and the influence of the constant c can be cancelled by inclining a measurement light beam, the constant c may also be c=0.

In general, the absolute value of the equivalent aspheric quantity required to correct a curvature of field having a small value of approximately 0.2–0.3 μm is very small. An actually effective equivalent aspheric quantity is on the order of several Newton's rings, depending on a position at which the optical elements 41 and 42 are placed. As a representative example, if an equivalent aspheric quantity to be produced as a power component is 1 μm which corresponds to several Newton's rings and the diameter of a lens is 200 mm and the shift quantity Δ at this time is 5 mm, the following formula is obtained from the formula (4a):

$$3a \times 5 \times 100 \times 100 = 0.001,$$

whereby the following value is obtained:

$$a = 6.7 \times 10^{-9}.$$

Since the diameter is 200 mm, 100 represents the value of the radius of the lens. If b=c=0, the equivalent aspheric quantity becomes the following value from the formula (1c):

$$6.7 \times 10^{-9} \times 100 \times \phi \times 100 = 6.7 \times 10^{-3},$$

so that each of the optical elements 41 and 42 has an equivalent aspheric quantity of ±6.7 μm.

The term of the constant c may be added to reduce the actual amount of deviation of each of the equivalent aspheric quantities from the plane. Since the value of the constant c which gives a value of 6.7 μm at 100 mm is $6.7 \times 10^{-5}$, if the sign of the constant a and the sign of the constant c are made opposite to each other to obtain:

$$c = -6.7 \times 10^{-5},$$

the deviation of each of the equivalent aspheric quantities from the plane can be reduced to ±2.6 μm at a cross section of y=0.

Figure 19:
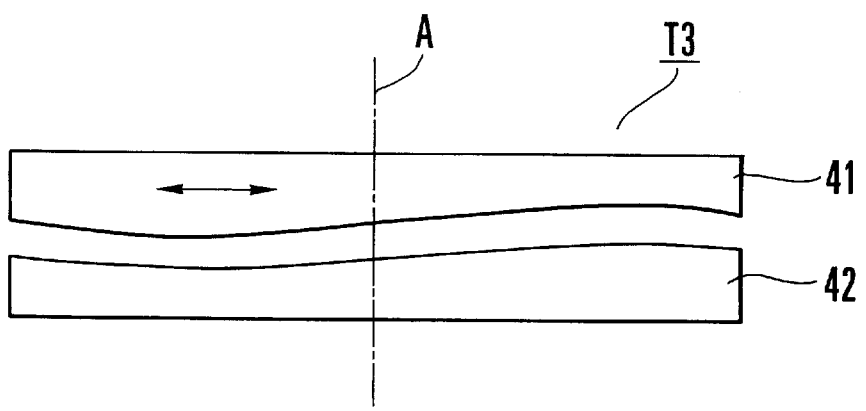
FIG. 19 is an enlarged explanatory view of a portion of the sixth embodiment shown in FIG. 17.

FIG. 18 shows the shapes of the respective equivalent aspheric surfaces for the constant c whose value is zero, and FIG. 19 shows the shapes of the respective equivalent aspheric surfaces at the cross section of y=0 for the constant c which is given the above value. Each of the equivalent aspheric surfaces has such a mild shape within the diameter of 200 mm and the optical elements 41 and 42 have complementary shapes which are complementary to each other, whereby the amount of occurrence of other aberrations due to a variation in the relative position of the optical elements 41 and 42 hardly influences other optical performance and only curvature of field can be corrected by a small amount. In some cases, it is necessary to apply a small amount of correction to the other optical performance in the projection exposure apparatus, but a variation in performance does not occur in the entire projection optical system.

In the above-described manner, the correction of a variation in curvature of field is controlled while varying the amount of the correction by using the diffraction grating surfaces, whereby the sixth embodiment greatly contributes to a further improvement in the function of a projection exposure apparatus for manufacturing semiconductor devices which are required to have high functions.

Another key point of the sixth embodiment is that since the amount of curvature of field to be corrected is small, diffraction grating surfaces to be used are made small up to a quantity easily measurable with an interferometer.

In the sixth embodiment, since the desired optical performance is produced from the difference between the two optical elements having diffraction grating surfaces, which difference is obtained when the optical elements are shifted relative to each other, the original aspheric quantities, i.e., the equivalent aspheric quantities of the respective optical elements 41 and 42, become values which are nearly one figure larger than a desired final quantity (the amount of the difference). In the above-described example, an equivalent aspheric surface of 6.7 μm is required for each of the optical elements 41 and 42 to obtain an equivalent aspheric quantity having a value of 1 μm. A key point for application of the sixth embodiment is that the inclinations of the equivalent aspheric surfaces are optimized to reduce each of the equivalent aspheric surfaces to ±2.6 μm so that the equivalent aspheric surfaces are accommodated into a highly accurate measurement range of an interferometer. During the production of a diffraction grating surface, it is important to check whether the diffraction grating surface is accurately worked into a desired shape, and if the equivalent aspheric quantity can be reduced to a quantity on the order of that adopted in the sixth embodiment, existing techniques will suffice.

A further great advantage of the sixth embodiment is that since the adjustment of optical power can be realized with optical elements having a refracting action, it is possible to provide means effective for both refraction and catadioptric projection optical systems used in the projection exposure apparatus for manufacturing semiconductor devices.

A driving mechanism (not shown) which adjusts the relative position between the optical elements 41 and 42 is instructed and driven in accordance with the settings of the characteristics of an exposure field (curvature) which are stored in advance in a CPU in the body of the projection exposure apparatus. The wafer stage 6 is controlled by calculating the amount of variation in curvature of field due to exposure and the amount of curvature of field due to exposure from the characteristics of an exposure field (curvature) stored in advance in the apparatus by experiment or simulation, by using the amount of exposure, the pattern ratio of a reticle, exposure energy and the like. It is also possible to adopt a method of controlling the amount of driving while calculating the characteristics of a projection optical system, instead of from such a priori characteristics. The amount of variation in curvature of field due to exposure and the amount of curvature of field due to exposure have deep correlations with a variation in focus due to exposure, and it is also possible to adopt a method of calculating the amount of driving while monitoring the amount of variation in focus or focus position due to exposure and calculating the amount of curvature of field.

Of course, it is also possible to adopt a method of directly measuring the amount of curvature of field and feeding back the measured value to the amount of driving of the optical elements 41 and/or 42.

Figure 20:
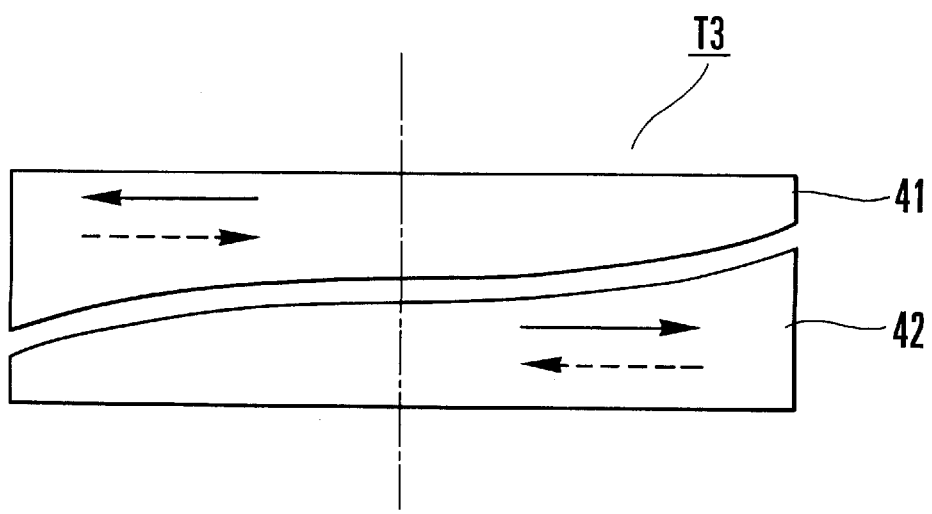
FIG. 20 is an enlarged explanatory view of another embodiment of a portion of the sixth embodiment shown in FIG. 17.

Although the construction of the sixth embodiment has been described as a system which shifts either one of two optical elements in the x direction, either one of the optical elements may be made to move by δ in the x direction, while the other may be made to move by −δ in the x direction. This construction is shown in FIG. 20.

Specifically, $$fa(x+\delta,y) - fb(x-\delta,y) = 2a[3\delta(x^2+y^2)+\delta^3]2b\delta(2y^2+1)+2c\delta+d_1-d_2.$$

If it is assumed similarly to the above description that:

$$b=c=0, |\delta| \approx 0,$$

then:

$$fa(x+\delta,y) - fb(x-\delta,y) \approx 6a\delta(x^2+y^2)+d_1-d_2.$$

Therefore, if Δ=δ, the amount of variation in optical power becomes twice as large. Otherwise, if the same amount of variation in optical power is to be obtained, the value of the coefficient (constant) a may be reduced to half. This reduces the equivalent aspheric quantities to half and provides the effect of facilitating evaluation of the shapes of the diffraction grating surfaces. In addition, the shift quantity can be reduced to half to obtain the same amount of variation in optical power. This is advantageous to the design of a space to be provided in a driving system as well as to positioning accuracy.

Figure 21:
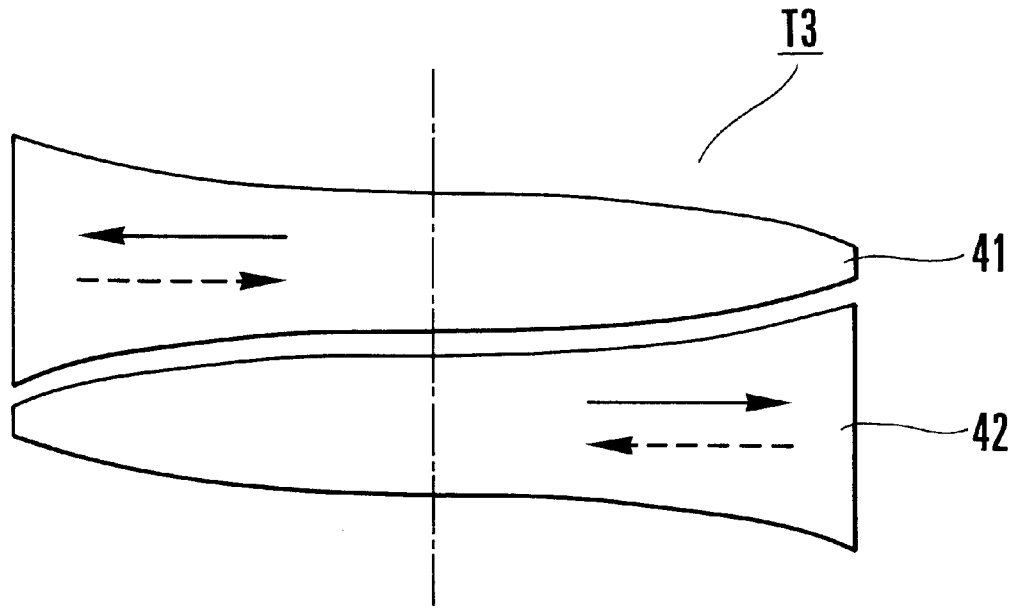
FIG. 21 is an enlarged explanatory view of another embodiment of the portion of the sixth embodiment shown in FIG. 17.

Although the construction of the sixth embodiment has been described as a system which uses one surface of each of the optical elements as a diffraction grating surface, diffraction grating surfaces may be provided on the opposite surfaces of each of the optical elements. This construction is shown in FIG. 21. If it is presumed that the thicknesses of the optical elements 41 and 42 are small, the above-described effects and advantages are simply added together in the construction shown in FIG. 21. Therefore, if all the diffraction grating surfaces are of the same shape, the value of the coefficient a can be reduced to half to obtain the same amount of variation in optical power as that in the above-described example shown in FIG. 18. As a matter of course, it is also possible to adopt a system which drives either one of the optical elements, or a system which drives both optical elements in directions opposite to each other.

Figure 22:
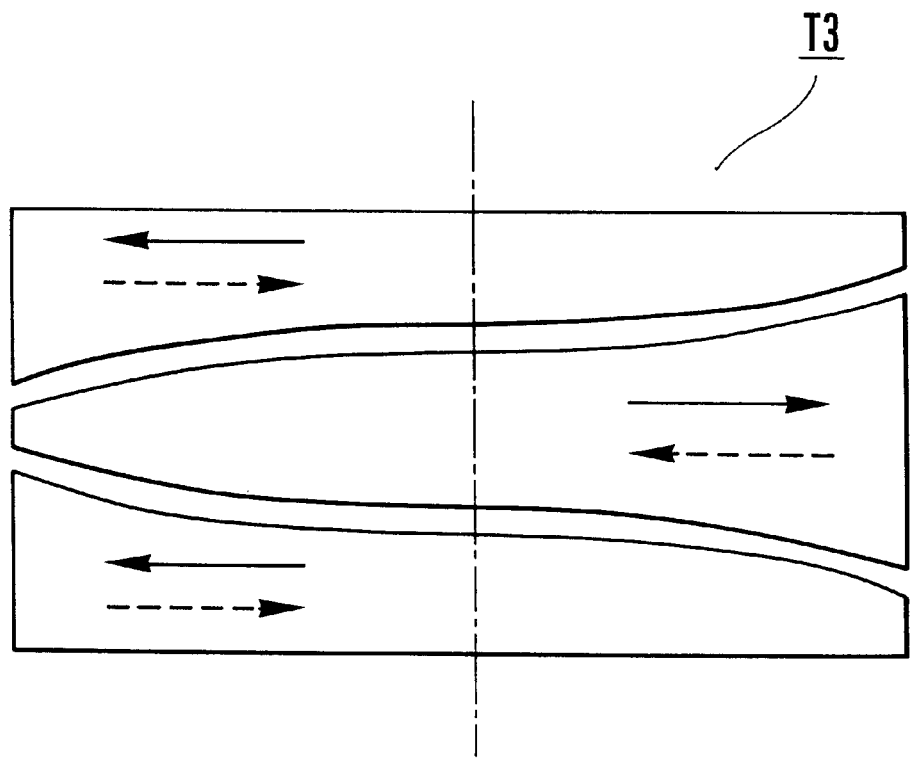
FIG. 22 is an enlarged explanatory view of another embodiment of the portion of the sixth embodiment shown in FIG. 17.

As a matter of course, similar effects can be obtained by using multiple pairs of optical elements. One example is shown in FIG. 22.

Figure 23:
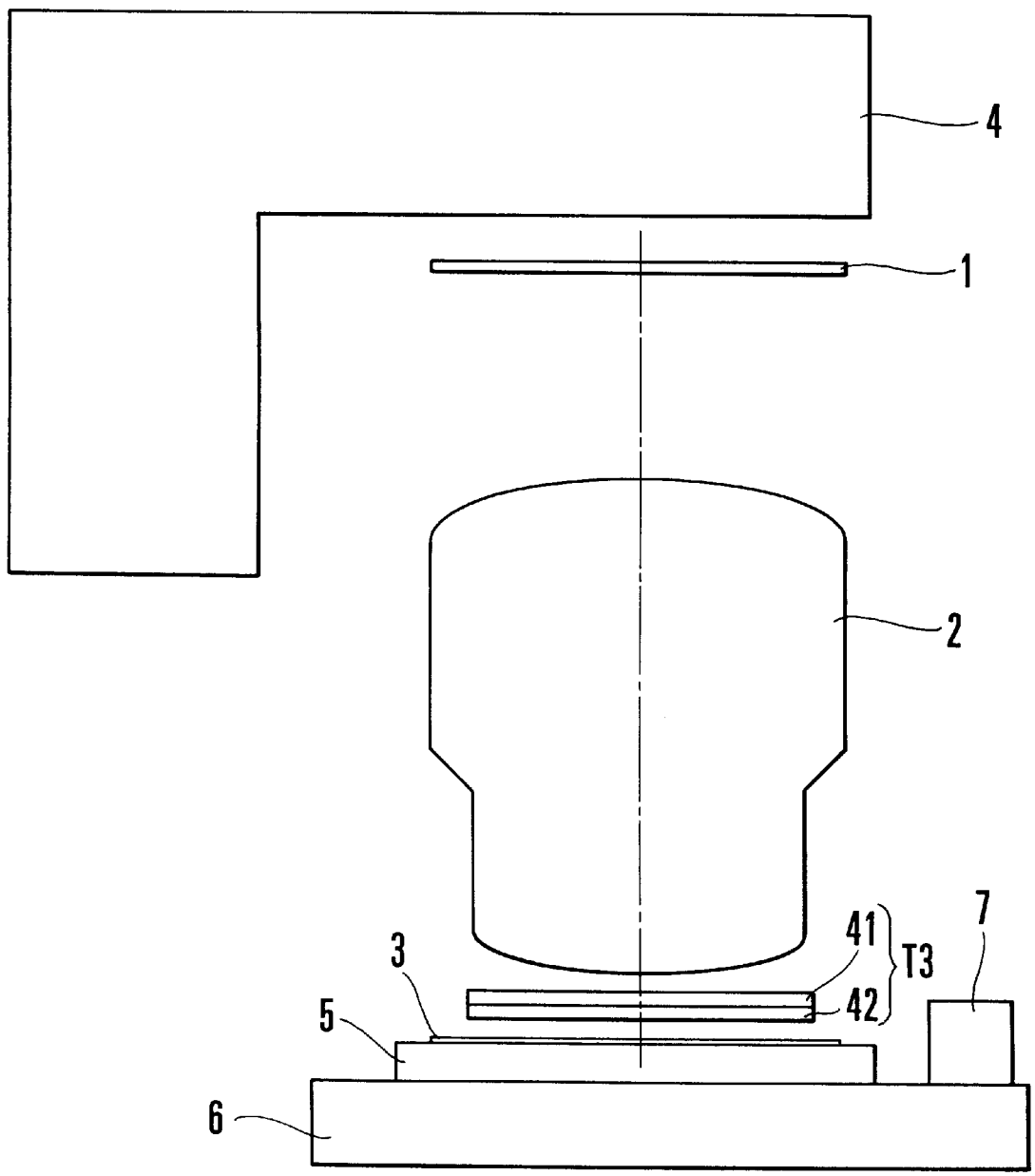
FIG. 23 is a schematic view of the essential portion of a seventh embodiment of the present invention.

FIG. 23 is a schematic view of the essential portion of a seventh embodiment of the present invention. In the seventh embodiment, the optical means T3 is disposed in the optical path between the projection optical system 2 and the wafer 3, and the seventh embodiment differs from the sixth embodiment shown in FIG. 17 in the position of insertion of the optical means T3 in the optical path. The other constituent elements of the seventh embodiment are identical in construction to those of the sixth embodiment.

In the seventh embodiment, the optical means T3 including a pair of optical elements each having a diffraction grating surface is inserted between the projection optical system 2 and the wafer 3 to correct curvature of field. The operation of the optical means T3 is as described above in connection with the sixth embodiment. The optical means T3 can be disposed at an appropriate insertion position other than the vicinity of a pupil plane of the projection optical system 2 as in the case of the seventh embodiment, according to the construction of the projection optical system.

It is preferable that the optical means T3 be disposed in the vicinity of the pupil plane of the projection optical system 2 or between the reticle 1 and the projection optical system 2 instead of between the projection optical system 2 and the wafer 3.

This is because these three positions are suitable positions where highly independent aberration control is achieved.

In the sixth and seventh embodiments, the set value of best focus varies by a small amount during correction of curvature of field, but the amount of variation in the set value can be calculated from the amount of driving of the diffraction optical elements and is obtained as a known quantity. Therefore, the problem of the variation in the set value is solved by calculating the amount of variation in the set value by means of a CPU incorporated in the projection exposure apparatus and reflecting the calculated amount of variation onto a control value for a wafer surface position relative to the direction of the optical axis of the projection optical system. Other optical performance, for example, the influence of the diffraction optical elements on magnification, can be corrected because the amount of variation in magnification can be calculated from the amount of driving of the diffraction grating surfaces and is obtained as a known value. Accordingly, the influence of the introduction of the optical means T3 according to the seventh embodiment on other optical performance can be reduced to a nearly negligible extent.

Another great advantage of each of the above-described sixth and seventh embodiments is that since the amount of occurrence of curvature of field is variable, the projection exposure apparatus can cope with various variations and is rich in versatility, and because of the small equivalent aspheric quantities, only curvature of field can be controlled with the influence of the optical means on other optical performance being reduced to a negligible value.

Incidentally, in the present invention, at least two optical means may be selected from among the optical means T1 having the function of controlling longitudinal astigmatism, the optical means T2 having the function of controlling rotationally asymmetrical magnification and the optical means T3 having the function of controlling curvature of field, and optical means which includes the selected optical means in an independent or integrated form (the optical means T13 of the third embodiment shown in FIGS. 9(A) and 9(B) is equivalent to the selected combination of the optical means T1 and the optical means T3) may be disposed in the optical path so that two or three of longitudinal astigmatism, rotationally asymmetrical magnification and curvature of field can be corrected.

Figure 24:
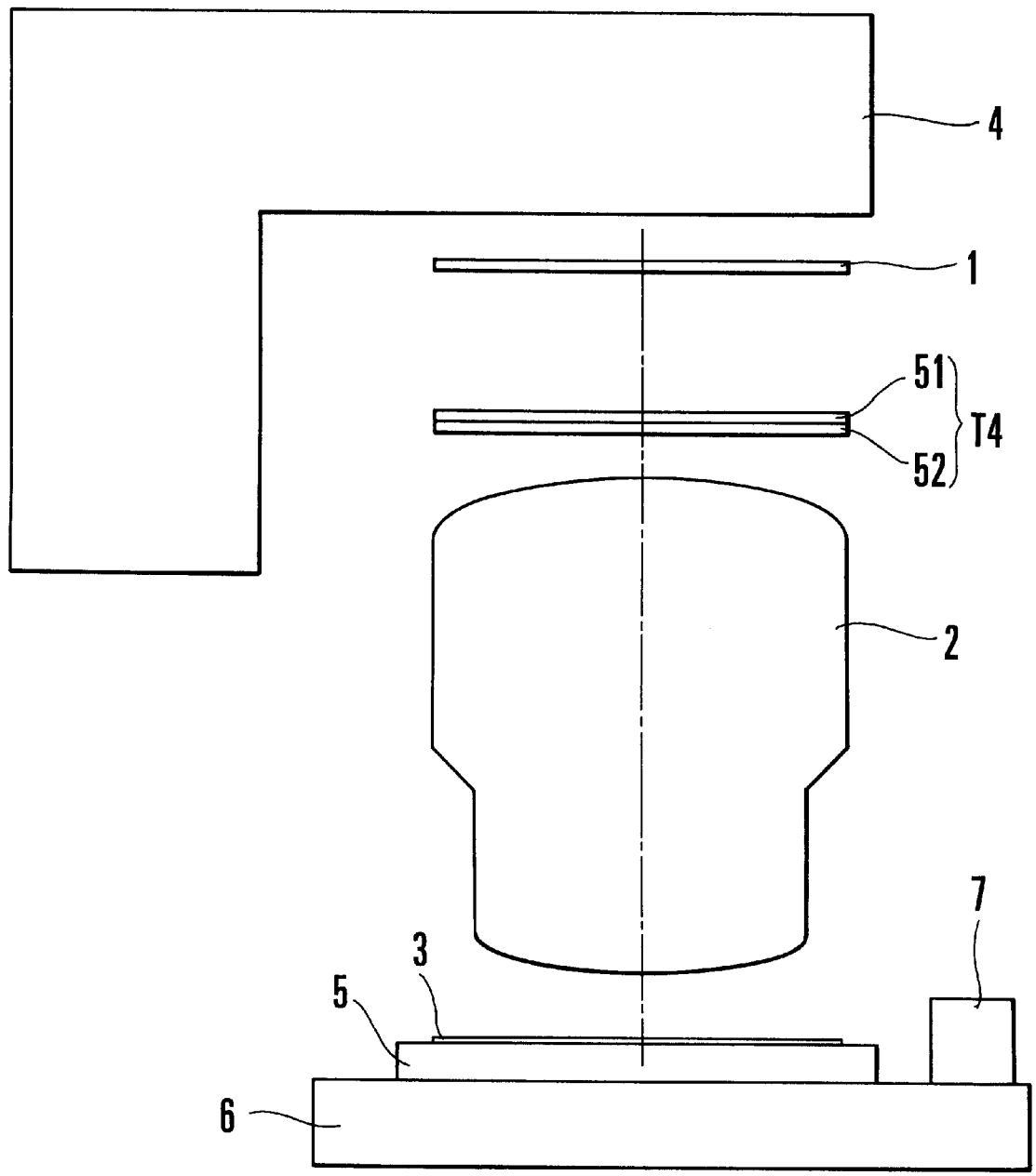
FIG. 24 is an enlarged explanatory view of a portion of an eighth embodiment of the present invention.

FIG. 24 shows an eighth embodiment of the present invention, and a pair of diffraction optical elements for correcting the third-order distortion is inserted between a projection optical system and a reticle in a projection exposure apparatus such as a normal stepper or a scan type of stepper which is a semiconductor manufacturing projection exposure apparatus. The third-order distortion is herein defined as a distortion component which has a magnification component and the third-order characteristic which is called barrel or pincushion distortion in handbooks of optics.

A known method is available as a method of controlling magnification and the third-order distortion. For example, there are a method of relatively moving a plurality of optical elements in a projection optical system along the optical axis thereof and a method of varying the pressure of the gas sealed between optical elements of a projection optical system. Magnification is a basic quantity of an optical system and can be varied without causing variations in other aberrations, but as to the third-order distortion, an optical system needs to be designed from the beginning in view of the correction of the third-order distortion because the correction of the third-order distortion offers problems such as variations in other aberrations and a narrow range of adjustment.

In particular, if various image-forming methods which are generically called image enhancement such as phase-shifting masks or off-axis illumination techniques are adopted, the matching of distortion between image-forming methods becomes a problem. The error of this matching is mainly produced from the working error of an optical system. In this case, correction of up to the third-order distortion is a basic requirement. The eighth embodiment is intended to provide an optical system which can freely correct and control the third-order distortion while minimizing limitations to be imposed on the design of the optical system, and can also minimize the influence of the optical means on the other performance.

The eighth embodiment relates to a scan type of stepper in particular, and is capable of correcting the third-order distortion of a projection optical system in a direction perpendicular to a scanning direction by shifting at least one of a pair of diffraction optical elements in a direction perpendicular to the optical axis of the projection optical system and adjusting the positional relationship between both diffraction optical elements, the pair of diffraction optical elements being inserted at a position, for example, near the side of the projection optical system which is closest to a reticle.

The eighth embodiment is characterized by correcting the third-order distortion which is a problem occurring in a scan type of exposure apparatus, by making the direction of lateral shifting coincident with the direction perpendicular to the scanning direction.

A projection optical system to which the eighth embodiment is to be applied may be of a refraction or catadioptric type, and the projection optical system is provided with means for controlling magnification.

If various new image-forming methods such as off-axis illumination and phase-shifting masks are used together, the matching of distortion between the individual image-forming methods becomes a problem.

In the scan type of exposure apparatus, since it is possible to readily correct the difference in magnification between the x and y directions by adjusting the speed ratio of the reticle to a wafer both of which are scanned in synchronism, the correction of a third-order distortion component by the two aspheric optical elements is performed in the direction perpendicular to the scanning direction.

In the eighth embodiment, owing to the insertion of simple optical elements, the third-order distortion which has only been able to be corrected within a limited correction range because of the limitations of design can freely be controlled to improve matching accuracy. Accordingly, as to a magnification component which is easy to correct optically, the eighth embodiment uses a known method such as a method of moving part of the optical elements in a projection optical system along the optical axis thereof or a method of controlling the pressure in a projection optical system, thereby correcting the third-order distortion component.

The construction of an optical system for producing and controlling the third-order distortion will be described below. In the eighth embodiment, optical means including a pair of optical elements is used to produce the third-order distortion in a projection optical system.

FIG. 24 shows the essential portion of a scan type of exposure apparatus. Reference numeral 1 denotes a reticle, reference numeral 2 denotes a projection optical system, reference numeral 3 denotes a wafer, reference numeral 4 denotes an illumination optical system, reference numeral 5 denotes a wafer holder, reference numeral 6 denotes a wafer stage, and reference numeral 7 denotes a mirror for a laser interferometer which is mounted for controlling the wafer stage 6. In the scan type of exposure apparatus, the reticle 1 and the wafer 3 are scanned in synchronism and the patterns on the reticle 1 are transferred to the wafer 3. Although the construction shown in FIG. 24 is identical to that of a normal scan type of stepper, the eighth embodiment differs in that optical means T4 which includes diffraction optical elements 51 and 52 for adjusting the third-order distortion is disposed.

Figure 25:
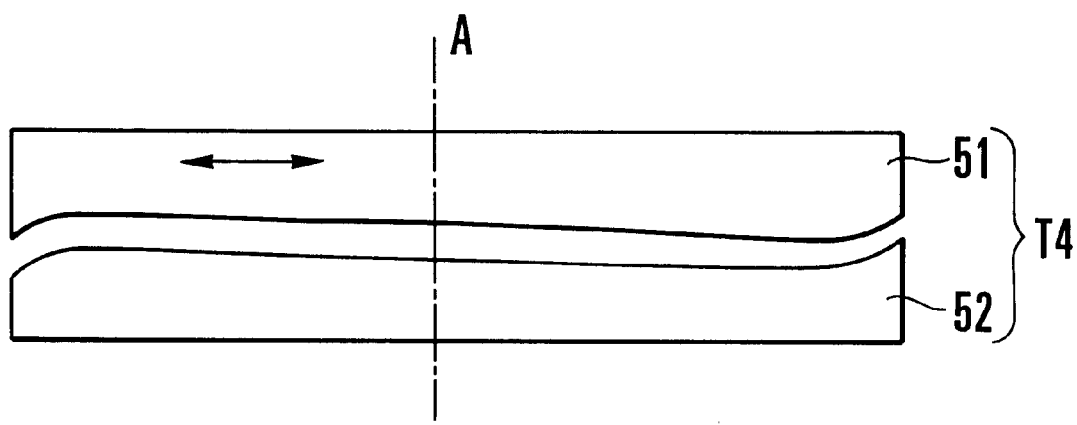
FIG. 25 is an enlarged explanatory view of a portion of the eighth embodiment shown in FIG. 24.

FIG. 25 shows the details of the optical means T4. Referring to FIG. 25, the diffraction optical elements 51 and 52 are disposed to face each other, and their outside surfaces are planar surfaces, while their facing surfaces are diffraction grating surfaces. In FIG. 25, the x- and y-axes are taken to cross at right angles to the optical axis A, and the y direction is coincident with the scanning direction of the projection exposure apparatus. Letting fa(x, y) represent the shape of the equivalent aspheric surface of the optical element 51 which is one of the diffraction grating surfaces which face each other, and letting fb(x, y) represent the shape of the equivalent aspheric surface of the optical element 52 which is the other diffraction grating surface, both equivalent aspheric shapes are given by the following formulae whose constant terms only differ from each other:

$$fa(x,y)=ax^5+b_1,$$

$$fa(x,y)=ax^5+b_2. \quad (1d)$$

The reason why no y terms are present in the formulae (1d) is that the optical means T4 including the two optical elements 51 and 52 needs to be given optical characteristics in only the x direction perpendicular to the scanning y direction with respect to the projection optical system. Since higher-order distortion is cancelled by averaging due to scanning as to the scanning y direction, the eighth embodiment needs only to control the third-order distortion in only the x direction. The optical elements 51 and 52 are used in the way of shifting the relative position therebetween with respect to the x direction. Since the third-order distortion is produced by the lateral shifting of the optical elements 51 and 52, the fifth-order terms of x are needed as the equivalent aspheric shapes.

During an initial state, the unevenness of the equivalent aspheric shape fa(x, y) and that of the equivalent aspheric shape fb(x, y) are cancelled by coinciding with each other, so that the optical elements 51 and 52 have no optical power in total and only act as a plane parallel plate. It is more preferable to make smaller the distance between the optical elements 51 and 52, and its typical value is, for example, approximately 100 μm. It is assumed here that the optical element 51 is moved in the x direction by a distance Δ. The influence at this time is:

$$fa(x+\Delta,y)-fb(x,y)=5a\Delta x^4+10b\Delta^2 x^3+10a\Delta^3 x^2+5a\Delta^4 x+(b_1-b_2), \quad (2d)$$

where a, b and c are constants, respectively.

If the influence of the higher-order terms of Δ is neglected because of their smallness, the formula (2d) can be simplified as:

$$fa(x+\Delta,y)-fb(x,y)=5a\Delta x^4+(b_1-b_2). \quad (3d)$$

The fact that the formula (3d) has the term of the fourth power of x constitutes the basis of the eighth embodiment. Thus, the optical elements 51 and 52 serve as optical elements having the fourth-order characteristic in only the x direction owing to the lateral shift quantity Δ, and the fourth-order characteristic can freely be controlled (varied) by varying the lateral shift quantity Δ.

Since the processing of obtaining a difference from lateral shifting is exactly differentiation, terms of the seventh order are inserted as the equivalent aspheric shapes, whereby a component of the fourth order is produced by the effect of differentiation. Thus, the operations of the optical elements 51 and 52 are realized.

In general, the absolute value of the equivalent aspheric quantity required to correct a small distortion value for matching purposes is very small. As a representative example, if the equivalent aspheric quantity required to produce a desired distortion is 1 μm and the diameter of a lens is 200 mm and the shift quantity Δ at this time is 5 mm, the following formula is obtained from the formula (3d):

$$5a \times 5 \times 10^{-8} = 0.001,$$

whereby the following value is obtained:

$$a=4.00 \times 10^{-13}.$$

Since the diameter is 200 mm, 100 represents the value of the radius of the lens. Therefore, the equivalent aspheric quantity becomes the following value from the formula (1d):

$$4.00 \times 10^{-13} \times 10^{-10} = 4.00 \times 10^{-3},$$

so that each of the optical elements 51 and 52 has an equivalent aspheric quantity of ±4.00 μm. The term of cx which is the first-order term of x may be added to reduce the actual amount of deviation of each of the equivalent aspheric quantities from the plane. Since the value of the constant c which gives a value of 4.00 μm at 100 mm is 4.00×10⁻⁵, if the sign of the constant a and the sign of the constant c are made opposite to each other to obtain:

$$c = -2.86 \times 10^{-5},$$

the deviation of each of the equivalent aspheric quantities from the plane can be reduced to ±2.14 μm. Each of the equivalent aspheric surfaces has such a mild shape within the diameter of 200 mm and the equivalent aspheric surfaces of the optical elements 51 and 52 have complementary shapes which are complementary to each other, whereby the amount of occurrence of aberration due to a variation in the relative position of the optical elements 51 and 52 hardly influences the other optical characteristics of the projection optical system and only the third-order distortion can be corrected.

The eighth embodiment is characterized in that the correcting direction of the third-order distortion is made coincident with the direction perpendicular to the scanning direction of the projection exposure apparatus, and since the amount of correction is small and the absolute value of a shift quantity can appropriately be selected, diffraction grating surfaces to be used are made small up to a quantity easily measurable with an interferometer.

In the eighth embodiment, since the desired optical characteristics are produced from a difference which occurs between the two diffraction grating surfaces when they are shifted relative to each other, the original aspheric quantities, i.e., the equivalent aspheric quantities of the respective optical elements 51 and 52, become values which are larger than a desired final quantity. In the above-described example, an equivalent aspheric surface of 4.00 μm is required for each of the optical elements 51 and 52 to obtain an equivalent aspheric quantity of 1 μm.

The inclinations of the equivalent aspheric surfaces are optimized to reduce each of the equivalent aspheric surfaces to 2.14 μm so that the equivalent aspheric surfaces are accommodated into a highly accurate measurement range of an interferometer. During the production of a diffraction grating surface, it is important to check whether the diffraction grating surface is accurately worked into a desired shape, and if the equivalent aspheric quantity can be reduced to a quantity on the order of that adopted in the eighth embodiment, existing techniques will suffice. If this value is to be made far smaller, the shift quantity which is set to 5 mm in the eighth embodiment may be made far larger.

An instruction to drive at least either one of the optical elements each having the diffraction grating surface may be changed in accordance with a procedure stored in the projection exposure apparatus in advance, or may be carried out on the basis of an actually measured value of a wafer. For example, if the third-order distortion varies according to a difference in illumination mode or NA, the amount of variation in the third-order distortion is stored in advance, and when an illumination mode or an NA is changed, the lateral shifting of the above-described diffraction optical elements may be performed. During this time, a magnification component is also corrected by known correction means at the same time.

Instead of setting the projection exposure apparatus in the above-described manner in advance, a reticle whose distortion can be measured may be used to analyze a distortion component in a field to correct a magnification component and a third-order distortion component on the basis of the value of the analysis. In this case, measurement may automatically be performed on the projection exposure apparatus, or off-line measurement may be performed after the image of a reticle is printed on a wafer.

Figure 26:
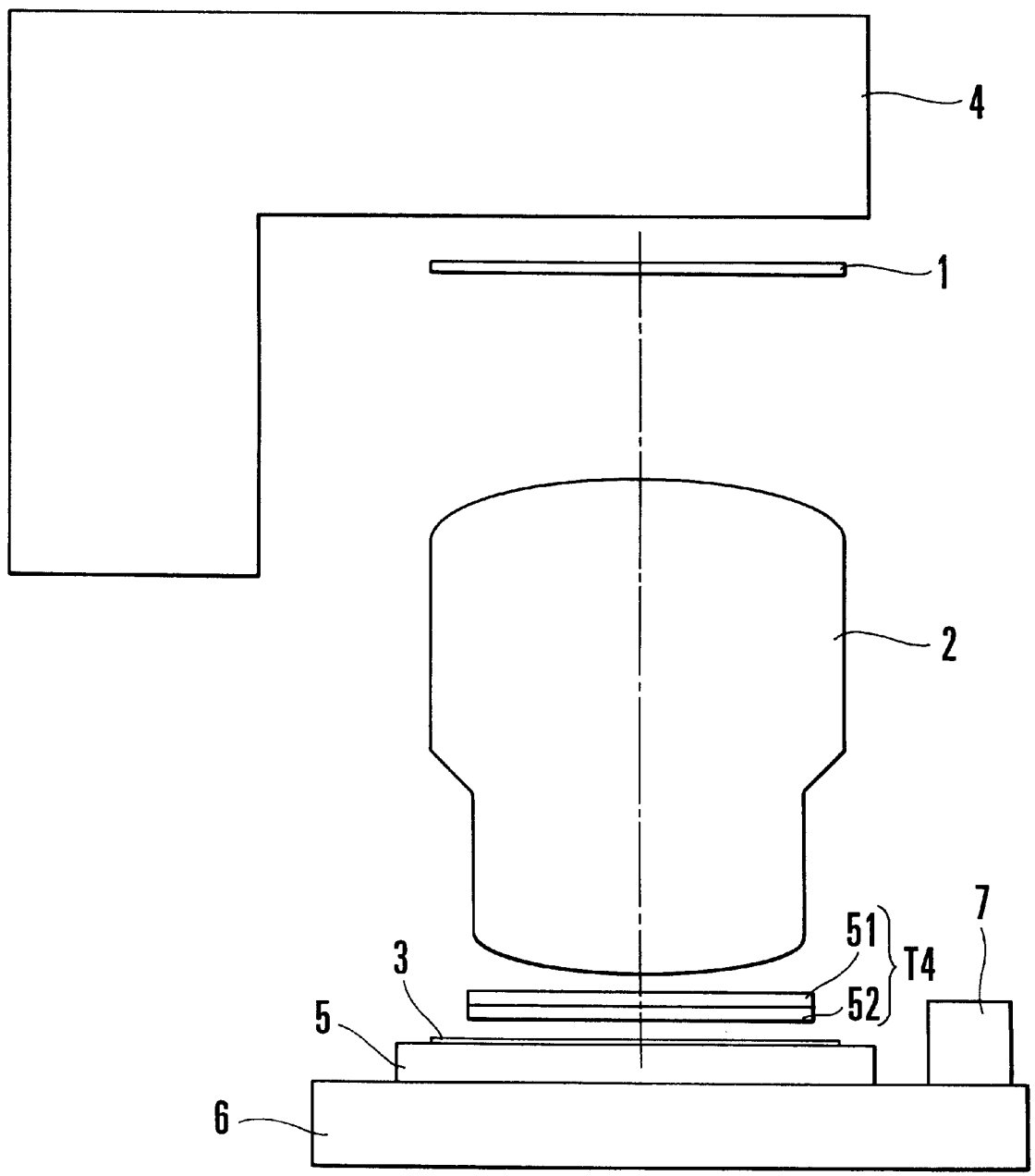
FIG. 26 is a schematic view of the essential portion of a ninth embodiment of the present invention.

FIG. 26 shows a ninth embodiment of the semiconductor exposure apparatus according to the present invention. The ninth embodiment differs from the eighth embodiment in that the two optical elements 51 and 52 which constitute the optical means T4 for controlling the third-order distortion are disposed between the wafer 3 and the projection optical system 2. The other constituent elements of the ninth embodiment are substantially identical in operation to those of the above-described eighth embodiment.

Although, in the description of each of the eighth and ninth embodiments, reference has been made to a case in which only one of two diffraction optical elements which are opposed to each other is made to move to obtain a desired characteristic, the relative movement of both diffraction optical elements is not limited to such a case, and both diffraction optical elements may be made to move symmetrically with respect to the optical axis, for example, in such a way that the top optical element 51 is made to move to the right by Δ and the bottom optical element 52 is made to move to the left by Δ.

In the above description, the correction of the third-order distortion is performed in the direction perpendicular to the scanning direction, and if the width of a scanning slit is large or the projection exposure apparatus is to be applied to a stepper, the respective equivalent aspheric shapes are made:

$$ga(x, y) = a(x^5 + 5x^4y) + b_1$$

$$ga(x, y) = a(x^5 + 5x^4y) + b_2 \quad (4d)$$

During an initial state, the unevenness of the equivalent aspheric surface ga(x, y) and that of the equivalent aspheric surface gb(x, y) are cancelled by coinciding with each other, so that the optical elements 51 and 52 have no optical power in total and only act as a plane parallel plate. It is more preferable to make smaller the distance between the optical elements 51 and 52, and its typical value is, for example, approximately 100 μm. It is assumed here that the optical element 51 is moved in the x direction by the distance Δ. If the influence of the higher-order terms of Δ is neglected because of their smallness, the influence at this time is:

$$ga(x+\Delta, y) - gb(x, y) = 5a\Delta(x^4 + x^4) + (b_1 + b_2) \quad (5d)$$

The fact that the formula (5d) has the term of $x^4 + y^4$ constitutes the basis of this modification of each of the eighth and ninth embodiments. Thus, the optical means T4 including the optical elements 51 and 52 serves as optical means rotationally symmetrically having the fourth-order characteristic owing to the lateral shift quantity Δ, and the fourth-order characteristic can freely be controlled by varying the lateral shift quantity Δ.

Since the processing of obtaining a difference from lateral shifting is exactly differentiation, terms of the seventh order are inserted as the equivalent aspheric shapes, whereby a component of the fourth order is produced by the effect of differentiation. Thus, the operations of the optical elements 51 and 52 are realized, whereby the third-order distortion can freely be controlled. Incidentally, as in the case of the above-described embodiments, the insertion position of the optical elements 51 and 52 may be another position such as a position between the projection optical system 2 and the reticle 1 or a position between the projection optical system 2 and the wafer 3. As occasion demands, the optical elements 51 and 52 may also be incorporated in the projection optical system 2.

As described above in connection with the eighth and ninth embodiments, instead of moving either one of the optical elements 51 and 52, the optical elements 51 and 52 may be arranged to move symmetrically (in opposite directions) with respect to the optical axis as described previously in connection with the aforesaid embodiments.

Figure 27:
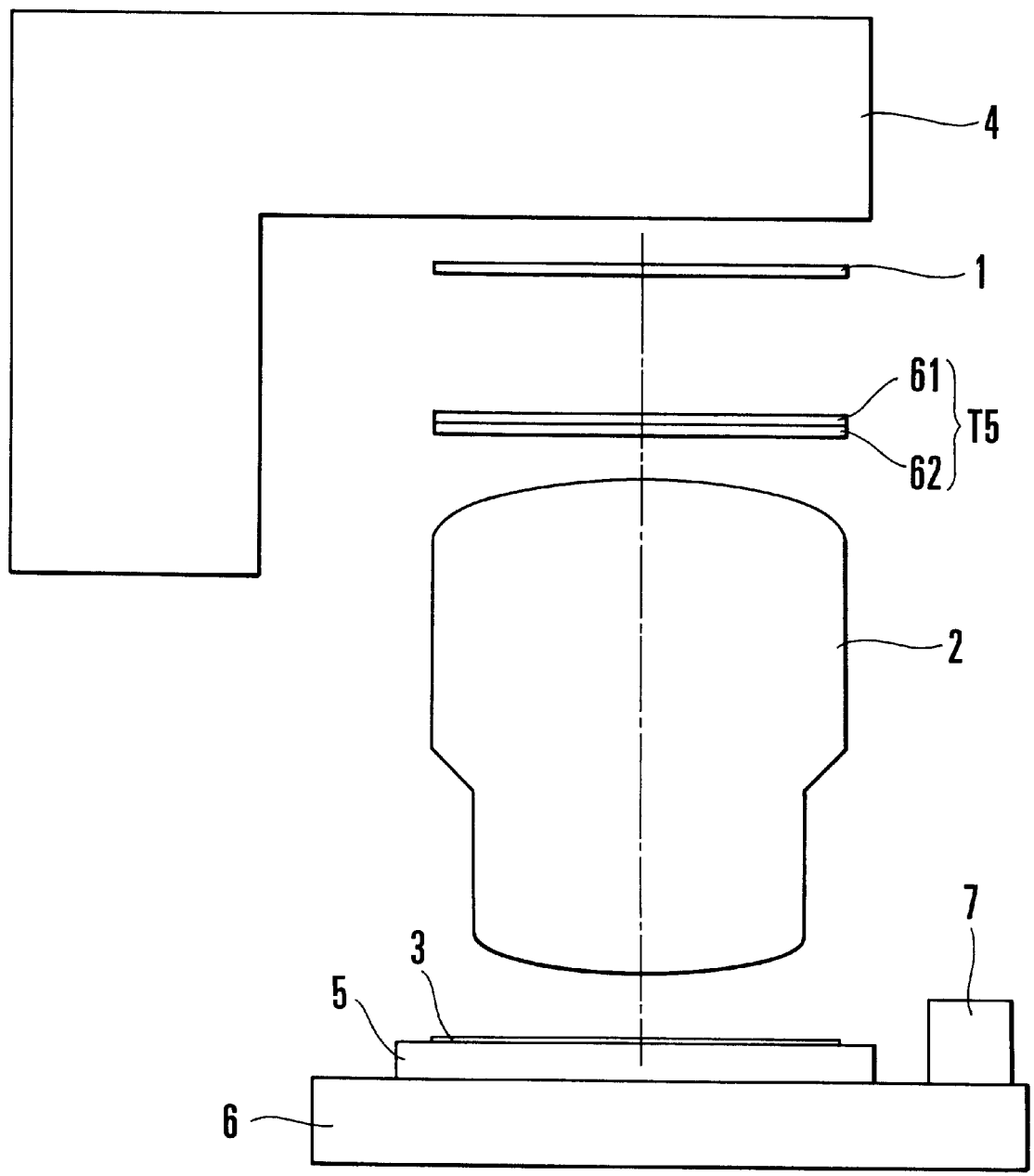
FIG. 27 is a schematic view of the essential portion of a tenth embodiment of the present invention.

FIG. 27 is a schematic view of the essential portion of a tenth embodiment of the projection exposure apparatus according to the present invention. FIG. 27 shows a case in which the tenth embodiment is applied to a projection exposure apparatus which is a normal stepper or a scan type of stepper.

Referring to FIG. 27, the exposure illumination system 4 is arranged to illuminate the reticle 1 which is a first object. The exposure illumination system 4 includes a light source selected from among an ArF excimer laser (with wavelength 193 nm), a KrF excimer laser (with wavelength 248 nm) and a lamp which emits g-line (with wavelength 436 nm) or i-line (with wavelength 365 nm), as well as a known optical system and the like.

The projection optical system 2 such as a refraction or catadioptric projection optical system is arranged to project the circuit pattern of the reticle 1 illuminated by the exposure illumination system 4 onto the wafer (target substrate) 3 which is a second object.

Optical means T5 has the function of controlling high-order distortion, and has two optical elements 61 and 62 each having a diffraction grating surface, as will be described later. The optical means T5 is capable of correcting higher-order distortion, for example, in a direction perpendicular to a scanning direction, by shifting at least one of the optical elements 51 and 52 in a direction perpendicular to the optical axis of the projection optical system. The optical means T5 is disposed in the optical path between the reticle 1 and the projection optical system 2. The wafer 3 is held on the wafer holder 5. The wafer holder 5 is mounted on the wafer stage 6 which makes x-y-z movements and θ movements as well as tilt movements and the like.

The interfering mirror 7 is provided for monitoring the position of the wafer stage 6 by means of an interferometer (not shown). A wafer state movement control system (not shown) normally positions the wafer 3 at a predetermined location by using a signal obtained from the interfering mirror 7 and the interferometer, and projection exposure is carried out with the wafer 3 positioned at the predetermined location.

If the tenth embodiment is a scan type of projection exposure apparatus, a reticle stage (not shown) on which the reticle 1 is mounted and the wafer stage 6 are made to move in a direction perpendicular to the optical axis of the projection optical system 2 at a speed ratio corresponding to an image-forming magnification of the projection optical system 2, thereby effecting a scanning exposure.

The tenth embodiment differs from normal steppers and scan types of steppers in that the optical means T5 is provided in the optical path, but the other constituent elements of the tenth embodiment are basically identical in construction to those of normal steppers and scan types of steppers.

In the tenth embodiment shown in FIG. 27, the optical means T5 including the diffraction optical elements 61 and 62 each having a diffraction grating surface for correcting higher-order distortion is inserted between the projection optical system 2 and the reticle 1.

The higher-order distortion is herein defined as a distortion component of order higher than the fourth order, which excludes components having magnification components and up to the third-order characteristic with respect to the value of an image height which is called barrel or pincushion distortion in handbooks of optics.

A projection optical system to which the tenth embodiment is to be applied may be of a refraction or catadioptric type, and the projection optical system is in advance provided with the function of controlling magnification and the third-order distortion. A known method is available as a method of controlling magnification and the third-order distortion. For example, there are a method of relatively moving optical elements (such as lenses) in a projection optical system along the optical axis thereof and a method of controlling the pressure in a space portion of a projection optical system. Any of these methods can be applied to the tenth embodiment. However, all the methods are intended to control magnification and lower-order distortion of up to the third order, and are incapable of controlling higher-order distortion.

However, as described previously, if various image-forming methods such as phase-shifting masks or off-axis illumination techniques are adopted, the matching of distortion between image-forming methods becomes a problem. The error of this matching is mainly produced from the working error of an optical system or the like.

According to the matching error analysis conducted by the present inventors, it has been found out that if magnification and the third-order distortion are corrected, the main components of error are a higher-order distortion component and the difference in magnification between the x direction and the y direction which are perpendicular to each other. In a scan type of exposure apparatus, the difference in magnification between the two directions can readily be corrected by adjusting a speed ratio during synchronous scanning. However, in normal optical systems, the higher-order distortion is difficult to correct. This is based on the fact that if optical elements are simply moved along the optical axis or the pressure in the space of the projection optical system is merely controlled, only distortion components of up to the third-order vary, and higher-order components of the fifth order or higher hardly vary.

However, if an image-forming method such as off-axis illumination or phase-shifting masks are adopted for the purpose of increasing the depth of focus or resolving finer patterns, the value of higher-order distortion varies according to the number of image-forming methods used. Accordingly, to freely control higher-order values has become an indispensable requirement for improving matching accuracy.

In the tenth embodiment, higher-order distortion the amount of occurrence of which has been difficult to control in conventional projection optical systems is freely controlled by using optical elements made of aspheric surfaces, thereby improving matching accuracy.

Accordingly, as to a magnification component and a third-order distortion component, the tenth embodiment uses a known method such as a method of moving part of the optical elements in a projection optical system along the optical axis thereof, a method of moving a reticle along the optical axis, or a method of controlling the pressure in a projection optical system, and higher-order components are corrected by using the optical means T5.

The construction of the optical means T5 for producing and controlling higher-order distortion will be described below.

The tenth embodiment is characterized in that the optical means T5 including a pair of diffraction optical elements is used to produce higher-order distortion in the projection optical system 2. The optical elements utilize optical elements such as those disclosed in, for example, Japanese Patent Publication No. Sho 43-10034.

Figure 28:
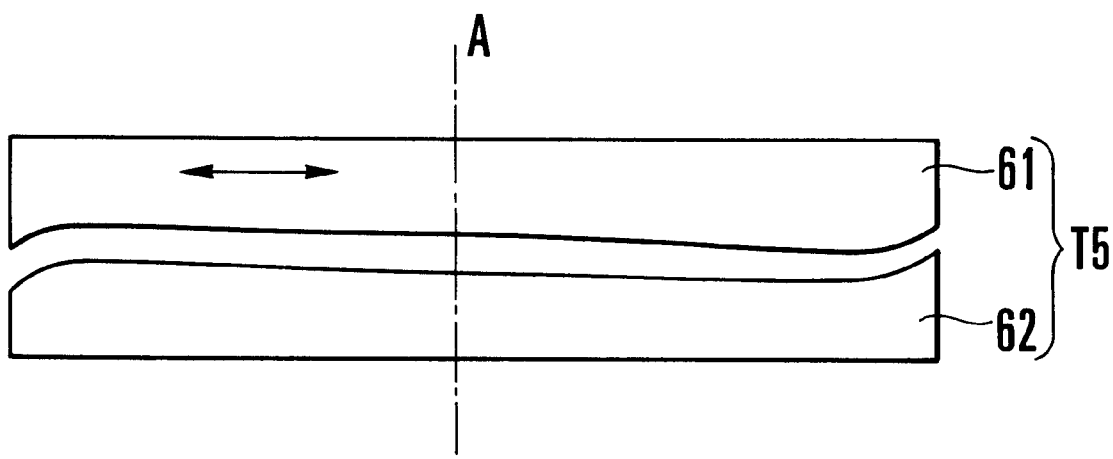
FIG. 28 is an enlarged explanatory view of a portion of the tenth embodiment shown in FIG. 27.

FIG. 28 is a schematic cross-sectional view of the essential portion of the optical means T5 according to the tenth embodiment. In the optical means T5 shown in FIG. 28, the optical elements 61 and 62 are disposed in such a manner that their diffraction grating surfaces face each other, and their outside surfaces are planar surfaces, while their facing surfaces are diffraction grating surfaces of the same shape.

In FIG. 28, the x- and y-axes are taken to cross at right angles to the optical axis A, and the y direction is coincident with the scanning direction of the projection exposure apparatus. Letting fa(x, y) represent the shape of the equivalent aspheric surface of the optical element 61 which is one of the diffraction grating surfaces which face each other, and letting fb(x, y) represent the shape of the equivalent aspheric surface of the optical element 62, both equivalent aspheric shapes are given by the following formulae whose constant terms only differ from each other:

$$fa(x,y) = ax^7 + b_1,$$

$$fb(x,y) = ax^7 + b_2. \quad (1e)$$

The reason why no y terms are present in the formulae (1e) is that the optical means T5 needs to be given optical characteristics in only the x direction perpendicular to the scanning y direction with respect to the projection optical system. Since higher-order distortion is cancelled by averaging due to scanning as to the scanning y direction, the tenth embodiment needs only to control higher-order distortion in only the x direction. The optical elements 61 and 62 are used in the way of shifting either one of the optical elements 61 and 62 in the x direction to vary the relative position therebetween with respect to the x direction. Since higher-order distortion is produced by the lateral shifting of the optical elements 61 and 62, the terms of x of the seventh order or higher are indispensable as the equivalent aspheric shapes.

During an initial state, the unevenness of the equivalent aspheric shape fa(x, y) and that of the equivalent aspheric shape fb(x, y) are cancelled by coinciding with each other, so that the optical elements 61 and 62 have no optical power in total and only act as a plane parallel plate. It is more preferable to make smaller the distance between the optical elements 61 and 62, and its typical value is, for example, approximately 100 μm. It is assumed here that the optical element 61 is moved in the x direction by a distance Δ. The influence at this time is:

$$fa(x+\Delta,y) - fb(x,y) = 7a\Delta x^6 + 21a\Delta^2 x^5 + 35a\Delta^3 x^4 + 35a\Delta^4 x^3 + 21a\Delta^5 x^2 + 7a\Delta^6 x + \Delta^7 + (b_1 - b_2). \quad (2e)$$

If the influence of the higher-order terms of Δ is neglected because of its smallness, the formula (2e) can be simplified as:

$$fa(x+\Delta,y) - fb(x,y) = 7a\Delta x^6 + (b_1 - b_2). \quad (3e)$$

The fact that the formula (3e) has the term of $x^6$ constitutes the basis of the tenth embodiment. Thus, the optical elements 61 and 62 serve as optical elements having the sixth-order characteristic in only the x direction owing to the lateral shift quantity Δ, and the sixth-order characteristic can freely be controlled by the lateral shift quantity Δ.

Since the processing of obtaining a difference from lateral shifting is exactly differentiation, terms of the seventh order are inserted as the equivalent aspheric shapes, whereby a component of the sixth order is produced by the effect of differentiation. Thus, the operations of the optical elements 61 and 62 are realized.

In general, the absolute value of the equivalent aspheric quantity required to correct a small distortion value for matching purposes is very small. As a representative example, if the equivalent aspheric quantity required to produce a desired distortion is 1 μm and the diameter of a lens is 200 mm and the shift quantity Δ at this time is 5 mm, the following formula is obtained from the formula (3e):

$$7a \times 5 \times 10^{12} = 0.001,$$

whereby the following value is obtained:

$$a = 2.86 \times 10^{-17}.$$

Since the diameter is 200 mm, 100 represents the value of the radius of the lens. Therefore, the equivalent aspheric quantity becomes the following value from the formula (1e):

$$2.86 \times (10^{-17}) \times (10^{14}) = 2.86 \times 10^{-3},$$

so that each of the optical elements 61 and 62 has an equivalent aspheric quantity of ±2.86 μm.

The term of cx which is the first-order term of x may be added to reduce the actual amount of deviation of each of the equivalent aspheric quantities from the plane. Since the value of the constant c which gives a value of 2.86 μm at 100 mm is $2.86 \times 10^{-5}$, if the sign of the constant a and the sign of the constant c are made opposite to each other to obtain:

$$c = -2.86 \times 10^{-5},$$

the deviation of each of the equivalent aspheric quantities from the plane can be reduced to ±1.77 μm.

Figure 29:
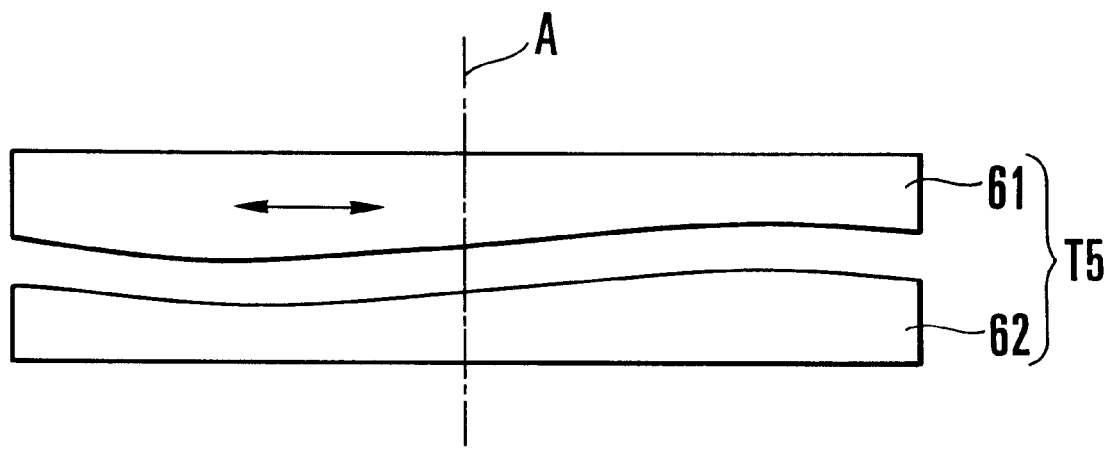
FIG. 29 is an enlarged explanatory view of a portion of the tenth embodiment shown in FIG. 27.

FIG. 28 shows the shapes of the respective equivalent aspheric surfaces for the constant c whose value is zero, and FIG. 29 shows the shapes of the respective equivalent aspheric surfaces for the constant c which is given the above value. Each of the equivalent aspheric surfaces has such a mild shape within the diameter of 200 mm and the equivalent aspheric surfaces of the optical elements 61 and 62 have complementary shapes which are complementary to each other, whereby the amount of occurrence of aberration due to a variation in the relative position of the optical elements 61 and 62 hardly influences the other optical characteristics of the projection optical system and only higher-order distortion can be corrected.

The tenth embodiment is characterized in that the correcting direction of higher-order distortion is made coincident with the direction perpendicular to the scanning direction of the projection exposure apparatus, and another point of the tenth embodiment is that since the amount of correction is small and the absolute value of a shift quantity can appropriately be selected, diffraction grating surfaces to be used are made small up to a quantity easily measurable with an interferometer.

In the tenth embodiment, since the desired optical characteristics are produced from a difference which occurs between the two diffraction grating surfaces when they are shifted relative to each other, the original aspheric quantities, i.e., the equivalent aspheric quantities of the respective optical elements 61 and 62, become values which are larger than a desired final quantity (difference). In the above-described example, an equivalent aspheric surface of 2.86 $\mu$m is required for each of the optical elements 61 and 62 to obtain an equivalent aspheric quantity of 1 $\mu$m. A key point for application of the tenth embodiment is that the inclinations of the equivalent aspheric surfaces are optimized to reduce each of the equivalent aspheric surfaces to 1.77 $\mu$m so that the equivalent aspheric surfaces are accommodated into a highly accurate measurement range of an interferometer.

During the production of a diffraction grating surface, it is important to check whether the diffraction grating surface is accurately worked into a desired shape, and if the equivalent aspheric quantity can be reduced to a quantity on the order of that adopted in the tenth embodiment, existing techniques will suffice. If this value is to be made far smaller, the shift quantity which is set to 5 mm in the tenth embodiment may be made far larger.

An instruction to drive the diffraction optical elements may be changed in accordance with a procedure (data) stored in the projection exposure apparatus in advance, or may be carried out on the basis of an actually measured value of a wafer. For example, if higher-order distortion varies according to a difference in illumination mode or NA, the amount of variation in the higher-order distortion is stored in advance, and when an illumination mode or an NA is changed, the lateral shifting of the above-described diffraction optical elements may be performed. During this time, distortion components of lower order than the higher-order distortion, for example, the third-order distortion and a magnification component, are also corrected by known correction means at the same time.

Instead of setting the projection exposure apparatus in the above-described manner in advance, a reticle whose distortion can be measured may be used to analyze a distortion component in a field to correct a magnification component and distortion of up to a higher order on the basis of the value of the analysis. In this case, measurement may automatically be performed on the projection exposure apparatus, or off-line measurement may be performed after the image of a reticle is printed on a wafer.

Figure 30:
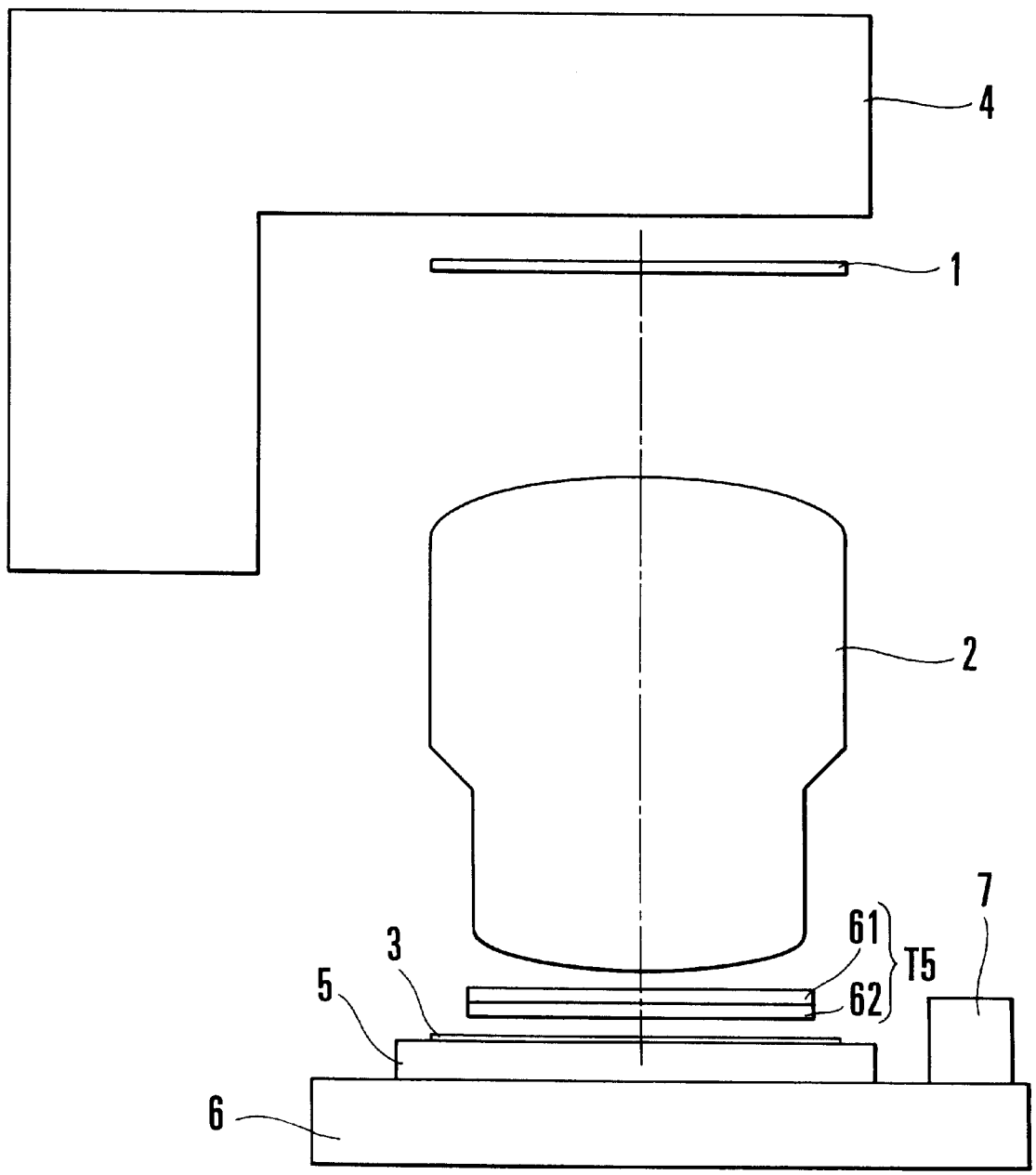
FIG. 30 is a schematic view of the essential portion of an eleventh embodiment of the present invention.

FIG. 30 shows an eleventh embodiment of the semiconductor exposure apparatus according to the present invention. The eleventh embodiment differs from the tenth embodiment shown in FIG. 27 in that the optical means T5 is disposed between the projection optical system 2 and the wafer 3. The other constituent elements of the eleventh embodiment are substantially identical in construction to those of the above-described tenth embodiment.

Although, in the description of each of the tenth and eleventh embodiments, reference has been made to a case in which only one of two diffraction optical elements which are opposed to each other is made to move to obtain a desired characteristic, the relative movement of both diffraction optical elements is not limited to such a case, and both diffraction optical elements may be made to move symmetrically (in opposite directions) with respect to the optical axis, for example, in such a way that the top optical element 61 is made to move to the right by $\Delta$ and the bottom optical element 62 is made to move to the left by $\Delta$.

In each of the above-described tenth and eleventh embodiments, up to the fifth-order distortion is handled as higher-order distortion, but if far higher-order characteristics are to be handled, a term of a far higher order, for example, a term of the ninth order or higher, may be added as an equivalent aspheric shape.

As described above, each of the above-described tenth and eleventh embodiments makes it possible to variably correct higher-order distortion components which have heretofore been impossible to correct, in a projection exposure apparatus. Accordingly, it is possible to variably adjust higher-order distortion components which have heretofore been impossible to correct, such as a variation in distortion due to an illumination mode or an NA, distortion matching between projection exposure apparatus and reticle fabrication errors, whereby overlay accuracy in fabrication of semiconductor devices is improved to a remarkable extent. Since there is a prediction that positioning accuracy rather than resolution will become a limiting factor in fine patterning of 256 Mb DRAMs or later, the effects of the tenth and eleventh embodiments are very large because it is possible to correct a higher-order distortion component which would have remained as an uncorrectable component in conventional arts.

Each of the tenth and eleventh embodiments has another great advantage that since the correction of higher-order distortion components is variable, the projection exposure apparatus can cope with various variations, and because of the small equivalent aspheric quantities, the influence of the optical means on the other performance can be reduced to a negligible value.

In each of the tenth and eleventh embodiments, the direction in which higher-order distortion is produced is made a direction perpendicular to the scanning direction of a scan type of projection exposure apparatus. Since distortion can be corrected in a direction having no effect of averaging on the scanning direction, the balance of the entire system is improved to provide the effect of greatly improving the total positioning accuracy.

In the above description, the correction of higher-order distortion is performed in only the direction perpendicular to the scanning direction, and if the width of a scanning slit is large or the projection exposure apparatus is to be applied to a stepper, the respective equivalent aspheric shapes are made:

$$ga(x, y)=a(x^7+7x^6y)+b_1$$
$$ga(x, y)=a(x^7+7x^6y)+b_2. \qquad (4e)$$

During an initial state, the unevenness of the equivalent aspheric surface ga(x, y) and that of the equivalent aspheric surface gb(x, y) are cancelled by coinciding with each other, so that the optical elements 61 and 62 have no optical power in total and only act as a plane parallel plate. It is more preferable to make smaller the distance between the optical elements 61 and 62, and its typical value is, for example, approximately 100 $\mu$m. It is assumed here that the optical element 61 is moved in the x direction by the distance $\Delta$. If the influence of the higher-order terms of $\Delta$ is neglected because of their smallness, the influence at this time is:

$$ga(x+\Delta,y)-gb(x,y)=7a\Delta(x^6+x^6)+(b_1+b_2) \qquad (5e)$$

The fact that the formula (5e) has the term of $x^6+y^6$ constitutes the basis of this modification of each of the eighth and ninth embodiments. Thus, the optical means T5 including the optical elements 61 and 62 serves as an optical system rotationally symmetrically having the sixth-order characteristic owing to the lateral shift quantity $\Delta$, and the sixth-order characteristic can freely be controlled by varying the lateral shift quantity $\Delta$.

Since the processing of obtaining a difference from lateral shifting is exactly differentiation, terms of the seventh order are inserted as the equivalent aspheric shapes, whereby a component of the sixth order is produced by the effect of differentiation. Thus, the operations of the optical elements 61 and 62 are realized, whereby higher-order distortion can freely be controlled. Incidentally, as in the case of the above-described tenth and eleventh embodiments, the insertion position of the optical elements 61 and 62 may be another position such as a position between the projection optical system 2 and the reticle 1 or a position between the projection optical system 2 and the wafer 3. As occasion demands, the optical elements 61 and 62 may also be incorporated in the projection optical system 2.

Instead of moving either one of the optical elements 61 and 62, the optical elements 61 and 62 may be arranged to move symmetrically (in opposite directions) with respect to the optical axis.

As described above, the present invention is characterized in that two surfaces expressed by the same shape formula are opposed to each other and both surfaces are shifted from each other by a desired amount to obtain desired optical characteristics. In a reference state corresponding to no lateral shifting, the two surfaces are complementary to each other to produce no optical characteristics, whereas in a lateral shifted state, the two surfaces produce optical characteristics by the effect of differentiation with respect to the direction of lateral shifting.

Specifically, in an orthogonal coordinate system (x, y) which is set on a plane perpendicular to the optical axis of a projection optical system, if the direction of lateral shifting is the x direction, a surface shape p(x, y) of the present invention is characterized by having the following term:

$$p(x, y) = ax^n.$$

If n=3, it is possible to vary various characteristics expressed by the term of the second order, such as magnification or focus position. Because the formula relates to one direction, it is possible to vary magnification or focus position in the direction of lateral shifting. Specifically, the difference in magnification between the x direction and the y direction or the difference in focus between an x-direction pattern and a y-direction pattern, i.e., longitudinal astigmatism, can be controlled. Which aberration is controlled depends on the insertion position of the optical elements of the present invention, as described in connection with the above-described embodiments.

As described previously, in the case of a scanner, it is preferable that the x direction be made a direction parallel or perpendicular to the direction of its scanning slit. This direction is also a direction parallel or perpendicular to any of the sides of the rectangular area of a patterned effective area of a mask. The shifting method may be a method of moving two opposed optical elements with respect to each other by an amount symmetrical about the optical axis, or a method of moving either one of two opposed optical elements while making the other stationary.

The correction of astigmatism for n=3 is a noted feature of the optical elements of the present invention because there is a possibility that, in a scanner, astigmatism occurs while temporarily varying due to absorption of exposure light even on the optical axis. The amount of correction can freely be controlled in either of positive and negative directions by selecting a shift quantity. In addition, since the shift quantity is a large value such as 5 mm as shown in numerical examples, no strict tolerance settings are needed so that no mechanically specially highly precise structures are needed.

As another application, if the value of n is set to 2, the inclination of an image plane can be corrected.

If the optical elements of the present invention are inserted in the vicinity of a reticle, distortion can easily be corrected. If n=4, the second-order distortion due to eccentricity can be corrected; if n=5, the third-order distortion can be corrected; if n=6, higher-order distortion of the fourth order due to eccentricity or the like can be corrected; and if n=7, higher-order distortion of the fifth order can be corrected.

To independently control these aberrations, the optical elements of the present invention are needed by the number of aberrations to be independently controlled. In addition, since $x^{n-1}$ which is a function formed when n is an odd number is not an even function, the shift quantity must be determined to take care of the fact that the shift quantity differs between the positive and negative directions of x.

If, for example, magnification or the third-order distortion can be corrected by known means, the present invention may be applied to the control of components which cannot be reached by the known means.

In the description of the present invention, reference has been made to another example to which the following equivalent aspheric surface q(x, y) is suited:

$$q(x,y) = a(x^n + nxy^{n-1}).$$

If the shape is q(x, y), the optical elements are shifted relative to each other in the x direction so that characteristics based on $x^{n-1} + y^{n-1}$ can be satisfied. As compared with p(x, y), the characteristics which also include y are effective in a case where only simple correction in one direction of x is insufficient, as in a stepper or scanner whose slit width is large.

As described previously, in the case of a scanner, it is preferable that the x direction be made a direction parallel or perpendicular to the direction of its scanning slit. This direction is also a direction parallel or perpendicular to any of the sides of the rectangular area of a patterned effective area of a mask. As in the case of all of the above-described embodiments, the shifting method may be a method of moving two opposed optical elements with respect to each other by an amount symmetrical about the optical axis, or a method of moving either one of two opposed optical elements while making the other stationary.

The fact that curvature of field can be corrected when n=3 is a great feature of the present invention. If n=5, correction of higher-order curvature of field is possible.

As another application, if the value of n is set to 2, the inclination of an image plane can be corrected.

If the optical elements of the present invention are inserted in the vicinity of a reticle, distortion can easily be corrected. If n=4, the second-order distortion due to eccentricity can be corrected; if n=5, the third-order distortion can be corrected; if n=6, higher-order distortion of the fourth order due to eccentricity or the like can be corrected; and if n=7, higher-order distortion of the fifth order can be corrected.

To independently control these aberrations, the optical elements of the present invention are needed by the number of aberrations to be independently controlled. In addition, since $x^{n-1} + y^{n-1}$ which is a function formed when n is an odd number is not an even function, the shift quantity must be determined to take care of the fact that the shift quantity differs between the positive and negative directions of x.

An embodiment of a method of manufacturing a semiconductor device by using the above-described type of projection exposure apparatus will be described below.

Figure 31:
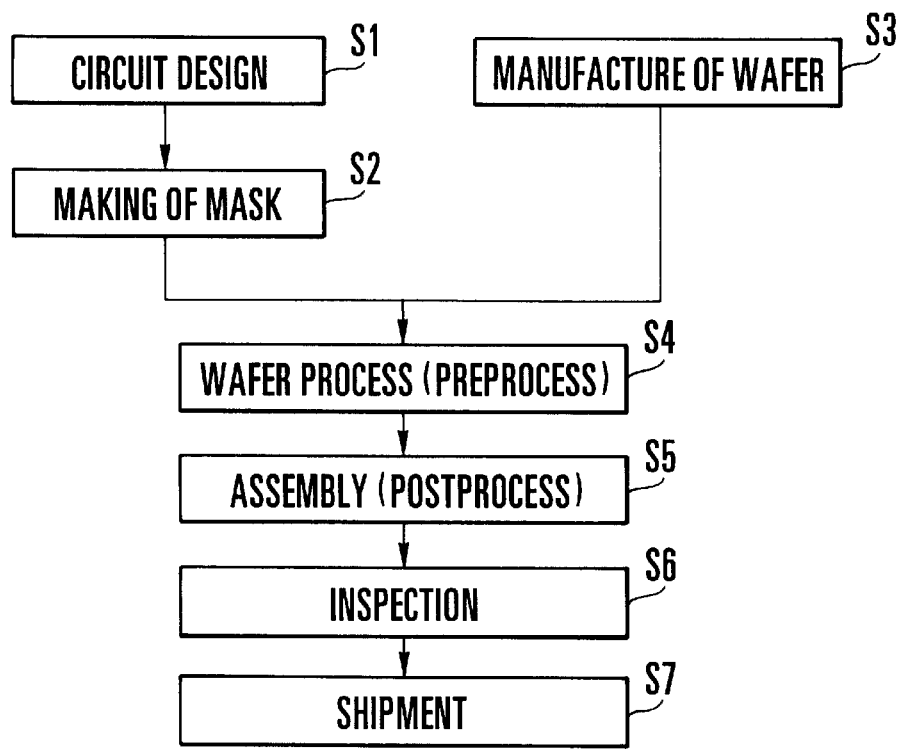
FIG. 31 is a flowchart of a semiconductor device manufacturing method according to the present invention.

FIG. 31 is a flowchart of the manufacture of a semiconductor device (such as a semiconductor chip such as an IC or an LSI, or a CCD such as a liquid crystal panel).

In this embodiment, in Step S1 (CIRCUIT DESIGN), the circuit of the semiconductor device is designed. In Step S2 (MAKING OF MASK), a mask on which the designed circuit pattern is formed is fabricated.

In Step S3 (MANUFACTURE OF WAFER), a wafer is manufactured by using a material such as silicon. In Step S4 (WAFER PROCESS) which is called a preprocess, the prepared mask and wafer are used to form an actual circuit on the wafer by lithography techniques.

In the next step, Step S5 (ASSEMBLY) which is called a postprocess, the wafer fabricated in Step S4 is used to form semiconductor chips. Step S5 includes processes such as an assembly process (dicing and bonding) and a packaging process (chip encapsulation).

In Step S6 (INSPECTION), the semiconductor devices fabricated in Step S5 are subjected to inspections such as an operation verification test and a durability test. Through these processes, the semiconductor devices are finished and shipped (Step S7).

Figure 32:
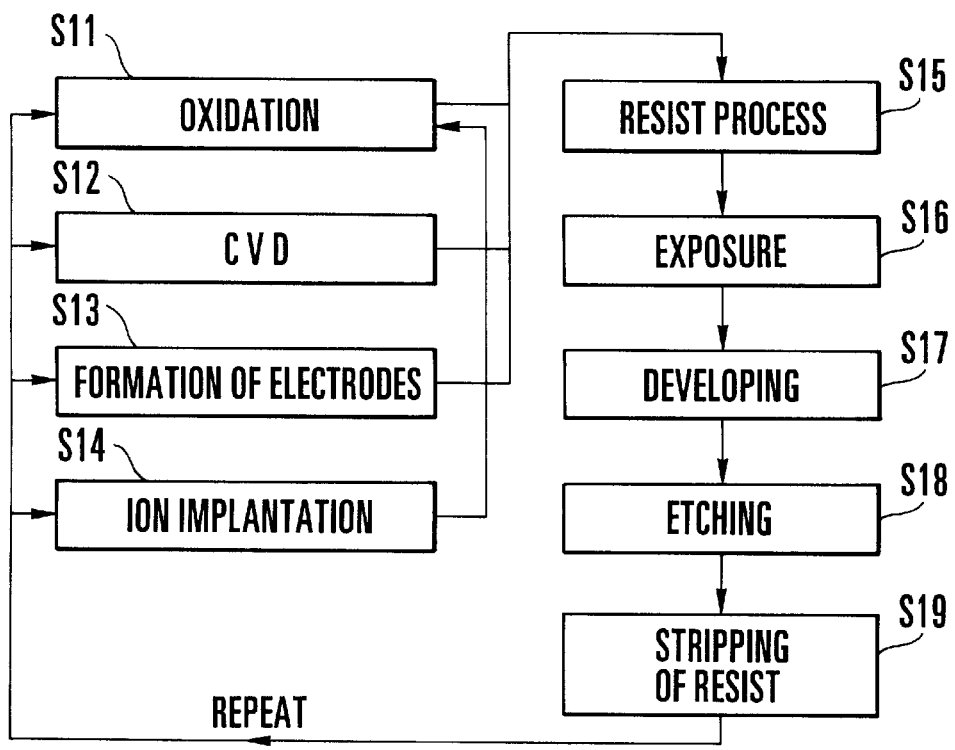
FIG. 32 is a flowchart of the semiconductor device manufacturing method according to the present invention.

FIG. 32 is a detailed flowchart of the wafer process of Step S4. In Step S11 (oxidation), the surface of the wafer is oxidized. In Step S12 (CVD), an insulation film is formed over the surface of the wafer.

In Step S13 (FORMATION OF ELECTRODES), electrodes are formed on the wafer by evaporation. In Step S14 (ION IMPLANTATION), ions are implanted into the wafer. In Step S15 (RESIST PROCESS), the wafer is coated with a sensitive material. In Step S16 (EXPOSURE), the circuit pattern of the mask is exposure-printed on the wafer by the above-described type of projection exposure apparatus.

In Step S17 (DEVELOPING), the exposed wafer is developed. In Step S18 (ETCHING), the portion of the resist other than the developed resist is etched away. In Step S19 (STRIPPING OF RESIST), an unnecessary resist which remains after etching is removed. By repeating the above-described processes, circuit patterns are formed on the wafer in a stacked manner.

If the manufacturing method of the above-described embodiment is used, it is possible to easily manufacture a semiconductor device of high integration level.

As is apparent from the foregoing description, in accordance with the present invention, it is possible to achieve a projection exposure apparatus which can use optical means having at least two optical elements having diffraction grating surfaces of appropriately set shapes and correct, while minimizing influences on other optical characteristics, a variation in optical performance due to the absorption of exposure light into a projection optical system, for example, at least one of longitudinal astigmatism, curvature of field and an asymmetrical magnification or distortion of a wafer itself due to a process factor of the wafer or the like, thereby making it possible to easily provide a high-resolution pattern. It is also possible to achieve a device manufacturing method using such a projection exposure apparatus.

In addition, it is possible to achieve a projection exposure apparatus which not only can correct the state of extension after processes of a wafer on which to print a fine pattern, but also enables correction of distortion matching between exposure apparatus, the image drawing error of a reticle and the like by independently controlling magnifications in the respective x and y directions perpendicular to each other by using optical means which has at least two optical elements having aspheric surfaces of appropriately set shapes, and can also minimize influences on other optical characteristics due to such control. It is also possible to achieve a device manufacturing method using such a projection exposure apparatus.

What is claimed is:

1. A projection exposure apparatus comprising:
a projection optical system for projecting a pattern of a mask onto a substrate, said projection optical system including a pair of diffractive members at least one of which can be displaced in a direction perpendicular to an optical axis of said projection optical system,
wherein each of said pair of diffractive members has a diffraction grating surface whose shape is determined so that an optical characteristic of said pair of diffractive members varies when a positional relationship between the diffraction grating surfaces of said pair of diffractive members in the perpendicular direction varies, and
wherein an optical characteristic of said projection optical system is adjusted by displacing said at least one of said pair of diffractive members in the direction perpendicular to the optical axis.

2. A projection exposure apparatus according to claim 1, wherein the optical characteristic of said projection optical system includes longitudinal astigmatism.

3. A projection exposure apparatus according to claim 2, wherein the direction in which said at least one of said pair of diffractive members is displaced is an x direction, and a shape of an equivalent aspheric surface of the diffraction grating surface of each of said pair of diffractive members is expressed by a formula which includes a term of the third order of x.

4. A projection exposure apparatus according to claim 2, wherein a surface shape represented by a difference between the equivalent aspheric surfaces of the respective diffraction grating surfaces varies when said pair of diffractive members moves in directions which are opposite to each other and which traverse an optical path of said projection optical system.

5. A projection exposure apparatus according to claim 3, wherein said projection exposure apparatus performs projection exposure while scanning the mask and the substrate, the x direction being perpendicular to a direction in which said projection exposure apparatus scans the mask and the substrate.

6. A projection exposure apparatus according to claim 1, wherein the optical characteristic of said projection optical system includes curvature of field.

7. A projection exposure apparatus according to claim 6, wherein the direction in which said at least one of said pair of diffractive members is displaced is an x direction, and a shape of the diffraction grating surface of each of said pair of diffractive members is expressed by a formula which includes a term of the third order of x, the optical characteristic of said projection optical system including the curvature of field relative to the x direction.

8. A projection exposure apparatus according to claim 6, wherein a surface shape represented by a difference between equivalent aspheric surfaces of the respective diffraction grating surfaces varies when said pair of diffractive members move in directions which are opposite to each other and which traverse an optical path of said projection optical system.

9. A projection exposure apparatus according to claim 7, wherein said projection exposure apparatus performs projection exposure while scanning the mask and the substrate, the x direction being perpendicular to a direction in which said projection exposure apparatus scans the mask and the substrate.

10. A projection exposure apparatus according to claim 1, wherein the optical characteristic of said projection optical system includes projection magnification.

11. A projection exposure apparatus according to claim 10, wherein the direction in which said at least one of said pair of diffractive members is displaced is an x direction, a shape of the diffraction grating surface of each of said pair of diffractive members is expressed by a formula which includes a term of the third order of x, the optical characteristic of said projection optical system including the projection magnification relative to the x direction.

12. A projection exposure apparatus according to claim 10, wherein a surface shape represented by a difference between equivalent aspheric surfaces of the respective diffraction grating surfaces varies when said pair of diffractive members move in directions which are opposite to each other and which traverse an optical path of said projection optical system.

13. A projection exposure apparatus according to claim 11, wherein said projection exposure apparatus performs projection exposure while scanning the mask and the substrate, the x direction being perpendicular to a direction in which said projection exposure apparatus scans the mask and the substrate.

14. A projection exposure apparatus according to claim 1, wherein the optical characteristic of said projection optical system includes distortion.

15. A projection exposure apparatus according to claim 14, wherein the direction in which said at least one of said pair of diffractive members is displaced is an x direction, and a shape of the diffraction grating surface of each of said pair of diffractive members is expressed by a formula which includes a term of the fifth order of x.

16. A projection exposure apparatus according to claim 14, wherein the direction in which said at least one of said pair of diffractive members is displaced is an x direction, and a shape of the diffraction grating surface of each of said pair of diffractive members is expressed by a formula which includes a term of the seventh order of x.

17. A projection exposure apparatus according to claim 14, wherein a surface shape represented by a difference between equivalent aspheric surfaces of the respective diffraction grating surfaces varies when said pair of diffractive members move in directions which are opposite to each other and which traverse an optical path of said projection optical system.

18. A projection exposure apparatus according to claim 15, wherein said projection exposure apparatus performs projection exposure while scanning the mask and the substrate, the x direction being perpendicular to a direction in which said projection exposure apparatus scans the mask and the substrate.

19. A projection exposure apparatus according to claim 16, wherein said projection exposure apparatus performs projection exposure while scanning the mask and the substrate, the x direction being perpendicular to a direction in which said projection exposure apparatus scans the mask and the substrate.

20. A projection exposure apparatus according to claim 7, further comprising a second pair of transparent diffractive members whose diffraction grating surfaces face each other, in the optical path of said projection optical system,
   one of said second pair of diffractive members being movable in a y direction which traverses the optical path and which is perpendicular to the x direction,
   curvature of field relative to the y direction of said projection exposure apparatus varying when a surface shape represented by a difference between equivalent aspheric surfaces of the respective diffractive surfaces varies due to a movement of said one of said second pair of diffractive members,
   wherein a shape of the diffractive surface of each of said second pair of diffractive members is expressed by a formula which includes a term of the third order of y.

21. A projection exposure apparatus according to claim 20, wherein said two pairs of diffractive members are used to adjust curvature of field and longitudinal astigmatism of said projection exposure apparatus.

22. A projection exposure apparatus according to claim 20, wherein a surface shape represented by a difference between equivalent aspheric surfaces of the respective diffraction grating surfaces varies when said second pair of diffractive members move in directions which are opposite to each other and which traverse the optical path of said projection optical system.

23. A projection exposure apparatus according to claim 20, wherein a surface shape represented by a difference between equivalent aspheric surfaces of the respective diffraction grating surfaces varies when said diffractive members which constitute each of said two pairs move in directions which are opposite to each other and which traverse the optical path of said projection optical system.

24. A projection exposure apparatus according to claim 20, wherein one of said diffractive members which constitute each of said two pairs is one member shared by said two pairs and having diffractive surfaces on opposite surfaces thereof.

25. A projection exposure apparatus comprising:
   a projection optical system for projecting a pattern of a mask onto a substrate, said projection optical system including a pair of diffractive members, at least one of which is displaced in a direction perpendicular to an optical axis of said projection optical system,
   wherein each of said pair of diffractive members has a diffraction grating surface whose shape is determined so that a refractive power of said pair of diffractive members varies when a positional relationship between the diffraction grating surfaces of said pair of diffraction members in the perpendicular direction varies, and
   wherein a refractive power of said projection optical system is adjusted by displacing said at least one of said pair of diffractive members in the direction perpendicular to the optical axis.

26. A projection exposure apparatus comprising:
   a projection optical system for projecting a pattern of a mask onto a substrate, said projection optical system including a pair of diffractive members, at least one of which is displaced in a direction perpendicular to an optical axis of said projection optical system,
   wherein each of said pair of diffractive members has a diffraction grating surface whose shape is determined so that an aberration of said pair of diffractive members varies in amount when a positional relationship between the diffraction grating surfaces of said pair of diffractive members in the perpendicular direction varies, and
   wherein an aberration of said projection optical system is adjusted by displacing said at least one of said pair of diffractive members in the direction perpendicular to the optical axis.

27. A device manufacturing method comprising the steps of:
   supplying a mask on which a device pattern is formed as well as a wafer to a projection exposure apparatus according to one of claims 1 to 23, 25 and 26; and
   projecting and transferring an image of the device pattern of the mask to the wafer by using a projection optical system, after adjusting an optical characteristic of the projection optical system.

* * * * *

UNITED STATES PATENT AND TRADEMARK OFFICE
CERTIFICATE OF CORRECTION

PATENT NO. : 6,307,618 B1
DATED : October 23, 2001
INVENTOR(S) : Akiyoshi Suzuki et al.

It is certified that error appears in the above-identified patent and that said Letters Patent is hereby corrected as shown below:

Column 1,
Line 37, "has been" should read -- is --.

Column 2,
Line 49, "Recently" should read -- Recently, --.
Line 61, "this," should read -- this --.

Column 4,
Line 3, "has" should read -- is --.
Line 4, "been" should be deleted.
Line 15, "signifies" should read -- signifying --.

Column 9,
Line 35, "of" should be deleted.

Column 16,
Line 35, "are" should read -- is --.

Column 19,
lIne 10, "an" should be deleted.

Column 25,
Line 5, "$fa(x+\delta_1 y) - fb(x=\delta_1 y) = 2a(3\delta x^2 + \delta^3) + 4b\delta x + 2c\delta + 2c\delta + d_1 - d_2$." should read -- $fa(x+\delta_1 y) - fb(x-\delta_1 y) = 2a(3\delta x^2 + \delta^3) + 4b\delta x + 2c\delta x + 2c\delta + d_1 - d_2$ --.

Column 28,
Line 1, "having" should read -- has --.

Column 31,
Line 12, "$6.7 \times 10^{-9} \times 100 \times \phi \times 100 = 6.7 \times 10^{-3}$." should read -- $6.7 \times 10^{-9} \times 100 \times 100 \times 100 = 6.7 \times 10^{-3}$. --.

Column 37,
Line 5, "$4.00 \times 10^{-13} \times 10^{-10} = 4.00 \times 10^{-3}$" should read -- $4.00 \times 10^{-13} \times 10^{-10} = 4.00 \times 10^{-3}$ --.

Column 38,
Line 63, "processing" should read -- process --.
Line 64, "exactly" should read -- exact --.

UNITED STATES PATENT AND TRADEMARK OFFICE
CERTIFICATE OF CORRECTION

PATENT NO. : 6,307,618 B1
DATED : October 23, 2001
INVENTOR(S) : Akiyoshi Suzuki et al.

It is certified that error appears in the above-identified patent and that said Letters Patent is hereby corrected as shown below:

Column 44,
Line 65, "processing" should read -- process --.
Line 66, "exactly" should read -- exact --.

Column 46,
Line 15, "or" should read -- of --.

Signed and Sealed this

Second Day of April, 2002

Attest:

JAMES E. ROGAN
Attesting Officer
Director of the United States Patent and Trademark Office